US012712569B2

(12) United States Patent
Li et al.

(10) Patent No.: US 12,712,569 B2
(45) Date of Patent: Aug. 18, 2026

(54) LOW-DENSITY PARITY-CHECK ENCODING METHOD, LOW-DENSITY PARITY-CHECK DECODING METHOD, ENCODING DEVICE, DECODING DEVICE AND MEDIUM

(71) Applicant: ZTE CORPORATION, Shenzhen (CN)

(72) Inventors: Liguang Li, Shenzhen (CN); Jin Xu, Shenzhen (CN); Guanghui Yu, Shenzhen (CN); Chulong Liang, Shenzhen (CN); Jun Xu, Shenzhen (CN); Qiang Fu, Shenzhen (CN); Jian Kang, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 0 days.

(21) Appl. No.: 18/258,793

(22) PCT Filed: Dec. 20, 2021

(86) PCT No.: PCT/CN2021/139513
§ 371 (c)(1),
(2) Date: Jun. 21, 2023

(87) PCT Pub. No.: WO2022/135318
PCT Pub. Date: Jun. 30, 2022

(65) Prior Publication Data

US 2024/0048160 A1 Feb. 8, 2024

(30) Foreign Application Priority Data

Dec. 23, 2020 (CN) ......................... 202011545892.5

(51) Int. Cl.
*H03M 13/11* (2006.01)

(52) U.S. Cl.
CPC ........ *H03M 13/118* (2013.01); *H03M 13/116* (2013.01)

(58) Field of Classification Search
CPC .......................... H03M 13/118; H03M 13/116
See application file for complete search history.

(56) References Cited

U.S. PATENT DOCUMENTS

2008/0178065 A1* 7/2008 Khandekar ....... H03M 13/6516 714/E11.002
2010/0153813 A1 6/2010 Myung et al.
(Continued)

FOREIGN PATENT DOCUMENTS

CN 101601187 A 12/2009
CN 104202057 A 12/2014
(Continued)

OTHER PUBLICATIONS

"Design of LDPC Codes for NR," 3GPP TSG RAN WG1 Meeting #87, Reno, USA, Nov. 14-18, 2016, 11 pages.
(Continued)

*Primary Examiner* — Mark D Featherstone
*Assistant Examiner* — Jeffrey Andrew Yang
(74) *Attorney, Agent, or Firm* — MH2 Technology Law Group LLP

(57) ABSTRACT

A low density parity check encoding method, including: determining a target parity check matrix, where the target parity check matrix belongs to a second parity check matrix set, and a base graph of the second parity check matrix set is extracted from a base graph of a first parity check matrix set and performing low density parity check encoding on data to be transmitted according to the target parity check matrix and a target lifting size.

20 Claims, 5 Drawing Sheets

Determine a target parity check matrix, wherein the target parity check matrix belongs to a second parity check matrix set, and a base graph of the second parity check matrix set is extracted from a base graph of a first parity check matrix set — 110

Perform low density parity check encoding on data to be transmitted according to the target parity check matrix and a target lifting size — 120

(56) References Cited

U.S. PATENT DOCUMENTS

| | | | | |
|---|---|---|---|---|
| 2017/0033804 | A1 | 2/2017 | Li et al. | |
| 2017/0230058 | A1* | 8/2017 | Xu | H03M 13/114 |
| 2018/0175886 | A1* | 6/2018 | Myung | H03M 13/1148 |
| 2019/0349006 | A1* | 11/2019 | Ma | H03M 13/116 |
| 2020/0145026 | A1* | 5/2020 | Li | H04L 1/00 |
| 2020/0244287 | A1* | 7/2020 | Xu | H03M 13/6516 |
| 2022/0271776 | A1* | 8/2022 | Jeon | H03M 13/114 |

FOREIGN PATENT DOCUMENTS

| | | | | |
|---|---|---|---|---|
| CN | 109120374 A | 1/2019 | | |
| CN | 112511173 A | 3/2021 | | |
| SG | 11202009379 A | 10/2020 | | |
| WO | WO-2010047662 A1 * | 4/2010 | | H03M 13/033 |
| WO | WO-2018126788 A1 * | 7/2018 | | H03M 13/11 |

OTHER PUBLICATIONS

"LDPC rate compatible design overview," 3GPP TSG-RAN WG1 #86bis, Lisbon, Portugal, Oct. 10-14, 2016, 27 pages.

International Search Report and Written Opinion mailed Mar. 15, 2022 in corresponding International Application No. PCT/CN2021/139513, translated, 19 pages.

European Extended Search Report dated Oct. 29, 2024 in corresponding European Application No. 21909314.3, 14 pages.

CATT, "LDPC Design for NR data channel," 3GPP Draft, 3GPP TSG RAN WG1 Meeting #89, Hangzhou, China, May 15-19, 2017, 5 pages [retrieved on May 6, 2017]. Retrieved from the Internet:< URL: http://www.3gpp.org/ftp/tsg_ran/WG1_RL1/TSGR1_89/Docs/.

Huawei et al. "LDPC design for eMBB data," 3GPP Draft, 3GPP TSG RAN WG1 Meeting #89, Hangzhou, China, May 15-19, 2017, 11 pages [retrieved on May 14, 2017]. Retrieved from the Internet:< URL: http://www.3gpp.org/ftp/Meetings_3GPP_SYNC/RAN1/Docs/.

Qualcomm Incorporated "LDPC rate compatible design," 3GPP Draft, 3GPP TSG-RAN WG1 #86, Aug. 22-26, 2016, Gothenburg, Sweden, 26 pages [retrieved on Aug. 13, 2016]. Retrieved from the Internet:< URL: http://www.3gpp.org/ftp/tsg_ran/WG1_RL1/TSGR1_86/Docs/.

"3rd Generation Partnership Project; Technical Specification Group Radio Access Network; NR: Multiplexing and channel coding (Release 15)," 3GPP Draft, 3rd Generation Partnership Project (3GPP), Mobile Competence Centre, Valbonne, France, Feb. 6, 2018, 89 pages [retrieved on Feb. 6, 2018]. Retrieved from the Internet:< URL: http://www.3gpp.org/ftp/tsg%5Fran/WG1%5FRL1/TSGR1%5FAH/NR%5FAH%5F1801/Docs/.

"Change Request," Draft, version 15.0.0, 3GPP TSG RAN WG1 Meeting AH 1801, Vancouver, Canada, Jan. 22-26, 2018, 1 page.

* cited by examiner

LOW-DENSITY PARITY-CHECK ENCODING METHOD, LOW-DENSITY PARITY-CHECK DECODING METHOD, ENCODING DEVICE, DECODING DEVICE AND MEDIUM

CROSS-REFERENCE TO RELATED APPLICATION(S)

This application is a national phase entry under 35 U.S.C 371 of International Patent Application No. PCT/CN2021/139513 filed on Dec. 20, 2021, the International Patent Application is filed based on Chinese Patent Application with the application No. 202011545892.5, filed on Dec. 23, 2020, and claims priority to the Chinese Patent Application, the entire contents of the International Patent Application and the Chinese Patent Application are incorporated herein by reference.

TECHNICAL FIELD

The present disclosure relates to the field of wireless communication networks, and for example, relates to a low density parity check encoding method, a low density parity check decoding method, an encoding device, a decoding device and a medium.

BACKGROUND

With the rapid development of technologies such as big data, cloud computing, and latency-sensitive networks, a number of user equipment in a wireless communication network is growing explosively and the wireless communication network will carry a variety of applications and massive data, thereby putting high requirements on data transmission rate, throughput, data error correction and the like. In a wireless communication system, a transmitting end performs channel encoding on data to be transmitted to obtain an encoded bit sequence, and thereafter, maps the encoded bit sequence into constellation modulation symbols and sends the constellation modulation symbols to a receiving end. In a data transmission channel, the transmitted data is distorted due to factors such as multipath, movement, noise, and interference. The receiving end needs to perform channel decoding on the received constellation modulation symbols to recover the transmitted data. In the process of channel encoding, some redundant information is added to the transmitted data sequence, and accordingly, the transmitted data can be checked and recovered by the receiving end.

Low density parity check (LDPC) code is a linear block code defined by a sparse check matrix or a bipartite graph. Since the check matrix is very sparse, the complexity of decoding can be reduced and the reliability is relatively high. However, a maximum lifting size of the LDPC code is fixed (only 384), and the dimension of the base graph is large, thus a flexible code length and code rate cannot be supported, and further, decoding parallelism of the LDPC code and throughput of data transmission are limited.

SUMMARY

The present disclosure provides a low density parity check encoding method, a low density parity check decoding method, an encoding device, a decoding device and a medium, so as to improve the flexibility of encoding and throughput of data transmission.

Embodiments of the present disclosure provide a low density parity check encoding method, including:

determining a target parity check matrix, where the target parity check matrix belongs to a second parity check matrix set, and a base graph of the second parity check matrix set is extracted from a base graph of a first parity check matrix set; and performing low density parity check encoding on to-be-transmitted data according to the target parity check matrix and a target lifting size.

The embodiments of the present disclosure further provide a low density parity check encoding method, including:

determining a target base graph, where the target base graph is a base graph of a second parity check matrix set, and the base graph of the second parity check matrix set is extracted from a base graph of a first parity check matrix set; and performing low density parity check encoding on to-be-transmitted data according to the target base graph and a target lifting size.

The embodiments of the present disclosure further provide a low density parity check decoding method, including:

determining a target parity check matrix, where the target parity check matrix belongs to a second parity check matrix set, and a base graph of the second parity check matrix set is extracted from a base graph of a first parity check matrix set; and performing low density parity check decoding on received data according to the target parity check matrix and a target lifting size.

The embodiments of the present disclosure further provide a low density parity check decoding method, including:

determining a target base graph, where the target base graph is a base graph of a second parity check matrix set, and the base graph of the second parity check matrix set is extracted from a base graph of a first parity check matrix set; and performing low density parity check decoding on received data according to the target base graph and a target lifting size.

The embodiments of the present disclosure further provide an encoding device, including a memory, a processor, and a computer program stored in the memory and runnable on the processor, where the processor implements the low density parity check encoding method mentioned above when executing the program.

The embodiments of the present disclosure further provide a decoding device, including a memory, a processor, and a computer program stored in the memory and runnable on the processor. The processor implements the low density parity check decoding method mentioned above when executing the program.

The embodiments of the present disclosure further provide a computer readable storage medium, where the computer readable storage medium has stored a computer program thereon. The program, when executed by a processor, implements the low density parity check encoding method or the low density parity check decoding method mentioned above.

BRIEF DESCRIPTION OF THE DRAWINGS

FIG. 1 is a flowchart of a low density parity check encoding method provided by an embodiment;

FIG. 8 is a schematic structural diagram of a low density parity check decoding apparatus provided by an embodiment;

FIG. 9 is a schematic structural diagram of a low density parity check decoding apparatus provided by another embodiment;

DETAILED DESCRIPTION

Figure 2:
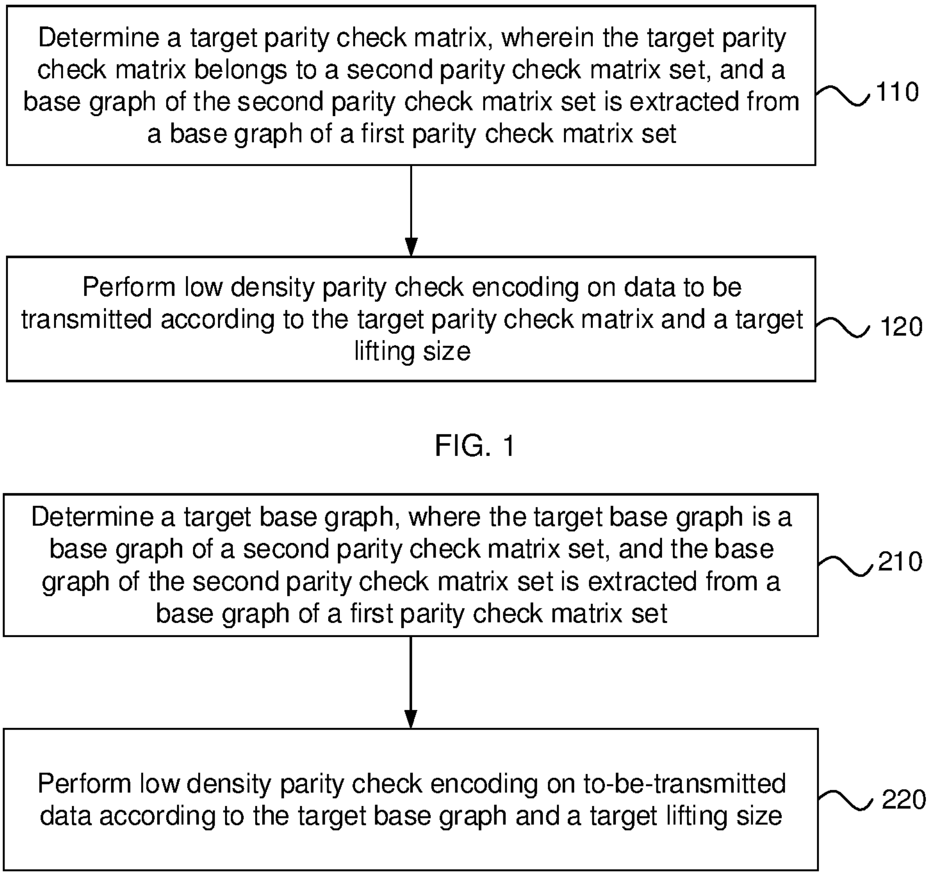
FIG. 2 is a flowchart of a low density parity check encoding method provided by another embodiment.

The present disclosure will be described below in conjunction with the accompanying drawings and embodiments. The specific embodiments described herein are intended solely to explain the present disclosure. For ease of description, only the parts relevant to the present disclosure are shown in the accompanying drawings.

Check matrix H of an LDPC code is a matrix of (mb×z) rows and (nb×z) columns. The check matrix H consists of mb by nb sub-matrixes P, and each sub-matrix is a z-by-z standard permutation matrix raised to a different power (corresponding to a cyclic shift matrix of an identity matrix) or a z-by-z all-zero square matrix. The form of the check matrix H is as follows:

$$H=\begin{bmatrix} P^{h^b_{00}} & P^{h^b_{01}} & P^{h^b_{02}} & \dots & P^{h^b_{0nb}} \\ P^{h^b_{10}} & P^{h^b_{01}} & P^{h^b_{02}} & \dots & P^{h^b_{1nb}} \\ \dots & \dots & \dots & \dots & \dots \\ P^{h^b_{mb0}} & P^{h^b_{mb1}} & P^{h^b_{mb2}} & \dots & P^{h^b_{mbnb}} \end{bmatrix} = P^{Hb},$$

where if $$h^b_{ij} = -1,$$

then the corresponding sub-matrix $$P^{h^b_{ij}} = 0$$

is a z-by-z all-zero square matrix; if $$h^b_{ij}$$

is an integer greater or equal to 0, then the corresponding submatrix $$P^{h^b_{ij}} = 0$$

is the standard permutation matrix $P_0$ raised to the power of $$h^b_{ij}.$$

The z-by-z standard permutation matrix $P_0$ is shown as follows:

$$P=\begin{bmatrix} 0 & 1 & 0 & \dots & 0 \\ 0 & 0 & 1 & \dots & 0 \\ \dots & \dots & \dots & \dots & \dots \\ 0 & 0 & 0 & \dots & 1 \\ 1 & 0 & 0 & \dots & 0 \end{bmatrix}$$

Therefore, each sub-matrix may be uniquely identified by $$h^b_{ij}.$$

If a sub-matrix is an all-zero square matrix, the corresponding $$h^b_{ij}$$

is represented by −1 (or can be represented by a null value). If a sub-matrix is obtained by cyclically shifting an identity matrix by s bit(s), then $$h^b_{ij}$$

is equal to s, and all the $$h^b_{ij}$$

constitute a parity check matrix Hb.

z is the dimension of the standard permutation matrix (and the sub-matrix), and is called a lifting size.

LDPC code can be uniquely determined by the parity check matrix Hb and the lifting size z. Correspondingly, a base graph (or base matrix) BG can be obtained by replacing all non −1 elements in the parity check matrix with "1" and all −1 elements in the parity check matrix with "0".

The base graph only contains two types of elements: "0" and "1", where "0" indicates an all-zero square matrix, and "1" indicates a cyclical (or circular) shift of an identity matrix (i.e., circular permutation matrix). An actual number of bits of the cyclical shift needs to be determined by the parity check matrix.

For example, if a parity check matrix (2 rows and 4 columns) is $$Hb=\begin{bmatrix} 0 & 3 & 0 & -1 \\ 2 & 3 & 2 & 3 \end{bmatrix},$$

and a lifting size z=4, then the check matrix is:

$$H=\begin{bmatrix}1&0&0&0&0&0&0&1&1&0&0&0&0&0&0&0\\0&1&0&0&1&0&0&0&0&1&0&0&0&0&0&0\\0&0&1&0&0&1&0&0&0&0&1&0&0&0&0&0\\0&0&0&1&0&0&1&0&0&0&0&1&0&0&0&0\\0&0&1&0&0&0&0&1&0&0&1&0&0&0&0&1\\0&0&0&1&1&0&0&0&0&0&0&1&1&0&0&0\\1&0&0&0&0&1&0&0&1&0&0&0&0&1&0&0\\0&1&0&0&0&0&1&0&0&1&0&0&0&0&1&0\end{bmatrix}.$$

A corresponding base graph is:

$$H_{BG}=\begin{bmatrix}1&1&1&0\\1&1&1&1\end{bmatrix}.$$

In addition, for a parity check matrix with dimensions of mb by nb, a number of systematic columns of the parity check matrix is equal to a difference between a number of matrix columns nb and a number of matrix rows mb (i.e., kb=nb−mb), and a number of check columns of the parity check matrix is equal to a number of matrix rows mb; a corresponding LDPC code is a systematic code, which consists of an information bit sequence c of an LDPC code with a length of kb by z and a parity bit sequence w of an LDPC code with a length mb by z. The LDPC code information bit sequence c is known, and thus, the essence of LDPC encoding is to obtain the LDPC code parity bit sequence w. Similarly, the check matrix H can also be divided into two parts: a systematic block Hc and a check block Hw, and H=[Hc, Hw], that is, Hc is composed of the first kb by z columns in the check matrix H (the dimensions of Hc are mb by z rows and kb by z columns), and Hw is the last mb by z columns in the check matrix H (the dimensions of Hw are mb by z rows and mb by z columns). Therefore, an LDPC codeword meets the following formula: $[Hc, Hw]\cdot[c, w]^T=0$, and then, $Hw\cdot w^T=Hc\cdot c^T$. Therefore, the LDPC code parity bit sequence w is calculated according to the following formula: $w^T=Hw^{-1}\cdot Hc\cdot c^T$, so as to achieve LDPC coding.

In an embodiment of the present disclosure, a sub-matrix B is extracted from a matrix A, which means: extracting a sub-matrix B from the matrix A according to a row index sequence a and/or a column index sequence b. For example, $$A=\begin{bmatrix}1&3&4&0&3&7\\2&5&9&1&0&5\\7&6&3&2&1&7\\1&2&8&5&0&8\end{bmatrix},$$

the row index sequence a={0, 1, 3}, and then the sub-matrix extracted from the matrix A according to the row index sequence a is:

$$B=A(a,:)=\begin{bmatrix}1&3&4&0&3&7\\2&5&9&1&0&5\\1&2&8&5&0&8\end{bmatrix};$$

if the column index sequence b={0, 2, 3}, and then the sub-matrix extracted from the matrix A according to the column index sequence b is $$B=A(:,b)=\begin{bmatrix}1&4&0\\2&9&1\\7&3&2\\1&8&5\end{bmatrix};$$

and the sub-matrix extracted from the matrix A according to the row index sequence a={0, 1, 3} and the column index sequence b={0, 2, 3} is $$B=A(a,b)=\begin{bmatrix}1&4&0\\2&9&1\\1&8&5\end{bmatrix}.$$

In relevant standard protocols, a maximum lifting size Zmax of the LDPC code is 384. In hierarchical decoding, in order to avoid address conflict, the maximum decoding parallelism of LDPC decoding can only reach 384 at most, and the dimension of the base graph is large, thus the throughput of LDPC decoding is limited.

The low density parity check encoding method of this embodiment may be applied to a transmitter in a communication system, and the low density parity check decoding method may be applied to a receiver in the communication system. Further, LDPC encoding is adopted to protect transmitted data. For example, the transmitter adopts an LDPC encoder to perform LDPC encoding on data information bit sequence to be transmitted, and the receiver adopts an LDPC decoder to perform LDPC decoding on the received information. Thereby, the data information bit sequence is recovered.

The decoding process includes: the LDPC decoder performing, with parameters related to the parity check matrix, parity check operation and variable node operation iteratively, so as to continuously attempt to correct any bits that may have been received in error in the LDPC codeword during each iteration. In some embodiments, the LDPC codeword can be a quasi-cyclic LDPC code, a structured LDPC code, or a lifted LDPC code. In some embodiments, the LDPC decoder includes multiple processing elements that may perform parity check operations and variable node operations in parallel. For example, when an LDPC codeword with a lifting size z is processed, the LDPC decoder may use several (such as, z, or a positive integer factor of z) processing elements to concurrently perform parity check operations and variable node operations.

The embodiments of the present disclosure provide a low density parity check encoding method, which adopts the target parity check matrix for encoding. Thus, not only the throughput of data transmission and the decoding parallelism of LDPC codes may be improved, but also flexible code length and code rate may be supported, thereby improving the flexibility of encoding.

FIG. 1 is a flowchart of a low density parity check encoding method provided by an embodiment. As shown in FIG. 1, the method provided in this embodiment includes step 110 and step 120.

In step 110, a target parity check matrix is determined. The target parity check matrix belongs to a second parity check matrix set, and a base graph of the second parity check matrix set is extracted from a base graph of a first parity check matrix set.

In step 120, low density parity check encoding is performed on data to be transmitted according to the target parity check matrix and a target lifting size.

In this embodiment, the target parity check matrix (hereinafter referred to as Hb) is selected from the second parity check matrix set (hereinafter referred to as a parity check matrix set P2), and Hb and the target lifting size (hereinafter referred to as Zc) are used to encode the data to be transmitted to obtain an LDPC code for transmission. The parity check matrix set P2 is obtained according to the first parity check matrix set (hereinafter referred to as a parity check matrix set P1), and a base graph of the parity check matrix set P2 and a base graph of the parity check matrix set P1 meet that the base graph of the parity check matrix set P2 is a sub-matrix extracted from the base graph of the parity check matrix set P1. The description that the base graph of the parity check matrix set P2 is a sub-matrix of the base graph of the parity check matrix set P1 means that LDPC decoding performed by using the parity check matrix set P2 will be compatible with LDPC decoding performed by using the parity check matrix set P1. That is, an LDPC decoder of the parity check matrix set P2 only adopts a part of the hardware circuit in the LDPC decoder of the parity check matrix set P1 (for example, a variable node updating module and a check node updating module in the LDPC decoder of the parity check matrix set P1 are adopted, and a routing network of the LDPC decoder of the parity check matrix set P1 and a routing network of the LDPC decoder of the parity check matrix set P2 are basically the same), so that decoding performed by using parity check matrix set P1 and decoding performed by using the parity check matrix set P2 are completely compatible. Therefore, the efficiency of LDPC decoding is improved. Further, the parity check matrix set P2 may be designed with a higher lifting size, and thus higher decoding parallelism may be adopted, thereby achieving higher decoding throughput. A known parity check matrix set from relevant standard protocols may be adopted as the parity check matrix set P1. The parity check matrix set P1 and the parity check matrix set P2 may be the same, and the base graph of the parity check matrix set P1 and the base graph of the parity check matrix set P2 may be the same. In this case, it can be understood that extracting is performed according to all row indexes and column indexes.

In this embodiment, in a case where the parity check matrix set P1 is known, based on a relationship between the base graph of the parity check matrix set P2 and the base graph of the parity check matrix set P1, the parity check matrix set P2 can be determined, and further, Hb used for encoding can be determined from the parity check matrix set P2. Since the base graph of the parity check matrix set P2 is extracted from the base graph of the parity check matrix set P1, in a case where the target lifting sizes are the same, the number of systematic columns and/or the number of check columns of Hb may be reduced. Then, the receiver may perform parallel decoding for more parity check matrixes, and thereby the decoding parallelism and the throughput of data transmission are improved. In addition, this encoding mode supports flexible encoding for an arbitrary code length and code rate.

In an embodiment, step 110 includes: determining the target parity check matrix of the second parity check matrix set according to the first parity check matrix set. That is, the parity check matrix set P2 is determined according to the parity check matrix set P1, and Hb is determined from the parity check matrix set P2.

In an embodiment, step 110 includes:

determining the base graph of the second parity check matrix set according to the base graph of the first parity check matrix set; and determining the target parity check matrix of the second parity check matrix set according to the base graph of the second parity check matrix set. That is, the base graph of the parity check matrix set P2 is determined according to the base graph of the parity check matrix set P1, and Hb corresponding to the parity check matrix set P2 is determined according to the base graph of the parity check matrix set P2.

In an embodiment, step 110 includes:

determining the second parity check matrix set according to an index sequence and the first parity check matrix set; and determining the target parity check matrix from the second parity check matrix set. That is, the parity check matrix set P2 is determined according to the index sequence and the parity check matrix set P1, and Hb is determined from the parity check matrix set P2. In this embodiment, the index sequence includes at least one of a row index sequence and a column index sequence.

In an embodiment, step 110 includes:

determining the target parity check matrix from the first parity check matrix set or the second parity check matrix set. That is, Hb belongs to the parity check matrix set P1 or the parity check matrix set P2.

In an embodiment, the base graph of the second parity check matrix set is extracted from the base graph of the first parity check matrix set according to at least one of a row index sequence and a column index sequence.

In this embodiment, the dimensions of the base graph of Hb are mb rows and nb columns, where mb and nb are both integers greater than 0. The dimensions of Hb are mb rows and nb columns. The dimensions of the base graph of the parity check matrix set P1 are mb1 rows and nb1 columns, where mb1 and nb1 are both integers greater than 0. The dimensions of the base graph of the parity check matrix set P2 are mb2 rows and nb2 columns, where mb2 and nb2 are both integers greater than 0.

On this basis, the length of the row index sequence is mb2, each element in the row index sequence takes a value from the set {0, 1, 2 . . . , (mb1-1)}, and elements are different from each other. An element in the row index sequence is 0, which indicates that the first row is extracted from the base graph of the parity check matrix set P1. The length of the column index sequence is nb2, each element in the column index sequence takes a value from the set {0, 1, 2 . . . , (nb1-1)}, and elements are different from each other. An element in the column index sequence is 0, which indicates that the first column is extracted from the base graph of the parity check matrix set P1.

In an example, mb2 is a positive integer less than mb1, and nb2 is a positive integer less than nb1.

In an embodiment, the row index sequence meets one of:

1) elements in the row index sequence are contiguous ascending integers, which can also be understood that the row index sequence is a set of contiguous ascending integers; 2) elements in the row index sequence include non-contiguous ascending integers, which can also be understood that the row index sequence is a set of non-contiguous ascending integers; 3) elements in the row index sequence are non-ascending integers except that first M elements in the row index sequence are contiguous ascending integers, where M is an integer greater than 1 and less than mb2, which can also be understood that the row index sequence is a set of non-ascending integers; 4) the row index sequence includes at least {0, 1, 2, 3}.

In an example, the first 4 elements in the row index sequence are {0, 1, 2, 3}. In an embodiment, the column index sequence meets one of:

1) the first E elements of the column index sequence are contiguous ascending integers, where E is an integer greater than 1; 2) the first E elements of the column index sequence include non-contiguous ascending integers, where E is an integer greater than 1; 3) the column index sequence includes at least {0, 1}; 4) the column index sequence includes at least {22, 23, 24, 25}.

In an example, the first 2 elements of the column index sequence are {0, 1}.

In an embodiment, the row index sequence and the column index sequence include one of the following combinations:

1) the row index sequence is a set of contiguous ascending integers, and the first E elements of the column index sequence are non-contiguous ascending integers, where E is an integer greater than 1; 2) the row index sequence is a set of non-contiguous ascending integers, and the first E elements of the column index sequence are non-contiguous ascending integers, where E is an integer greater than 1; 3) the row index sequence is a set of contiguous ascending integers, and the first E elements of the column index sequence are contiguous ascending integers, where E is an integer greater than 1; 4) the row index sequence is a set of non-contiguous ascending integers, and the first E elements of the column index sequence are contiguous ascending integers, where E is an integer greater than 1.

E is an integer greater than 1 and less than or equal to kb2, and kb2 is equal to a difference between nb2 and mb2, that is, kb2 is equal to a number of systematic columns of the base graph of the parity check matrix set P2 or a number of systematic columns of the parity check matrix in the parity check matrix set P1. In an example, E is equals to kb2.

In an embodiment, kb2 is equal to a number of systematic columns of the base graph of the second parity check matrix set, or equal to a difference between a number of columns and a number of rows of the base graph of the second parity check matrix set, or less than or equal to a number of systematic columns of the parity check matrix in the first parity check matrix set P1.

In this embodiment, a number of systematic columns of the base graph of the parity check matrix set P1 is kb1, where kb1 is an integer greater than 0, and kb2 is less than kb1.

In an example, kb2 is a positive integer less than 22.

In an example, kb2 takes a value from a set {12, 14, 15, 16, 18, 20}.

In an example, kb2 is a positive integer less than a difference between kb1 and 4.

In an example, kb2 takes a value from a set {12, 14, 15, 16, 17}.

In an embodiment, the first parity check matrix set includes a1 first parity check matrixes, and base graphs of the a1 first parity check matrixes are the same, where a1 is an integer. The second parity check matrix set includes a2 second parity check matrixes, and base graphs of the a2 second parity check matrixes are the same, where a2 is an integer. A maximum lifting size Zmax2 (hereinafter referred to as Zmax2) of the second parity check matrix set is D times of a maximum lifting size (hereinafter referred to as Zi) supported by the i-th first parity check matrix in the first parity check matrix set, where D is a positive integer power of 2, i is a non-negative integer less than a1, Zi is a maximum lifting size supported by the i-th first parity check matrix in the parity check matrix set P1.

In this embodiment, a2 is an integer greater than or equal to 1, and base graphs of all the second parity check matrixes in the parity check matrix set P2 are the same; a1 is an integer greater than or equal to 1, and base graphs of all the first parity check matrixes in the parity check matrix set P1 are the same. A maximum lifting size supported by the i-th first parity check matrix in the parity check matrix set P1 is Zi, where i is equal to one of 0, 1, 2, . . . , or (a1-1). A maximum lifting size of the i-th second parity check matrix in the parity check matrix set P2 is D times of Zi, that is, the maximum lifting size of the i-th second parity check matrix in the parity check matrix set P2 is equal to Zi by D.

In an example, D is an integer greater than 1, and D is equal to a positive integer power of 2. For example, D is equal to 2, 4 or 8.

In an example, Zmax2 is equal to one of Z0, Z1, Z2, . . . , Z(a1−1).

In an embodiment, a maximum lifting size Zmax2 of the parity check matrix set P2 is greater than a maximum lifting size Zmax1 of the parity check matrix set P1.

In this embodiment, a maximum lifting size supported by the parity check matrix set P1 is Zmax1, and a maximum lifting size supported by the parity check matrix set P2 is Zmax2, where Zmax1 and Zmax2 are both integers greater than 0, and Zmax2 is greater than Zmax1.

In an example, Zmax1 is equal to 384, and Zmax2 is a positive integer greater than 384.

In an example, Zmax2 takes a value from the set {416, 448, 480, 512, 576, 640, 704, 768, 832, 896, 960, 1024, 1152, 1280, 1408, 1536, 1664, 1792, 1920, 2048}.

In an embodiment, a maximum lifting size Zmax2 of the second parity check matrix set is a by $2^b$, where a is an odd number greater than 15 and b is a positive integer.

In this embodiment, Zmax2 is equal to a by $2^b$, where a is an odd number greater than 15 and b is a positive integer.

In an example, a takes a value from the set {17, 19, 21, 23, 25, 27, 29, 31, 33, 35, 37, 39, 41}, b takes a value from the set {4, 5, 6, 7, 8, 9, 10}.

In an embodiment, at least one lifting size sub-set supported by the second parity check matrix set includes at least a by $2^B$, where a is an odd number greater than 15, and B is a set of non-negative integers.

In an example, a takes a value from the set {17, 19, 21, 23, 25, 27, 29, 31, 33, 35, 37, 39, 41}, B is a set of contiguous non-negative integers. B is a set composed of B0 to B1, where B0 equals 2, 3, 4 or 5 and B1 equals 5, 6, 7 or 8.

In an example, a minimum value of the at least one lifting size sub-set is greater than 384.

In an embodiment, the target lifting size belongs to one of G lifting size sub-sets, where G is an integer greater than 1, and there is no intersection between any two of the G lifting size sub-sets.

In this embodiment, there are G lifting size sub-sets, and indexes of the lifting size sub-sets are donated as 0, 1, . . . , (G−1), where G is an integer greater than 1, and there is no intersection between any two lifting size sub-sets. The target lifting size is one element of the G lifting size sub-sets.

In an embodiment, indexes of the lifting size sub-sets supported by the first parity check matrix set constitute a set Set1, and indexes of the lifting size sub-sets supported by the second parity check matrix set constitute a set Set2. Set2 is a sub-set of Set1, or an intersection of Set2 and Set1 is an empty set.

In an embodiment, lifting sizes supported by the first parity check matrix set constitute a first lifting size set Zset1, and lifting sizes supported by the second parity check matrix set constitute a second lifting size set Zset2. Zset1 and Zset2 meet one of:

1) there is no intersection between Zset1 and Zset2; 2) Zset1 is a sub-set of Zset2; 3) a number of elements in an intersection Zset between Zset1 and Zset2 is less than a number of elements in Zset1, and less than a number of elements in Zset2.

In an embodiment, a minimum lifting size supported by the second parity check matrix set is greater than a maximum lifting size supported by the first parity check matrix set. Lifting size(s) supported by the second parity check matrix set include at least one of 416, 448, 480, 512, 576, 640, 704, 768, 832, 896, 960, 1024, 1152, 1280, 1408, 1536, 1664, 1792, 1920, 2048.

In an embodiment, a maximum information length Kmax1 supported by the first parity check matrix set is less than a maximum information length Kmax2 supported by the second parity check matrix set.

In an example, Kmax1 is equal to 8448.

In an embodiment, the second parity check matrix set includes at least one parity check matrix. The parity check matrix includes k0 up-and-down adjacent pairs. The k0 up-and-down adjacent pairs include k1 first type of up-and-down adjacent pairs and k2 second type of up-and-down adjacent pairs, where k1 is greater than 3 by k2, and k1 and k2 are both integers greater than 0. The up-and-down adjacent pair refers to any two adjacent elements located in a same column and indicating a cyclical shift of an identity matrix in the parity check matrix; a difference between two elements of the first type of up-and-down adjacent pair mod 2 is equal to 0; a difference between two elements of the second type of up-and-down adjacent pair mod 2 is greater than 0.

In this embodiment, the up-and-down adjacent pair is defined as: any two elements $\{h_{i,j}, h_{(i+1)\ mod\ mb,\ j}\}$ in the parity check matrix, where the two elements are both elements (not −1) indicating a cyclical shift of an identity matrix, mb is a number of rows of the parity check matrix, and mod represents a remainder operation. The first type of up-and-down adjacent pair refers to an up-and-down adjacent pair (represented as $h_{i,k}$ and $h_{j,k}$) meeting the following relationship: $mod(h_{i,k}-h_{j,k}, 2)\leq a$, $j=(i+1)$ mod mb. The second type of up-and-down adjacent pair refers to an up-and-down adjacent pair (represented as $h_{i,k}$ and $h_{j,k}$) meeting the following relationship: $mod(h_{i,k}-h_{j,k}, 2)>a$, $j=(i+1)$ mod mb, where a is equal to 0, k0, k1 and k2 are positive integers, and k1 is greater than 3 times of k2.

In this embodiment, whether a difference between two elements that constitute an up-and-down adjacent pair is odd or even is determined by taking the remainder operation. If the difference mod 2 is equal to 0, the difference is even, and then, the two elements constitute a first type of up-and-down adjacent pair. In this case, the identity matrix can be divided into multiple groups during decoding process, and there is no address conflict among updating of check nodes of rows, thus waiting time among updating of check nodes of rows can be reduced. Further, decoding speed is faster. If the difference mod 2 is equal to 1, instead of 0, the difference is odd, and then the two elements constitute a second type of up-and-down adjacent pair. In this case, there is an address conflict among updating of check nodes of rows, thus waiting time among updating of check nodes of rows is needed. Further, decoding speed is slower. Therefore, in the determined target parity check matrix, the more the first type of up-and-down adjacent pairs are, the faster the decoding speed is, that is, the higher the throughput is. Upon determining the target parity check matrix, a number of the first type of up-and-down adjacent pairs may be appropriately increased.

In an embodiment, the second parity check matrix set includes at least one parity check matrix. The parity check matrix includes k3 first type of elements indicating cyclical shifts of identity matrixes and k4 second type of elements indicating cyclical shifts of identity matrixes, where k3 is greater than 3 by k4, and k3 and k4 are both integers greater than 0. The first type of element mod 2 is equal to 0 and the second type of element mod 2 is greater than 0.

In this embodiment, the parity check matrix set P2 includes at least one parity check matrix. The parity check matrix includes k3 first type of elements indicating cyclical shifts of identity matrixes and k4 second type of elements indicating cyclical shifts of identity matrixes. The first type of element meets the following relationship: $mod(h_{i,j}, 2)\leq b$, the second type of element meets the following relationship: $mod(h_{i,j}, 2)>b$, where $h_{i,j}$ is an element with a horizontal coordinate being i and a column coordinate being j in the parity check matrix, indicating a cyclical shift of an identity matrix; b is equal to 0; k3 and k4 are both positive integers; and k3 is greater than 3 times of k4.

In this embodiment, whether an element indicating a cyclical shift of an identity matrix is odd or even is determined by taking the remainder operation. If an element mod 2 is equal to 0, the element is even, and then the element belongs to the first type of elements. For the identity matrices indicated by the first type of elements, there is no address conflict among updating of check nodes of rows, thus waiting time among updating of check nodes of rows may be reduced, and further the decoding speed is faster. If an element mod 2 is not equal to 0, the element is odd, and then the element belongs to the second type of elements. For the identity matrices indicated by the second type of elements, there is an address conflict among updating of check nodes of rows, thus waiting time among updating of check nodes of rows is needed, and further the decoding speed is slower. Therefore, in the determined target parity check matrix, the more the first type of elements are, the faster the decoding speed is. Upon determining the target parity check matrix, a number of the first type of elements may be appropriately increased.

In an embodiment, the method further includes:

step 100: determining a parity check matrix set as the target parity check matrix set from at least two parity check matrix sets according to setting information; where the setting information includes at least one of a transport block size (TBS), a code rate, a high-layer signaling, a modulation order, a modulation and coding scheme (MCS) index, a modulation and coding scheme table index.

In this embodiment, the target parity check matrix set is determined from at least two parity check matrix sets according to the setting information, and Hb is determined from the target parity check matrix set. In the at least two parity check matrix sets, there are two parity check matrix sets that meet: a base graph of one of the two parity check matrix sets is a sub-matrix extracted from a base graph of the other of the two parity check matrix sets.

For example, the parity check matrix set P1 is given in relevant standard protocols, the parity check matrix set P2 is determined according to the parity check matrix set P1, and a base graph of the parity check matrix set P2 is a sub-matrix extracted from a base graph of the parity check matrix set P1. According to the setting information, the parity check matrix set P1 or the parity check matrix set P2 may be selected as the target parity check matrix set, and a parity check matrix is determined as Hb from the target parity check matrix set.

In an embodiment, the parity check matrix set P1 and a third parity check matrix set (denoted as a parity check matrix set P2') are given in relevant standard protocols, the parity check matrix set P2 is determined according to the parity check matrix set P1, and a base graph of the parity check matrix set P2 is a sub-matrix extracted from a base graph of the parity check matrix set P1. According to the setting information, the parity check matrix set P1, the parity check matrix set P2 or the parity check matrix set P2' may be selected as the target parity check matrix set, and a parity check matrix is determined as Hb from the target parity check matrix.

In this embodiment, similar to the parity check matrix set P1 and the parity check matrix set P2, the parity check matrix set P2' may also be selected as the target parity check matrix set. The parity check matrix set P2' includes a3 third parity check matrixes, where a3 is equal to a number a1 of the first parity check matrixes in the parity check matrix set P1. Before LDPC encoding is performed, the target parity check matrix set is determined (or an index of the target parity check matrix set is determined) from the parity check matrix set P1, the parity check matrix set P2 and the parity check matrix set P2' according to the setting information, and a parity check matrix is determined as Hb from the target parity check matrix set. Then, LDPC encoding is performed based on Hb.

In some embodiments, step 100 includes:

taking a second parity check matrix set as the target parity check matrix set upon meeting at least one of the following conditions:

1) TBS is greater than or equal to T0, where T0 is an integer greater than or equal to a maximum information length Kmax1 of the data to be transmitted supported by the parity check matrix set P1; 2) the code rate is greater than or equal to R0, where R0 is a real number greater than 0 and less than 1.

In an example, the target parity check matrix set is determined according to the TBS and the code rate:

Condition 1: TBS is less than or equal to 292 bits; or TBS is less than or equal to 3824 bits and the code rate is less than or equal to 0.67; or the code rate is less than or equal to 0.25. Condition 2: TBS is greater than or equal to T0, where T0 is a positive integer greater than or equal to Kmax1. Condition 3: the code rate is greater than or equal to R0, where R0 is a real number greater than 0 and less than 1.

If condition 1 is met, the parity check matrix set P2' is taken as the target parity check matrix set. If at least one of condition 2 and condition 3 is met, the parity check matrix set P2 is taken as the target parity check matrix set. If none of the above conditions is met, the parity check matrix set P1 is taken as the target parity check matrix set.

In an example, T0 is equal to X times of Kmax2, where X is an integer greater than 1; R0 is equal to 1/2, 2/3, 3/4, 5/6, 6/7, 7/8 or 8/9. A value of R0 may be obtained by rounding to 2 decimal places or 3 decimal places. R0 is equal to 0.5, 0.67, 0.75, 0.83, 0.86, 0.88 or 0.89.

In the embodiments of the present disclosure, a low density parity check encoding method is further provided. The method adopts the target base graph for encoding, and thus not only the throughput of data transmission and the decoding parallelism of LDPC codes are improved, but also flexible code length and code rate are supported, thereby improving the flexibility of encoding. For technical details not described in detail in this embodiment, reference may be made to any of the above embodiments.

FIG. 2 is a flowchart of a low density parity check encoding method provided by another embodiment. As shown in FIG. 2, the method provided by this embodiment includes step 210 and step 220.

In step 210, a target base graph is determined. The target base graph is a base graph of a second parity check matrix set, and the base graph of the second parity check matrix set is extracted from a base graph of a first parity check matrix set.

In step 220, low density parity check encoding is performed on data to be transmitted according to the target base graph and a target lifting size.

In this embodiment, a target base graph is selected from a base graph of the second parity check matrix set (i.e., the parity check matrix set P2), and the target base graph and Zc are used to encode the data to be transmitted to obtain an LDPC code for transmission. The base graph of the parity check matrix set P2 and the base graph of the parity check matrix set P1 meet: the base graph of the parity check matrix set P2 is a sub-matrix extracted from the base graph of the first parity check matrix set (i.e., the parity check matrix set P1). The parity check matrix set P1 may adopt a known parity check matrix set in relevant standard protocols.

In this embodiment, based on a relationship between the base graph of the parity check matrix set P2 and the base graph of the parity check matrix set P1, the base graph of the parity check matrix set P2 may be determined in a case where the base graph of the parity check matrix set P1 is known, and further, the target base graph for encoding may be determined from the base graph of the parity check matrix set P2. The target base graph corresponds to the target parity check matrix. Since the base graph of the parity check matrix set P2 is extracted from the base graph of the parity check matrix set P1, in a case where the target lifting sizes are the same, a number of systematic columns and/or a number of check columns of target parity check matrix may be reduced, and then, the receiver may perform parallel decoding for more parity check matrixes, thereby improving the decoding parallelism and the throughput of data transmission. In addition, this encoding mode supports flexible encoding for arbitrary code length and code rate.

In an embodiment, step 220 includes:

determining a check matrix H (hereinafter denoted to as H) according to the target base graph and the target lifting size; and performing low density parity check encoding on the data to be transmitted according to the check matrix H.

In this embodiment, the target base graph is firstly determined, and H is determined according to the target base graph and Zc. H corresponds to the Hb, and then low density parity check encoding is performed on the data to be transmitted based on H.

In an embodiment, step 220 includes:

determining a target parity check matrix Hb according to the target base graph;

and performing low density parity check encoding on the data to be transmitted according to the Hb and the target lifting size.

In this embodiment, the target base graph is firstly determined, and Hb is determined according to the target base graph and Zc. The dimensions of the target base graph are mb rows and nb columns, where mb and nb are both integers greater than 0. The target base graph may be the base graph of the parity check matrix set P2, and is a sub-matrix extracted from the base graph of the parity check matrix set P1 according to a row index sequence and/or a column index sequence.

In an embodiment, step 210 includes:

determining the target base graph according to an index sequence and the base graph of the first parity check matrix. The index sequence includes at least one of the row index sequence and the column index sequence. On this basis, step 220 includes:

determining a target parity check matrix Hb according to the target base graph; and performing low density parity check encoding on the data to be transmitted according to Hb and the target lifting size.

In an embodiment, step 210 includes:

determining the target base graph from the base graph of the parity check matrix set P1 or the base graph of the parity check matrix set P2.

In an embodiment, the method further includes:

step 200: determining a parity check matrix set as the target parity check matrix set from at least two parity check matrix sets according to setting information. The setting information includes at least one of a transport block size, a code rate, a high-layer signaling, a modulation order, an MCS index, an MCS table index.

In an embodiment, step 200 includes:

taking the second parity check matrix set as the target parity check matrix set upon meeting at least one of the following conditions:

the transmission block size is greater than or equal to T0, where T0 is an integer greater than or equal to a maximum information length Kmax1 supported by the first parity check matrix set, or T0 is equal to a maximum information length Kmax2 supported by the second parity check matrix set; the code rate is greater than or equal to R0, where R0 is a real number greater than 0 and less than 1.

In this embodiment, one of at least two parity check matrix sets is determined as the target parity check matrix set according to the setting information, the target base graph corresponds to Hb, and Hb is determined from the target parity check matrix set.

The base graph of the second parity check matrix set is extracted from the base graph of the parity check matrix set P1 according to at least one of a row index sequence and a column index sequence.

In an embodiment, the row index sequence meets one of:

elements in the row index sequence are contiguous ascending integers; elements in the row index sequence include non-contiguous ascending integers; elements in the row index sequence are non-ascending integers except that first M elements in the row index sequence are contiguous ascending integers, where M is greater than 1; the row index sequence includes at least {0, 1, 2, 3}.

In an embodiment, the column index sequence meets one of:

the first kb2 elements of the column index sequence are contiguous ascending integers, where kb2 is an integer greater than 1; first kb2 elements of the column index sequence include non-contiguous ascending integers, where kb2 is an integer greater than 1; the column index sequence includes at least {0, 1}; the column index sequence includes at least {22, 23, 24, 25}.

In an embodiment, kb2 is equal to a number of systematic columns of the base graph of the parity check matrix set P2, or equal to a difference between a number of columns and a number of rows of the base graph of the parity check matrix set P2, or less than or equal to a number of systematic columns of the parity check matrix in the parity check matrix set P1.

In an embodiment, the first parity check matrix set includes a1 first parity check matrixes, and base graphs of the a1 first parity check matrixes are the same, where a1 is a positive integer. The second parity check matrix set includes a2 second parity check matrixes, and base graphs of the a2 second parity check matrixes are the same, where a2 is a positive integer. A maximum lifting size Zmax2 of the second parity check matrix set is D times of the maximum lifting size Zi supported by the i-th first parity check matrix in the first parity check matrix set, where D is a positive integer power of 2, and i is a non-negative integer less than a1.

In an embodiment, a maximum lifting size Zmax2 of the second parity check matrix set is greater than a maximum lifting size Zmax1 of the first parity check matrix set.

In an embodiment, a lifting size Zmax2 of the second parity check matrix set is a by $2^b$, where a is an odd greater than 15, b is a positive integer.

In an embodiment, the target lifting size belongs to one of G lifting size sub-sets, where G is an integer greater than 1, and there is no intersection between any two of the G lifting size sub-sets.

In an embodiment, lifting sizes supported by the first parity check matrix set P1 constitute a first lifting size set Zset1, and lifting sizes supported by the second parity check matrix set constitute a second lifting size set Zset2. The first lifting size set Zset1 and the second lifting size set Zset2 meet one of:

there is no intersection between the first lifting size set Zset1 and the second lifting size set Zset2; the first lifting size set Zset1 is a sub-set of the second lifting size set Zset2; a number of elements in intersection Zset of the first lifting size set Zset1 and the second lifting size set Zset2 is less than a number of elements in the first lifting size set Zset1 and less than a number of elements in the second lifting size set Zset2.

In an embodiment, a minimum lifting size supported by the second parity check matrix set is greater than a maximum lifting size supported by the first parity check matrix set; and lifting sizes supported by the second parity check matrix set include at least one of 416, 448, 480, 512, 576, 640, 704, 768, 832, 896, 960, 1024, 1152, 1280, 1408, 1536, 1664, 1792, 1920, 2048.

In an embodiment, a maximum information length Kmax1 supported by the first parity check matrix set is less than a maximum information length Kmax2 supported by the second parity check matrix set.

In an embodiment, the second parity check matrix set includes at least one parity check matrix. The parity check matrix includes k0 up-and-down adjacent pairs. The k0 up-and-down adjacent pairs include k1 first type of up-and-down adjacent pairs and k2 second type of up-and-down adjacent pairs, where k1 is greater than 3*k2, and k1 and k2 are both integers greater than 0. The up-and-down adjacent pair refers to any two adjacent elements located in a same column and indicating a cyclical shift of an identity matrix in the parity check matrix; a difference between the two elements of the first type of up-and-down adjacent pair mod 2 is equal to 0; a difference between the two elements of the second type of up-and-down adjacent pair mod 2 is greater than 0.

In an embodiment, the second parity check matrix set includes at least one parity check matrix. The parity check matrix includes k3 first type of elements indicating cyclical shifts of identity matrixes and k4 second type of elements indicating cyclical shifts of identity matrixes, where k3 is greater than 3 times of k4, and k3 and k4 are both integers greater than 0.

A first type of element mod 2 is equal to 0; and a second type of element mod 2 is greater than 0.

The encoding process is described below by way of example. In the following examples, the first parity check matrix set is denoted as a parity check matrix set P1, the second parity check matrix set is denoted as a parity check matrix set P2, and the third parity check matrix set is denoted as a parity check matrix set P2'.

Example 1

An input information bit sequence (i.e., data to be transmitted) for LDPC encoding is represented as $c_0, c_1, c_2, c_3, \ldots, c_{K-1}$ with a length of K bits. The encoded bit sequence obtained after LDPC encoding is represented as $d_0, d_1, d_2, \ldots, d_{N-1}$ with a length of N bits. For the parity check matrix set P1, $K=kb1 \cdot Z_c$ and $N=(nb1-2) \cdot Z_c$, that is, a number of systematic columns of the parity check matrix P1 is kb1, and a total number of systematic rows of the parity check matrix P1 is nb1, where kb1 and nb1 are both integers greater than 0. For the parity check matrix set P2, $K=kb2 \cdot Z_c$ and $N=(nb2-2) \cdot Z_c$, that is, a number of systematic columns of the parity check matrix P2 is kb2, and a number of systematic rows of the parity check matrix P2 is nb2, where kb2 and nb2 are both integers greater than 0; $Z_c$ is a target lifting size for LDPC encoding, and $Z_c$ is an integer greater than 0.

Performing LDPC encoding on the input information bit sequence includes the following steps.

In step 1, an index $$i_{LS}$$

of a lifting size sub-set is determined. Each index $$i_{LS}$$

defines a lifting size sub-set, and there is no intersection between any two lifting size sub-sets. The index of the lifting size sub-set containing $Z_c$ is $$i_{LS}.$$

This index of the lifting size sub-set is the same as an index of the target parity check matrix (i.e., an index of the target parity check matrix in the parity check matrix set).

In step 2, the $(2 \cdot Z_c)$-th bit to (K−1)-th bit in the input information bit sequence $c_0, c_1, c_2, c_3, \ldots, c_{K-1}$ are stored into the encoded bit sequence $d_0, d_1, d_2, d_3, \ldots, d_{N-1}$. This may be achieved by the following pseudocode (in which "NULL" represents a filler bit):

```
for k = 2Z_c to K − 1
if c_k ≠< NULL>
d_{k−2Z_c} = c_k ;
else
c_k = 0 ;
```

-continued

```
d_{k−2Z_c} =< NULL > ;
end if
end for
```

In step 3, a base graph $H_{BG2}$ of the parity check matrix set P2 is determined; a check matrix H is determined according to the base graph of the parity check matrix set P2 and the target lifting size $Z_c$, and LDPC encoding is performed to generate a parity bit sequence. The generated $(N+2Z_c-K)$ parity bits constitute a parity bit sequence $w=[w_0, w_1, w_2, \ldots, w_{N+2Z_c-K-1}]^T$ and meet $$H \times \begin{bmatrix} c \\ w \end{bmatrix} = 0,$$

where $c=[c_0, c_1, c_2, c_3, \ldots, c_{K-1}]^T$, where 0 in this relationship represents an all-zero vector, and all LDPC encoding operations are performed in the binary Galois fields (GF(2)).

The process of determining the check matrix H includes:

for the parity check matrix set P1, base graph $H_{BG1}$ thereof includes mb1 rows corresponding to row index i=0, 1, 2 . . . , (mb1−1), and nb1 columns corresponding to column index j=0, 1, 2, . . . , (nb1−1), for the parity check matrix set P2, base graph $H_{BG2}$ thereof includes mb2 rows corresponding to row index i=0, 1, 2, . . . , (mb2−1), and nb2 columns corresponding to column index j=0, 1, 2, . . . , (nb2−1), the base graph includes at least two elements, i.e., "0" and "1".

The base graph $H_{BG2}$ of the parity check matrix set P2 is determined by the base graph $H_{BG1}$ of the parity check matrix set P1, row index sequence α and column index sequence β, and this process may be expressed as $H'_{BG}=H_{BG1}(\alpha, :)$, and $H_{BG2}=H'_{BG}(:, \beta)$; or $H''_{BG}=H_{BG1}(:, \beta)$, and $H_{BG2}=H''_{BG}(\alpha, :)$, or $H_{BG2}=H_{BG1}(\alpha, \beta)$.

$H_{BG1}$ is the base graph of the parity check matrix set P1; $H_{BG2}$ is the base graph of the parity check matrix set P2; $H_{BG1}(\alpha, :)$ represents a new matrix consisting of rows whose row index is α taken from the matrix similarly, $H_{BG1}$; similarly, $H'_{BG}(:, \beta)$ represents a new matrix consisting of columns whose column index is β taken from the matrix $H'_{BG}$. That is, the base graph $H_{BG2}$ of the parity check matrix set P2 is a sub-matrix (or an extracted matrix) of the base graph $H_{BG1}$ of the parity check matrix set P1.

The target parity check matrix Hb belongs to the parity check matrix set P2, and correspondingly, the target base graph $H_{BG}$ belongs to the base graph $H_{BG2}$ of the parity check matrix set P2. The check matrix H can be obtained by replacing all the elements in the target base graph $H_{BG}$ with either an all-zero square matrix or a cyclically shifted identity matrix; where the dimensions of both the all-zero square matrix and the identity matrix are $Z_c$ by $Z_c$.

The process of obtaining the check matrix H includes:

replacing all "0" elements in the target base graph with an all-zero square matrix, where a size of the all-zero square matrix is $Z_c$ by $Z_c$.

All "1" elements in the target base graph $H_{BG}$ is replaced with a matrix obtained by cyclically shifting an identity matrix with a size $Z_c$ by $Z_c$, where i and j are a row index and a column index of the target base graph $H_{BG}$, respectively. $I(P_{i,j})$ represents that a matrix obtained by cyclically right shifting an identity matrix with a size $Z_c$ by $Z_c$ by $P_{i,j}$ bits. For the parity check matrix set P1, $P_{i,j}=\mathrm{mod}(V_{i,j}, Z_c)$, where $V_{i,j}$ is an element in the i-th row and the j-th column of the $i_{LS}$-th first parity check matrix in the parity check matrix set P1, and $V_{i,j}$ is determined according to index $i_{LS}$ and the parity check matrix set P1, where index $i_{LS}$ is an index of the first parity check matrix in the parity check matrix set P1. For the parity check matrix set P2, the $i_{LS}$-th second parity check matrix in the parity check matrix set P2 is determined according to the $i_{LS}$-th first parity check matrix in the parity check matrix set P1, the row index sequence α, and the column index sequence β, and $V'_{i,j}=V_{\alpha(i),\beta(j)}$, where $V'_{i,j}$ is an element in the $i_{LS}$-th second parity check matrix in the parity check matrix set P2, and $V_{\alpha(i),\beta(j)}$ is an element in the $i_{LS}$-th first parity check matrix in the parity check matrix set P1. Then, the cyclical right shifting valve $P_{i,j}$ is obtained by formula $P_{i,j}=\mathrm{mod}(V'_{i,j}, Z_c)$. That is, the target parity check matrix of the parity check matrix set P2 is determined by the parity check matrix set P1, the row index sequence α and the column index sequence β. For example, element $V'_{i,j}$ that indicates a cyclical shift of an identity matrix in the i-th row and j-th column of the $i_{LS}$-th second parity check matrix in the parity check matrix set P2 is determined as $V'_{i,j}=V_{\alpha(i),\beta(j)}$, where $i_{LS}$ is at least an integer from 0 to 7, α(i) is the i-th element in the row index sequence α, and β(j) is the j-th element in the column index sequence β.

In step 4, the parity bit sequence is stored into the encoded bit sequence $d_0, d_1, d_2, \ldots, d_{N-1}$ to obtain a new bit sequence. The pseudocode for storing the generated $(N+2Z_c-K)$ parity bits $w=[w_0, w_1, w_2, \ldots, w_{N+2Z_c-K-1}]^T$ into the encoded bit sequence $d_0, d_1, d_2, \ldots, d_{N-1}$ is as follows:

```
for k = K to N + 2Zc −1
    d(k−2Zc) = w(k−K) ;
end for
```

Table 1 shows lifting size sub-sets provided in an example. The lifting size sub-set indexes $i_{LS}$ corresponding to 8 lifting size sub-sets are 0 to 7, respectively.

TABLE 1 lifting size sub-sets

| Lifting size sub-set index ($i_{LS}$) | Lifting size sub-set |
|---|---|
| 0 | {2, 4, 8, 16, 32, 64, 128, 256, 512, 1024} |
| 1 | {3, 6, 12, 24, 48, 96, 192, 384, 768} |
| 2 | {5, 10, 20, 40, 80, 160, 320, 640} |
| 3 | {7, 14, 28, 56, 112, 224, 448, 896} |
| 4 | {9, 18, 36, 72, 144, 288, 576} |
| 5 | {11, 22, 44, 88, 176, 352, 704} |
| 6 | {13, 26, 52, 104, 208, 416, 832} |
| 7 | {15, 30, 60, 120, 240, 480, 960} |

In this example, the parity check matrix set P1 includes at least one of the parity check matrixes shown in Table 3; or the parity check matrix set P1 includes at least one sub-matrix of the parity check matrixes shown in Table 11, for example, the sub-matrix consisting of the first mb rows and the first (mb+16) columns of a parity check matrix shown in Table 11, where mb is an integer greater than 3. mb is 4, 6, 8, 10, or 18.

Table 2 shows positions and element values of elements equal to 1 in the base graph of the parity check matrix set P1 provided in an example, where a position of an element equal to 1 is represented by row index (i) and column index (j). A position of an element equal to 1 corresponds to a position of an element indicating a cyclical shift of an identity matrix, and defines an element value ($V_{i,j}$) at a position in the corresponding parity check matrix, i.e., a number of bits of the cyclical shift. In the base graph $H_{BG1}$ of P1, positions of other row indexes or column indexes (i.e., positions not defined in Table 2) correspond to element value "0", that is, corresponds to positions indicating the all-zero square matrix. In Table 2, an index $i_{LS}$ of each lifting size sub-set corresponds to a first parity check matrix. For example, for $i_{LS}$=0, in Table 2, all the defined positions (i, j) in the columns with $i_{LS}$=0 correspond to cyclical shifts of identity matrixes, while the other undefined positions correspond to all-zero matrixes. These matrixes by cyclically shifting the identity matrixes and all-zero square matrixes together constitute the first parity check matrix corresponding to $i_{LS}$=0, and there are a total of 8 first parity check matrixes corresponding to $i_{LS}$ equal to 0 to 7. One or more parity check matrixes of these 8 first parity check matrixes constitute the parity check matrix set P1. A maximum information length supported by the parity check matrix set P1 is 8448, and the dimension of the base graph is 46 rows by 68 columns. So mb1=46, nb1=68, and kb1=22.

The parity check matrix set P1 includes at least one first parity check matrix shown in Table 2.

TABLE 2 positions and element values of elements equal to 1 in the base graph of the parity check matrix set P1 (i represents a row index, and j represents a column index)

| $HB_{G1}$ | | $V_{i,j}$ Lifting size sub-set index $i_{LS}$ | | | | | | | |
|---|---|---|---|---|---|---|---|---|---|
| i | j | 0 | 1 | 2 | 3 | 4 | 5 | 6 | 7 |
| 0 | 0 | 762 | 307 | 393 | 895 | 211 | 294 | 0 | 375 |
| | 1 | 325 | 403 | 15 | 16 | 198 | 118 | 416 | 947 |
| | 2 | 226 | 50 | 423 | 318 | 188 | 167 | 624 | 366 |
| | 3 | 159 | 753 | 49 | 539 | 474 | 682 | 416 | 854 |
| | 5 | 356 | 565 | 240 | 74 | 507 | 207 | 0 | 804 |
| | 6 | 778 | 216 | 39 | 458 | 4 | 517 | 0 | 83 |
| | 9 | 315 | 317 | 335 | 448 | 317 | 243 | 624 | 53 |
| | 10 | 229 | 672 | 482 | 205 | 432 | 602 | 0 | 465 |
| | 11 | 622 | 109 | 215 | 888 | 404 | 1 | 0 | 205 |
| | 12 | 959 | 17 | 484 | 693 | 216 | 339 | 416 | 128 |
| | 13 | 265 | 741 | 453 | 663 | 403 | 201 | 624 | 315 |
| | 15 | 707 | 215 | 618 | 462 | 233 | 53 | 416 | 375 |
| | 16 | 23 | 106 | 110 | 70 | 144 | 347 | 0 | 217 |
| | 18 | 190 | 242 | 113 | 141 | 95 | 304 | 0 | 220 |
| | 19 | 35 | 180 | 16 | 198 | 216 | 167 | 0 | 90 |
| | 20 | 239 | 330 | 189 | 104 | 73 | 47 | 0 | 105 |
| | 21 | 31 | 346 | 32 | 81 | 261 | 188 | 0 | 137 |
| | 22 | 1 | 1 | 1 | 1 | 1 | 1 | 0 | 1 |
| | 23 | 0 | 0 | 0 | 0 | 0 | 0 | 0 | 0 |
| 1 | 0 | 514 | 460 | 303 | 689 | 179 | 429 | 438 | 96 |
| | 2 | 751 | 76 | 614 | 717 | 450 | 577 | 219 | 956 |
| | 3 | 629 | 457 | 27 | 599 | 511 | 448 | 540 | 856 |
| | 4 | 892 | 288 | 261 | 270 | 544 | 690 | 416 | 461 |
| | 5 | 583 | 144 | 161 | 567 | 448 | 620 | 634 | 128 |
| | 7 | 222 | 331 | 133 | 829 | 364 | 112 | 416 | 332 |
| | 8 | 872 | 715 | 324 | 357 | 490 | 302 | 416 | 652 |
| | 9 | 429 | 562 | 80 | 535 | 117 | 402 | 626 | 776 |
| | 11 | 988 | 295 | 449 | 654 | 109 | 519 | 640 | 251 |
| | 12 | 358 | 342 | 300 | 93 | 303 | 253 | 268 | 669 |
| | 14 | 877 | 217 | 396 | 303 | 72 | 686 | 624 | 815 |
| | 15 | 900 | 99 | 266 | 233 | 152 | 594 | 630 | 805 |
| | 16 | 142 | 354 | 72 | 118 | 158 | 257 | 30 | 153 |
| | 17 | 155 | 114 | 83 | 194 | 147 | 133 | 0 | 87 |
| | 19 | 255 | 331 | 260 | 31 | 156 | 9 | 168 | 163 |
| | 21 | 28 | 112 | 301 | 187 | 119 | 302 | 31 | 216 |
| | 22 | 0 | 0 | 0 | 0 | 0 | 0 | 105 | 0 |
| | 23 | 0 | 0 | 0 | 0 | 0 | 0 | 0 | 0 |
| | 24 | 0 | 0 | 0 | 0 | 0 | 0 | 0 | 0 |
| 2 | 0 | 362 | 205 | 388 | 879 | 258 | 578 | 132 | 189 |
| | 1 | 367 | 634 | 327 | 875 | 455 | 387 | 37 | 724 |
| | 2 | 953 | 712 | 400 | 31 | 220 | 565 | 229 | 945 |
| | 4 | 63 | 716 | 280 | 400 | 133 | 654 | 804 | 151 |

TABLE 2-continued positions and element values of elements equal to 1 in the base graph of the parity check matrix set P1 (i represents a row index, and j represents a column index)

| $HB_{G1}$ | | $V_{i,j}$ Lifting size sub-set index $i_{LS}$ | | | | | | | |
|---|---|---|---|---|---|---|---|---|---|
| i | j | 0 | 1 | 2 | 3 | 4 | 5 | 6 | 7 |
| | 5 | 373 | 256 | 358 | 404 | 531 | 111 | 212 | 476 |
| | 6 | 93 | 161 | 547 | 186 | 202 | 617 | 149 | 357 |
| | 7 | 485 | 267 | 202 | 767 | 218 | 480 | 256 | 659 |
| | 8 | 945 | 160 | 200 | 825 | 351 | 237 | 454 | 332 |
| | 9 | 863 | 63 | 71 | 849 | 0 | 646 | 538 | 264 |
| | 10 | 295 | 129 | 426 | 294 | 3 | 479 | 611 | 548 |
| | 13 | 142 | 200 | 295 | 525 | 362 | 110 | 571 | 486 |
| | 14 | 481 | 88 | 283 | 438 | 517 | 286 | 444 | 341 |
| | 15 | 737 | 437 | 621 | 749 | 0 | 477 | 85 | 753 |
| | 17 | 245 | 131 | 184 | 198 | 216 | 131 | 47 | 96 |
| | 18 | 205 | 240 | 246 | 117 | 269 | 163 | 179 | 125 |
| | 19 | 251 | 205 | 230 | 223 | 200 | 210 | 42 | 67 |
| | 20 | 117 | 13 | 276 | 90 | 234 | 7 | 66 | 230 |
| | 24 | 0 | 0 | 0 | 0 | 0 | 0 | 0 | 0 |
| | 25 | 0 | 0 | 0 | 0 | 0 | 0 | 0 | 0 |
| 3 | 0 | 889 | 660 | 220 | 873 | 475 | 97 | 4 | 128 |
| | 1 | 857 | 471 | 208 | 690 | 145 | 94 | 214 | 743 |
| | 3 | 596 | 0 | 350 | 837 | 454 | 401 | 33 | 882 |
| | 4 | 276 | 659 | 517 | 453 | 396 | 279 | 321 | 220 |
| | 6 | 150 | 583 | 381 | 269 | 370 | 139 | 49 | 283 |
| | 7 | 643 | 537 | 495 | 590 | 420 | 166 | 229 | 666 |
| | 8 | 1011 | 56 | 79 | 16 | 197 | 443 | 6 | 576 |
| | 10 | 136 | 516 | 281 | 482 | 329 | 106 | 775 | 721 |
| | 11 | 342 | 689 | 303 | 379 | 450 | 598 | 83 | 456 |
| | 12 | 1014 | 615 | 253 | 213 | 345 | 345 | 154 | 22 |
| | 13 | 219 | 725 | 164 | 819 | 324 | 269 | 503 | 264 |
| | 14 | 211 | 212 | 53 | 741 | 403 | 537 | 5 | 407 |
| | 16 | 240 | 304 | 44 | 96 | 242 | 249 | 92 | 200 |
| | 17 | 76 | 300 | 28 | 74 | 165 | 215 | 173 | 32 |
| | 18 | 244 | 271 | 77 | 99 | 0 | 143 | 120 | 235 |
| | 20 | 144 | 39 | 319 | 30 | 113 | 121 | 2 | 172 |
| | 21 | 12 | 357 | 68 | 158 | 108 | 121 | 142 | 219 |
| | 22 | 1 | 1 | 1 | 1 | 1 | 1 | 0 | 1 |
| | 25 | 0 | 0 | 0 | 0 | 0 | 0 | 0 | 0 |
| 4 | 0 | 669 | 332 | 233 | 842 | 534 | 42 | 232 | 304 |
| | 1 | 870 | 181 | 525 | 234 | 523 | 256 | 828 | 211 |
| | 26 | 0 | 0 | 0 | 0 | 0 | 0 | 0 | 0 |
| 5 | 0 | 973 | 195 | 403 | 164 | 261 | 571 | 393 | 482 |
| | 1 | 748 | 398 | 292 | 507 | 181 | 130 | 724 | 651 |
| | 3 | 194 | 499 | 50 | 86 | 72 | 251 | 440 | 527 |
| | 12 | 743 | 550 | 318 | 304 | 283 | 674 | 65 | 623 |
| | 16 | 28 | 241 | 201 | 182 | 254 | 295 | 207 | 210 |
| | 21 | 123 | 51 | 267 | 130 | 79 | 258 | 161 | 180 |
| | 22 | 627 | 157 | 279 | 601 | 144 | 283 | 72 | 180 |
| | 27 | 0 | 0 | 0 | 0 | 0 | 0 | 0 | 0 |
| 6 | 0 | 183 | 662 | 289 | 606 | 80 | 294 | 630 | 679 |
| | 6 | 22 | 257 | 21 | 791 | 144 | 425 | 443 | 262 |
| | 10 | 284 | 1 | 613 | 337 | 169 | 330 | 163 | 23 |
| | 11 | 323 | 351 | 13 | 21 | 90 | 99 | 258 | 340 |
| | 13 | 500 | 92 | 552 | 63 | 347 | 172 | 256 | 332 |
| | 17 | 11 | 253 | 302 | 51 | 177 | 150 | 24 | 207 |
| | 18 | 157 | 18 | 138 | 136 | 151 | 284 | 38 | 52 |
| | 20 | 211 | 225 | 235 | 116 | 1108 | 305 | 91 | 13 |
| | 28 | 0 | 0 | 0 | 0 | 0 | 0 | 0 | 0 |
| 7 | 0 | 988 | 9 | 12 | 241 | 169 | 3 | 769 | 317 |
| | 1 | 556 | 62 | 88 | 524 | 477 | 103 | 712 | 146 |
| | 4 | 927 | 700 | 527 | 776 | 442 | 224 | 528 | 209 |
| | 7 | 31 | 333 | 370 | 548 | 184 | 297 | 569 | 32 |
| | 8 | 423 | 674 | 25 | 822 | 392 | 215 | 367 | 166 |
| | 14 | 616 | 114 | 76 | 158 | 452 | 391 | 492 | 738 |
| | 29 | 0 | 0 | 0 | 0 | 0 | 0 | 0 | 0 |
| 8 | 0 | 624 | 691 | 295 | 33 | 342 | 348 | 796 | 901 |
| | 1 | 4 | 563 | 133 | 95 | 0 | 75 | 210 | 825 |
| | 3 | 263 | 165 | 130 | 452 | 540 | 22 | 339 | 381 |
| | 12 | 467 | 402 | 231 | 889 | 329 | 312 | 349 | 943 |
| | 16 | 102 | 39 | 296 | 204 | 98 | 224 | 96 | 177 |
| | 19 | 164 | 224 | 110 | 39 | 46 | 17 | 99 | 145 |
| | 21 | 109 | 368 | 269 | 58 | 15 | 59 | 101 | 199 |
| | 22 | 753 | 67 | 245 | 44 | 230 | 666 | 659 | 153 |
| | 24 | 602 | 554 | 154 | 201 | 54 | 244 | 116 | 518 |
| | 30 | 0 | 0 | 0 | 0 | 0 | 0 | 0 | 0 |
| 9 | 0 | 103 | 366 | 189 | 9 | 162 | 156 | 6 | 169 |
| | 1 | 182 | 232 | 244 | 37 | 159 | 88 | 10 | 12 |
| | 10 | 109 | 321 | 36 | 213 | 93 | 293 | 145 | 206 |
| | 11 | 21 | 133 | 286 | 105 | 134 | 11 | 53 | 221 |
| | 13 | 142 | 57 | 151 | 89 | 45 | 92 | 201 | 17 |
| | 17 | 14 | 303 | 267 | 185 | 132 | 152 | 4 | 212 |
| | 18 | 61 | 63 | 135 | 109 | 76 | 23 | 164 | 92 |
| | 20 | 216 | 82 | 209 | 218 | 209 | 337 | 173 | 205 |
| | 31 | 0 | 0 | 0 | 0 | 0 | 0 | 0 | 0 |
| 10 | 1 | 98 | 485 | 14 | 754 | 178 | 527 | 75 | 356 |
| | 2 | 917 | 339 | 400 | 613 | 1 | 253 | 493 | 151 |
| | 4 | 935 | 274 | 531 | 174 | 316 | 379 | 364 | 70 |
| | 7 | 672 | 495 | 75 | 19 | 555 | 231 | 16 | 710 |
| | 8 | 561 | 383 | 161 | 194 | 234 | 401 | 636 | 595 |
| | 14 | 826 | 354 | 311 | 103 | 489 | 267 | 694 | 564 |
| | 32 | 0 | 0 | 0 | 0 | 0 | 0 | 0 | 0 |
| 11 | 0 | 77 | 48 | 336 | 52 | 343 | 25 | 392 | 765 |
| | 1 | 553 | 486 | 147 | 11 | 311 | 322 | 310 | 355 |
| | 12 | 595 | 392 | 290 | 674 | 562 | 200 | 331 | 374 |
| | 16 | 182 | 47 | 289 | 35 | 181 | 351 | 16 | 1 |
| | 21 | 78 | 188 | 177 | 32 | 273 | 166 | 104 | 152 |
| | 22 | 1020 | 334 | 43 | 532 | 327 | 338 | 733 | 405 |
| | 23 | 534 | 499 | 280 | 873 | 314 | 192 | 332 | 347 |
| | 33 | 0 | 0 | 0 | 0 | 0 | 0 | 0 | 0 |
| 12 | 0 | 416 | 461 | 549 | 142 | 225 | 123 | 630 | 906 |
| | 1 | 42 | 186 | 555 | 623 | 450 | 569 | 228 | 455 |
| | 10 | 789 | 558 | 169 | 808 | 532 | 142 | 827 | 124 |
| | 11 | 32 | 616 | 368 | 675 | 439 | 110 | 153 | 420 |
| | 13 | 1002 | 50 | 105 | 28 | 526 | 176 | 728 | 338 |
| | 18 | 7 | 74 | 52 | 182 | 243 | 76 | 207 | 80 |
| | 34 | 0 | 0 | 0 | 0 | 0 | 0 | 0 | 0 |
| 13 | 0 | 945 | 697 | 359 | 753 | 519 | 663 | 468 | 460 |
| | 3 | 1016 | 177 | 622 | 504 | 288 | 251 | 147 | 425 |
| | 7 | 663 | 650 | 303 | 520 | 216 | 265 | 209 | 634 |
| | 20 | 185 | 115 | 160 | 217 | 47 | 94 | 16 | 178 |
| | 23 | 830 | 370 | 37 | 78 | 324 | 433 | 462 | 390 |
| | 35 | 0 | 0 | 0 | 0 | 0 | 0 | 0 | 0 |
| 14 | 0 | 206 | 142 | 78 | 14 | 0 | 22 | 1 | 124 |
| | 12 | 55 | 248 | 299 | 175 | 186 | 322 | 202 | 144 |
| | 15 | 206 | 137 | 54 | 211 | 253 | 277 | 118 | 182 |
| | 16 | 127 | 89 | 61 | 191 | 16 | 156 | 130 | 95 |
| | 17 | 16 | 347 | 179 | 51 | 0 | 66 | 1 | 72 |
| | 21 | 229 | 12 | 258 | 43 | 79 | 78 | 2 | 76 |
| | 36 | 0 | 0 | 0 | 0 | 0 | 0 | 0 | 0 |
| 15 | 0 | 40 | 241 | 229 | 90 | 170 | 176 | 173 | 39 |
| | 1 | 96 | 2 | 290 | 120 | 0 | 348 | 6 | 138 |
| | 10 | 65 | 210 | 60 | 131 | 183 | 15 | 81 | 220 |
| | 13 | 63 | 318 | 130 | 209 | 108 | 81 | 182 | 173 |
| | 18 | 75 | 55 | 184 | 209 | 68 | 176 | 53 | 142 |
| | 25 | 179 | 269 | 51 | 81 | 64 | 113 | 46 | 49 |
| | 37 | 0 | 0 | 0 | 0 | 0 | 0 | 0 | 0 |
| 16 | 1 | 64 | 13 | 69 | 154 | 270 | 190 | 88 | 78 |
| | 3 | 49 | 338 | 140 | 164 | 13 | 293 | 198 | 152 |
| | 11 | 49 | 57 | 45 | 43 | 99 | 332 | 160 | 84 |
| | 20 | 51 | 289 | 115 | 189 | 54 | 331 | 122 | 5 |
| | 22 | 154 | 57 | 300 | 101 | 0 | 114 | 182 | 205 |
| | 38 | 0 | 0 | 0 | 0 | 0 | 0 | 0 | 0 |
| 17 | 0 | 7 | 260 | 257 | 56 | 153 | 110 | 91 | 183 |
| | 14 | 164 | 303 | 147 | 110 | 137 | 228 | 184 | 112 |
| | 16 | 59 | 81 | 128 | 200 | 0 | 247 | 30 | 106 |
| | 17 | 1 | 358 | 51 | 63 | 0 | 116 | 3 | 219 |
| | 21 | 144 | 375 | 228 | 4 | 162 | 190 | 155 | 129 |
| | 39 | 0 | 0 | 0 | 0 | 0 | 0 | 0 | 0 |
| 18 | 1 | 42 | 130 | 260 | 199 | 161 | 47 | 1 | 183 |
| | 12 | 233 | 163 | 294 | 110 | 151 | 286 | 41 | 215 |
| | 13 | 8 | 280 | 291 | 200 | 0 | 246 | 167 | 180 |
| | 18 | 155 | 132 | 141 | 143 | 241 | 181 | 68 | 143 |
| | 19 | 147 | 4 | 295 | 186 | 144 | 73 | 148 | 14 |
| | 40 | 0 | 0 | 0 | 0 | 0 | 0 | 0 | 0 |

TABLE 2-continued positions and element values of elements equal to 1 in the base graph of the parity check matrix set P1 (i represents a row index, and j represents a column index)

| $HB_{G1}$ | | $V_{i,j}$ Lifting size sub-set index $i_{LS}$ | | | | | | | |
|---|---|---|---|---|---|---|---|---|---|
| i | j | 0 | 1 | 2 | 3 | 4 | 5 | 6 | 7 |
| 19 | 0 | 60 | 529 | 384 | 456 | 0 | 439 | 428 | 659 |
| | 1 | 841 | 597 | 181 | 454 | 288 | 110 | 6 | 588 |
| | 7 | 328 | 344 | 421 | 103 | 118 | 147 | 582 | 399 |
| | 8 | 127 | 242 | 270 | 646 | 432 | 258 | 808 | 858 |
| | 10 | 736 | 197 | 361 | 680 | 288 | 556 | 815 | 436 |
| | 41 | 0 | 0 | 0 | 0 | 0 | 0 | 0 | 0 |
| 21 | 0 | 407 | 571 | 301 | 105 | 553 | 89 | 422 | 317 |
| | 3 | 186 | 206 | 482 | 434 | 81 | 417 | 428 | 667 |
| | 9 | 985 | 648 | 40 | 121 | 378 | 507 | 639 | 683 |
| | 11 | 559 | 725 | 450 | 438 | 144 | 596 | 5 | 887 |
| | 22 | 672 | 59 | 10 | 407 | 228 | 382 | 238 | 610 |
| | 42 | 0 | 0 | 0 | 0 | 0 | 0 | 0 | 0 |
| 21 | 1 | 249 | 205 | 79 | 192 | 64 | 162 | 6 | 197 |
| | 5 | 121 | 102 | 175 | 131 | 46 | 264 | 86 | 122 |
| | 16 | 109 | 328 | 132 | 220 | 266 | 346 | 96 | 215 |
| | 20 | 131 | 213 | 283 | 50 | 9 | 143 | 42 | 65 |
| | 21 | 171 | 97 | 103 | 106 | 18 | 109 | 199 | 216 |
| | 43 | 0 | 0 | 0 | 0 | 0 | 0 | 0 | 0 |
| 22 | 0 | 64 | 30 | 177 | 53 | 72 | 280 | 44 | 25 |
| | 12 | 142 | 11 | 20 | 0 | 189 | 157 | 58 | 47 |
| | 13 | 188 | 233 | 55 | 3 | 72 | 236 | 130 | 126 |
| | 17 | 158 | 22 | 316 | 148 | 257 | 113 | 131 | 178 |
| | 44 | 0 | 0 | 0 | 0 | 0 | 0 | 0 | 0 |
| 23 | 1 | 156 | 24 | 249 | 88 | 180 | 18 | 45 | 185 |
| | 2 | 147 | 89 | 50 | 203 | 0 | 6 | 18 | 127 |
| | 10 | 170 | 61 | 133 | 168 | 0 | 181 | 132 | 117 |
| | 18 | 153 | 27 | 105 | 122 | 165 | 304 | 100 | 199 |
| | 45 | 0 | 0 | 0 | 0 | 0 | 0 | 0 | 0 |
| 24 | 0 | 880 | 298 | 609 | 49 | 236 | 38 | 633 | 272 |
| | 3 | 854 | 542 | 600 | 381 | 199 | 170 | 125 | 898 |
| | 4 | 236 | 619 | 430 | 736 | 0 | 601 | 815 | 2 |
| | 11 | 116 | 723 | 507 | 193 | 166 | 288 | 236 | 156 |
| | 22 | 990 | 618 | 281 | 796 | 0 | 546 | 214 | 298 |
| | 46 | 0 | 0 | 0 | 0 | 0 | 0 | 0 | 0 |
| 25 | 1 | 279 | 456 | 492 | 449 | 493 | 631 | 4 | 747 |
| | 6 | 136 | 401 | 295 | 838 | 288 | 255 | 490 | 621 |
| | 7 | 628 | 383 | 96 | 65 | 288 | 463 | 432 | 731 |
| | 14 | 182 | 696 | 366 | 81 | 471 | 406 | 444 | 661 |
| | 47 | 0 | 0 | 0 | 0 | 0 | 0 | 0 | 0 |
| 26 | 0 | 195 | 455 | 270 | 331 | 288 | 677 | 21 | 163 |
| | 2 | 1011 | 81 | 430 | 624 | 0 | 678 | 766 | 611 |
| | 4 | 215 | 76 | 316 | 660 | 288 | 226 | 816 | 649 |
| | 15 | 573 | 136 | 387 | 127 | 277 | 99 | 821 | 578 |
| | 48 | 0 | 0 | 0 | 0 | 0 | 0 | 0 | 0 |
| 27 | 1 | 793 | 578 | 530 | 880 | 333 | 91 | 98 | 165 |
| | 6 | 104 | 194 | 349 | 813 | 324 | 678 | 556 | 712 |
| | 8 | 706 | 101 | 304 | 174 | 72 | 268 | 646 | 9 |
| | 49 | 0 | 0 | 0 | 0 | 0 | 0 | 0 | 0 |
| 28 | 0 | 128 | 222 | 11 | 146 | 275 | 102 | 4 | 32 |
| | 4 | 165 | 19 | 293 | 153 | 0 | 1 | 1 | 43 |
| | 19 | 181 | 244 | 50 | 217 | 155 | 40 | 40 | 200 |
| | 21 | 63 | 274 | 234 | 114 | 62 | 167 | 93 | 205 |
| | 50 | 0 | 0 | 0 | 0 | 0 | 0 | 0 | 0 |
| 29 | 1 | 854 | 252 | 27 | 598 | 288 | 625 | 508 | 472 |
| | 14 | 748 | 5 | 628 | 235 | 180 | 104 | 136 | 272 |
| | 18 | 84 | 147 | 117 | 53 | 0 | 243 | 106 | 118 |
| | 25 | 774 | 78 | 29 | 68 | 42 | 459 | 6 | 103 |
| | 51 | 0 | 0 | 0 | 0 | 0 | 0 | 0 | 0 |
| 30 | 0 | 472 | 159 | 411 | 34 | 0 | 523 | 418 | 170 |
| | 10 | 329 | 613 | 23 | 354 | 378 | 16 | 504 | 919 |
| | 13 | 888 | 644 | 105 | 434 | 540 | 95 | 528 | 26 |
| | 24 | 9 | 474 | 135 | 123 | 173 | 564 | 644 | 585 |
| | 52 | 0 | 0 | 0 | 0 | 0 | 0 | 0 | 0 |
| 31 | 1 | 863 | 100 | 542 | 623 | 432 | 101 | 4 | 793 |
| | 7 | 689 | 599 | 308 | 721 | 144 | 649 | 49 | 389 |
| | 22 | 940 | 642 | 66 | 401 | 166 | 279 | 749 | 175 |
| | 25 | 317 | 256 | 162 | 576 | 307 | 574 | 194 | 588 |
| | 53 | 0 | 0 | 0 | 0 | 0 | 0 | 0 | 0 |
| 32 | 0 | 477 | 486 | 210 | 192 | 0 | 703 | 214 | 823 |
| | 12 | 624 | 585 | 342 | 209 | 211 | 265 | 542 | 350 |
| | 14 | 455 | 559 | 591 | 282 | 324 | 338 | 687 | 151 |

TABLE 2-continued positions and element values of elements equal to 1 in the base graph of the parity check matrix set P1 (i represents a row index, and j represents a column index)

| $HB_{G1}$ | | $V_{i,j}$ Lifting size sub-set index $i_{LS}$ | | | | | | | |
|---|---|---|---|---|---|---|---|---|---|
| i | j | 0 | 1 | 2 | 3 | 4 | 5 | 6 | 7 |
| | 24 | 889 | 287 | 217 | 478 | 450 | 83 | 436 | 451 |
| | 54 | 0 | 0 | 0 | 0 | 0 | 0 | 0 | 0 |
| 33 | 1 | 258 | 323 | 170 | 562 | 288 | 408 | 634 | 679 |
| | 2 | 187 | 8 | 20 | 49 | 0 | 656 | 30 | 612 |
| | 11 | 297 | 745 | 460 | 161 | 76 | 141 | 214 | 412 |
| | 21 | 211 | 105 | 33 | 137 | 18 | 101 | 92 | 65 |
| | 55 | 0 | 0 | 0 | 0 | 0 | 0 | 0 | 0 |
| 34 | 0 | 383 | 230 | 507 | 754 | 197 | 412 | 4 | 881 |
| | 7 | 935 | 532 | 616 | 186 | 288 | 672 | 777 | 717 |
| | 15 | 420 | 202 | 325 | 68 | 108 | 112 | 613 | 142 |
| | 17 | 420 | 202 | 325 | 68 | 108 | 112 | 613 | 142 |
| | 56 | 0 | 0 | 0 | 0 | 0 | 0 | 0 | 0 |
| 35 | 1 | 673 | 320 | 207 | 416 | 487 | 100 | 628 | 711 |
| | 6 | 965 | 335 | 158 | 845 | 278 | 210 | 253 | 894 |
| | 12 | 207 | 386 | 55 | 250 | 0 | 547 | 376 | 385 |
| | 22 | 103 | 266 | 605 | 411 | 493 | 268 | 809 | 340 |
| | 57 | 0 | 0 | 0 | 0 | 0 | 0 | 0 | 0 |
| 36 | 0 | 549 | 594 | 579 | 222 | 504 | 135 | 214 | 491 |
| | 14 | 617 | 697 | 499 | 157 | 16 | 167 | 408 | 927 |
| | 15 | 819 | 297 | 498 | 448 | 0 | 387 | 177 | 282 |
| | 18 | 120 | 21 | 160 | 6 | 0 | 188 | 43 | 100 |
| | 58 | 0 | 0 | 0 | 0 | 0 | 0 | 0 | 0 |
| 37 | 1 | 198 | 653 | 618 | 753 | 72 | 671 | 706 | 299 |
| | 13 | 732 | 82 | 15 | 195 | 144 | 588 | 626 | 204 |
| | 23 | 634 | 499 | 115 | 362 | 0 | 437 | 759 | 401 |
| | 59 | 0 | 0 | 0 | 0 | 0 | 0 | 0 | 0 |
| 38 | 0 | 167 | 569 | 471 | 123 | 478 | 516 | 507 | 361 |
| | 9 | 407 | 177 | 179 | 762 | 0 | 548 | 688 | 570 |
| | 10 | 413 | 289 | 384 | 745 | 0 | 209 | 198 | 266 |
| | 12 | 931 | 214 | 181 | 10 | 288 | 246 | 100 | 380 |
| | 60 | 0 | 0 | 0 | 0 | 0 | 0 | 0 | 0 |
| 39 | 1 | 685 | 642 | 102 | 236 | 153 | 236 | 420 | 355 |
| | 3 | 651 | 477 | 77 | 525 | 0 | 264 | 28 | 908 |
| | 7 | 149 | 346 | 512 | 273 | 453 | 37 | 109 | 168 |
| | 19 | 0 | 297 | 208 | 114 | 117 | 272 | 188 | 52 |
| | 61 | 0 | 0 | 0 | 0 | 0 | 0 | 0 | 0 |
| 40 | 0 | 157 | 175 | 32 | 67 | 216 | 304 | 10 | 4 |
| | 8 | 137 | 37 | 80 | 45 | 144 | 237 | 84 | 103 |
| | 17 | 149 | 312 | 197 | 96 | 2 | 135 | 12 | 30 |
| | 62 | 0 | 0 | 0 | 0 | 0 | 0 | 0 | 0 |
| 41 | 1 | 423 | 436 | 154 | 471 | 288 | 47 | 2 | 773 |
| | 3 | 173 | 698 | 47 | 215 | 0 | 77 | 699 | 729 |
| | 9 | 395 | 139 | 124 | 732 | 0 | 377 | 142 | 215 |
| | 18 | 151 | 288 | 207 | 167 | 183 | 272 | 128 | 24 |
| | 63 | 0 | 0 | 0 | 0 | 0 | 0 | 0 | 0 |
| 42 | 0 | 405 | 497 | 546 | 562 | 27 | 640 | 787 | 222 |
| | 4 | 413 | 14 | 385 | 315 | 288 | 435 | 634 | 650 |
| | 24 | 393 | 218 | 126 | 750 | 323 | 369 | 370 | 71 |
| | 64 | 0 | 0 | 0 | 0 | 0 | 0 | 0 | 0 |
| 43 | 1 | 151 | 113 | 228 | 206 | 52 | 210 | 1 | 22 |
| | 16 | 163 | 132 | 69 | 22 | 243 | 3 | 163 | 127 |
| | 18 | 173 | 114 | 176 | 134 | 0 | 53 | 99 | 49 |
| | 25 | 139 | 168 | 102 | 161 | 270 | 167 | 98 | 125 |
| | 65 | 0 | 0 | 0 | 0 | 0 | 0 | 0 | 0 |
| 44 | 0 | 395 | 464 | 554 | 756 | 306 | 431 | 4 | 671 |
| | 7 | 669 | 78 | 227 | 452 | 288 | 244 | 214 | 211 |
| | 9 | 931 | 547 | 259 | 457 | 0 | 293 | 350 | 187 |
| | 22 | 173 | 274 | 580 | 12 | 57 | 624 | 211 | 148 |
| | 66 | 0 | 0 | 0 | 0 | 0 | 0 | 0 | 0 |
| 45 | 1 | 149 | 135 | 101 | 184 | 168 | 82 | 805 | 897 |
| | 6 | 151 | 533 | 548 | 793 | 288 | 419 | 45 | 354 |
| | 10 | 423 | 15 | 126 | 701 | 144 | 235 | 569 | 333 |
| | 67 | 0 | 0 | 0 | 0 | 0 | 0 | 0 | 0 |

In an example, the parity check matrix set P1 includes 8 first parity check matrixes as shown in Table 2, that is, indexes are $i_{LS}$ equal to 0 to 7. The $i_{LS}$-th lifting size sub-set of the parity check matrix set P1 corresponds to a set constituted by all the lifting sizes less than or equal to 384 in the $i_{LS}$-th lifting size sub-set in Table 1. The indexes $i_{LS}$ in Table 2 and Table 1 are the same, that is, a lifting size sub-set corresponding to the 0th first parity check matrix is {2, 4, 8, 16, 32, 64, 128, 256}, a lifting size sub-set corresponding to the 1st parity check matrix is {3, 6, 12, 24, 48, 96, 192, 384}, a lifting size sub-set corresponding to the 2nd first parity check matrix is {5, 10, 20, 40, 80, 160, 320}, a lifting size sub-set corresponding to the 3rd first parity check matrix is {7, 14, 28, 56, 112, 224}, a lifting size sub-set corresponding to the 4th first parity check matrix is {9, 18, 36, 72, 144, 288}, a lifting size sub-set corresponding to the 5th first parity check matrix is {11, 22, 44, 88, 176, 352}, a lifting size sub-set corresponding to the 6th first parity check matrix is {13, 26, 52, 104, 208}, and a lifting size sub-set corresponding to the 7th first parity check matrix is {15, 30, 60, 120, 240}. That is, a maximum lifting size supported by the parity check matrix set P1 is Zmax1=384. All the lifting sizes supported by the parity check matrix set P1 constitute a set Zset1={2, 3, 4, 5, 6, 7, 8, 9, 10, 11, 12, 13, 14, 15, 16, 18, 20, 22, 24, 26, 28, 30, 32, 36, 40, 44, 48, 52, 56, 60, 64, 72, 80, 88, 96, 104, 112, 120, 128, 144, 160, 176, 192, 208, 224, 240, 256, 288, 320, 352, 384}.

The parity check matrix set P2 includes a2 second parity check matrixes, and the corresponding lifting size sub-sets include at least one lifting size sub-set in Table 1.

In an example, the parity check matrix set P2 includes a2=8 second parity check matrixes, and lifting size sub-sets corresponding to the 8 second parity check matrixes are 8 lifting size sub-sets shown in Table 1, respectively. The lifting size sub-set supported by the $i_{LS}$-th second parity check matrix of the parity check matrix set P2 corresponds to the $i_{LS}$-th lifting size sub-set shown in Table 1. That is, the correspondence is as follows: a lifting size sub-set corresponding to the 0th second parity check matrix is {2, 4, 8, 16, 32, 64, 128, 256, 512, 1024}, a lifting size sub-set corresponding to the 1st second parity check matrix is {3, 6, 12, 24, 48, 96, 192, 384, 768}, a lifting size sub-set corresponding to the 2nd second parity check matrix is {5, 10, 20, 40, 80, 160, 320, 640}, a lifting size sub-set corresponding to the 3rd second parity check matrix is {7, 14, 28, 56, 112, 224, 448, 896}, a lifting size sub-set corresponding to the 4th second parity check matrix is {9, 18, 36, 72, 144, 288, 576}, a lifting size sub-set corresponding to the 5th second parity check matrix is {11, 22, 44, 88, 176, 352, 704}, a lifting size sub-set corresponding to the 6th second parity check matrix is {13, 26, 52, 104, 208, 416, 832}, and a lifting size sub-set corresponding to the 7th second parity check matrix is {15, 30, 60, 120, 240, 480, 960}. That is, a maximum lifting size supported by the parity check matrix set P2 is Zmax2=1024, which is equal to 4 times of 256 (256 is a maximum lifting size in the ($i_{LS}$=0)th lifting size sub-set supported by the parity check matrix set P1). And a set constituted by the lifting sizes supported by the parity check matrix set P2 is Zset2={2, 3, 4, 5, 6, 7, 8, 9, 10, 11, 12, 13, 14, 15, 16, 18, 20, 22, 24, 26, 28, 30, 32, 36, 40, 44, 48, 52, 56, 60, 64, 72, 80, 88, 96, 104, 112, 120, 128, 144, 160, 176, 192, 208, 224, 240, 256, 288, 320, 352, 384, 416, 448, 480, 512, 576, 640, 704, 768, 832, 896, 960, 1024}, and it can be seen that Zset1 is a sub-set of Zset2.

In this example, the row index sequence and the column index sequence meet the following combination: the row index sequence is a set of non-contiguous ascending integers; and first kb2 elements of the column index sequence are contiguous ascending integers. Since first kb2 elements of the column index sequence are contiguous ascending integers, the variable node updating module (corresponding to updating of a certain column in the parity check matrix) in the LDPC decoder of the parity check matrix set P2 is fully compatible with variable node updating in the LDPC decoder of the parity check matrix set P1; and the row index sequence being a set of non-contiguous ascending integers may ensure the excellent decoding performance of LDPC code.

In an example, first kb2 elements of the column index sequence are a set consisting of all the integers from 0 to (kb2−1), such as {0, 1, 2, . . . , (kb2−2), (kb2−1)}, where kb2 is an integer greater than 1, kb2 is a number of systematic columns of the base graph of the parity check matrix set P2 (the number of systematic columns is equal to a difference between a number of columns of the base graph and a number of rows of the base graph). For example, the row index sequence α is a sub-set of the set [0, 1, 2, 3, 4, 5, 6, 7, 8, 10, 11, 12, 13, 19, 20, 24, 25, 26, 27, 29, 30, 31, 32, 33, 34, 35, 36, 37, 38, 39, 41, 42, 44, 45].

In an example, the row index sequence α=[0, 1, 2, 3, 4, 5, 6, 7, 8, 10, 11, 12, 13, 19, 20, 24, 25, 26, 27, 29, 30, 31, 32, 33, 34, 35, 36, 37, 38, 39, 41, 42, 44, 45]. And the column index sequence β. [0, 1, 2, 3, 4, 5, 6, 7, 8, 9, 10, 11, 12, 13, 14, 15, 22, 23, 24, 25, 26, 27, 28, 29, 30, 32, 33, 34, 35, 41, 42, 46, 47, 48, 49, 51, 52, 53, 54, 55, 56, 57, 58, 59, 60, 61, 63, 64, 66, 67]. That is, the length of the row index sequence α is equal to mb2=34, and the length of the column index sequence β is equal to nb2=50. That is, the base graph of the parity check matrix set P2 determined by the row index sequence α, the column index sequence β and the base graph of the parity check matrix set P1 is a matrix with a size of mb2=34 rows and nb2=50 columns, and a number of systematic columns is kb2=16.

Example 2

In this example, the row index sequence and the column index sequence meet the following combination: the row index sequence is a set of contiguous ascending integers, and first kb2 elements of the column index sequence are a set of non-contiguous ascending integers. Since the row index sequence is a set of contiguous ascending integers, the check node updating module (corresponding to updating of a certain row in the parity check matrix) in the LDPC decoder of the parity check matrix set P2 is fully compatible with check node updating in the LDPC decoder of parity check matrix set P1; and first kb2 elements of the column index sequence being a set of non-contiguous ascending integers may ensure the excellent decoding performance of LDPC code. In this example, positions and element values of elements equal to 1 in the base graph of P1 may be different from those defined in Table 2. Table 2 is only an exemplary illustration. In the case of different index sequences α or β, positions and element values of elements equal to 1 in the base graph of the parity check matrix set P1 may also be different.

In an example, the row index sequence includes mb2 elements, and is a set consisting of 0 to (mb2−1), i.e., {0, 1, 2, . . . , (mb2−2), (mb2−1)}, where mb2 is an integer greater than 1, and mb2 is a number of rows of the base graph of the parity check matrix set P2. The row index sequence α is a sub-set of [0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33]. And first kb2 elements of the column index sequence β are non-contiguous ascending integers, and a set consisting of first kb2 elements of the column index sequence β is a sub-set of [0, 1, 2, 3, 4, 5, 6, 8, 10, 12, 14, 17, 18, 19, 20, 21].

In an example, the row index sequence α=[0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33]; and the column index sequence β=[0, 1, 2, 3, 4, 5, 6, 8, 10, 12, 14, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55]. That is, a length of the row index sequence α is equal to mb=34, and a length of the column index sequence β is equal to nb=50. That is, a base graph of the parity check matrix set P2 determined by the row index sequence α, the column index sequence β and the base graph of the parity check matrix set P1 is a matrix with a size of mb2=34 rows and nb2=50 columns, and kb2=16.

In an example, a set of first kb2 elements of the column index sequence β is a sub-set of [0, 1, 2, 3, 4, 5, 6, 8, 10, 11, 13, 14, 16, 17, 19, 21]. Correspondingly, the parity check matrix set P1 includes at least one of the first parity check matrixes corresponding to index $i_{LS}$ equal to 0 to 7.

In an example, the column index sequence β=[0, 1, 2, 3, 4, 5, 6, 8, 10, 11, 13, 14, 16, 17, 19, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55]. Correspondingly, the parity check matrix set P1 includes 8 first parity check matrixes corresponding to the index $i_{LS}$ equal 0 to 7.

In an example, a set consisting of first kb2 elements of the column index sequence β is a sub-set of [0, 1, 2, 3, 4, 6, 8, 9, 10, 13, 14, 16, 17, 19, 20, 21]. Correspondingly, the parity check matrix set P1 includes at least one of the first parity check matrixes corresponding to index $i_{LS}$ equal 0 to 7.

In an example, the column index sequence β=[0, 1, 2, 3, 4, 6, 8, 9, 10, 13, 14, 16, 17, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55]. Correspondingly, the parity check matrix set P1 includes 8 first parity check matrixes corresponding to index $i_{LS}$ equal to 0 to 7.

In an example, a set consisting of first kb2 elements of the column index sequence β is a sub-set of [0, 1, 2, 3, 4, 6, 7, 8, 9, 11, 13, 16, 17, 18, 19, 21]. Correspondingly, the parity check matrix set P1 includes at least one of the first parity check matrixes corresponding to index $i_{LS}$ equal to 0 to 7.

In an example, the column index sequence β=[0, 1, 2, 3, 4, 6, 7, 8, 9, 11, 13, 16, 17, 18, 19, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55]. Correspondingly, the parity check matrix set P1 includes 8 first parity check matrixes corresponding to index $i_{LS}$ equal to 0 to 7.

Example 3

In this example, the row index sequence and the column index sequence meet the following combination: the row index sequence is a set of non-contiguous ascending integers; and first kb2 elements of the column index sequence are non-contiguous ascending integers. Since the row index sequence is a set of non-contiguous ascending integers and first kb2 elements of the column index sequence are non-contiguous ascending integers, the excellent performance of LDPC decoding may be ensured; moreover, since the base graph of the parity check matrix set P2 is a sub-matrix (i.e., an extracted matrix) of the base graph of the parity-check matrix set P1, the parity check matrix set P2 and the parity-check matrix set P1 are fully compatible on the LDPC decoding hardware, only some switch circuits need to be added, and the switch circuits are used to enable or disable part of the routing circuits and the corresponding variable node updating module or check node updating module circuits. In this example, positions and element values of elements equal to 1 in the base graph of P1 may be different from those defined in Table 2. Table 2 is only an exemplary illustration. In the case of different index sequences α or β, positions and element values of elements equal to 1 in the base graph of P1 may also be different.

In an example, the row index sequence α is a sub-set of [0, 1, 2, 3, 4, 5, 7, 8, 10, 11, 12, 13, 16, 17, 19, 20, 23, 24, 25, 26, 27, 28, 30, 32, 33, 35, 36, 38, 39, 41, 42, 43, 44, 45]. And first kb2 elements of the column index sequence are non-contiguous ascending integers, and a set of first kb2 elements of the column index sequence β is a sub-set of [0, 1, 2, 3, 4, 5, 6, 7, 8, 9, 10, 11, 12, 14, 18, 21]. The parity check matrix set P1 includes at least one of the first parity check matrixes corresponding to index $i_{LS}$ equal to 0 to 7.

For example, the row index sequence α=[0, 1, 2, 3, 4, 5, 7, 8, 10, 11, 12, 13, 16, 17, 19, 20, 23, 24, 25, 26, 27, 28, 30, 32, 33, 35, 36, 38, 39, 41, 42, 43, 44, 45]. The column index sequence β=[0, 1, 2, 3, 4, 5, 6, 7, 8, 9, 10, 11, 12, 14, 18, 21, 22, 23, 24, 25, 26, 27, 29, 30, 32, 33, 34, 35, 38, 39, 41, 42, 45, 46, 47, 48, 49, 50, 52, 54, 55, 57, 58, 60, 61, 63, 64, 65, 66, 67]. That is, a length of the row index sequence α is equal to mb=34, and a length of the column index sequence β is equal to nb=50. That is, a base graph of the parity check matrix set P2 determined by the row index sequence α, the column index sequence β and the base graph of the parity check matrix set P1 is a matrix with a size of mb2=34 rows and nb2=50 columns, and a number of systematic columns is kb2=16. In this example, the parity check matrix set P1 includes 8 first parity check matrixes corresponding to index $i_{LS}$ equal to 0 to 7.

In an example, the row index sequence α is a sub-set of [0, 1, 2, 3, 4, 5, 7, 8, 10, 11, 12, 13, 14, 16, 19, 20, 24, 25, 26, 27, 30, 31, 32, 33, 34, 35, 36, 38, 39, 41, 42, 43, 44, 45]. And first kb2 elements of the column index sequence β are non-contiguous ascending integers, and a set of first kb2 elements of the column index sequence β is a sub-set of [0, 1, 2, 3, 4, 5, 6, 7, 8, 9, 10, 11, 12, 14, 15, 16]. The parity check matrix set P1 includes at least one of the first parity check matrixes corresponding to index $i_{LS}$ equal to 0 to 7.

For example, the row index sequence α=[0, 1, 2, 3, 4, 5, 7, 8, 10, 11, 12, 13, 14, 16, 19, 20, 24, 25, 26, 27, 30, 31, 32, 33, 34, 35, 36, 38, 39, 41, 42, 43, 44, 45]. The column index sequence β=[0, 1, 2, 3, 4, 5, 6, 7, 8, 9, 10, 11, 12, 14, 15, 16, 22, 23, 24, 25, 26, 27, 29, 30, 32, 33, 34, 35, 36, 38, 41, 42, 46, 47, 48, 49, 52, 53, 54, 55, 56, 57, 58, 60, 61, 63, 64, 65, 66, 67]. That is, a length of the row index sequence α is equal to mb=34, and a length of the column index sequence β is equal to nb=50. That is, a base graph of the parity check matrix set P2 determined by the row index sequence α, the column index sequence β and the base graph of the parity check matrix set P1 is a matrix with a size of mb2=34 rows and nb2=50 columns, and a number of systematic columns is kb2=16. In this example, the parity check matrix set P1 includes 8 first parity check matrixes corresponding to index $i_{LS}$ equal to 0 to 7.

Example 4

In this example, the row index sequence and the column index sequence meet the following combination: the row index sequence is a set of contiguous ascending integers, and first kb2 elements of the column index sequence are contiguous ascending integers. Since the row index sequence is a set of contiguous ascending integers, the check node updating module (corresponding to updating of a certain row in the parity check matrix) in the LDPC decoder of the parity check matrix set P2 is fully compatible with check node updating in the LDPC decoder of the parity check matrix set P1. In addition, first kb2 elements of the column index sequence is a set of contiguous ascending integers, so the check node updating module (corresponding to updating of a certain column in the parity check matrix) in the LDPC decoder of the parity check matrix set P2 is fully compatible with check node updating in the LDPC decoder of the parity check matrix set P1. In this example, positions and element values of elements equal to 1 in the base graph of the parity check matrix set P1 may be different from those defined in Table 2. Table 2 is only an exemplary illustration. In the case of different index sequences α or β, positions and element values of elements equal to 1 in the base graph of the parity check matrix set P1 may also be different.

In an example, mb2 elements of the row index sequence constitute a set {0, 1, 2, . . . , (mb2−2), (mb2−1)}, where mb2 is an integer greater than 1. The row index sequence α is a sub-set of a set [0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33]. And the set of first kb2 elements of the column index sequence β is {0, 1, 2, . . . , (kb2−2), (kb2−1)}, where kb2 is an integer greater than 1. A set of first kb2 elements of the column index sequence β is a sub-set of [0, 1, 2, 3, 4, 5, 6, 7, 8, 9, 10, 11, 12, 13, 14, 15]. The parity check matrix set P1 includes at least one of the first parity check matrixes corresponding to index $i_{LS}$ equal to 0 to 7.

For example, the row index sequence is α=[0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33]. And the column index sequence is β=[0, 1, 2, 3, 4, 5, 6, 7, 8, 9, 10, 11, 12, 13, 14, 15, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55]. That is, a length of the row index sequence α is equal to mb=34, and a length of the column index sequence β is equal to nb=50. That is, a base graph of the parity check matrix set P2 determined by the row index sequence α, the column index sequence β and the base graph of the parity check matrix set P1 is a matrix with a size of mb2=34 rows and nb2=50 columns, and a number of systematic columns is kb2=16. In this example, the parity check matrix set P1 includes 8 first parity check matrixes corresponding to index $i_{LS}$ equal to 0 to 7.

Example 5

In this example, the row index sequence meets: elements in the row index sequence are non-ascending integers expect that first M elements in the row index sequence are ascending integers, where M is an integer greater than 1 and less than mb2. Since the elements in the row index sequence are non-ascending integers, in a case where a base graph of the parity check matrix set P2 is taken as a sub-matrix of the base graph of the parity check matrix set P1, the parity check matrix set P2 may have lower error floors and block error rate (BLER) in waterfall region. In this example, positions and element values of elements equal to 1 in the base graph of the parity check matrix set P1 may be different from those defined in Table 2. Table 2 is only an exemplary illustration. In the case of different index sequences α or β, positions and element values of elements equal to 1 in the base graph of P1 may also be different.

In an example, the row index sequence is a sub-set of the set [0, 1, 2, 3, 4, 8, 9, 10, 12, 15, 16, 43, 18, 19, 20, 30, 24, 29, 7, 22, 31, 32, 33, 34, 28, 23, 38, 39, 40, 42, 5, 44, 45, 25]. And a set consisting of first kb2 elements of the column index sequence is a sub-set of [0, 1, 3, 4, 6, 7, 8, 10, 11, 12, 13, 14, 16, 17, 18, 21]. The parity check matrix set P1 includes at least one of the first parity check matrixes corresponding to index $i_{LS}$ equal to 0 to 7.

For example, the row index sequence is α=[0, 1, 2, 3, 4, 8, 9, 10, 12, 15, 16, 43, 18, 19, 20, 30, 24, 29, 7, 22, 31, 32, 33, 34, 28, 23, 38, 39, 40, 42, 5, 44, 45, 25]. And the column index sequence is [0, 1, 3, 4, 6, 7, 8, 10, 11, 12, 13, 14, 16, 17, 18, 21, 22, 23, 24, 25, 26, 30, 31, 32, 34, 37, 38, 65, 40, 41, 42, 52, 46, 51, 29, 44, 53, 54, 55, 56, 50, 45, 60, 61, 62, 64, 27, 66, 67, 47]. That is, a length of the row index sequence α is equal to mb=34, and a length of the column index sequence β is equal to nb=50. That is, a base graph of the parity check matrix set P2 determined by the row index sequence α, the column index sequence β and the base graph of the parity check matrix set P1 is a matrix with a size of mb2=34 rows and nb2=50 columns, and a number of systematic columns is kb2=16.

In this example, the parity check matrix set P1 includes at least one of the parity check matrixes shown in Table 3; or the parity check matrix set P1 includes at least one sub-matrix of the parity check matrixes shown in Table 11, for example, a sub-matrix consisting of the first mb row and the first (mb+16) columns of the parity check matrix shown in Table 11, where mb is an integer greater than 3. mb is equal to 4, 6, 8, 10, or 18. The LDPC encoding is then performed according to the base graph of the parity check matrix set P2 determined according to the row index sequence α, the column index sequence β and the base graph of the parity check matrix set P1.

Table 3 shows positions and element values of elements equal to 1 in the base graph of the parity check matrix set P1, where a position of an element equal to 1 in the parity check matrix set P1 is represented by row index (i) and column index (j), and the position of the element equal to 1 corresponds to a position of an element indicating a cyclical shift of an identity matrix, and defines an element value ($V_{i,j}$) at the position in corresponding parity check matrix, i.e., a number of bits of the cyclical shift. In the base graph of the parity check matrix set P1, a position of a row index or column index not defined in Table 3 corresponds to an element value "0", that is, corresponds to a position indicating the all-zero square matrix. In this example, the parity check matrix set P1 includes at least one parity check matrix in Table 3. The parity check matrix set P2 is determined by the parity check matrix set P1, the row index sequence α and the column index sequence LDPC encoding is performed according to the parity check matrix set P2.

Figure 3:
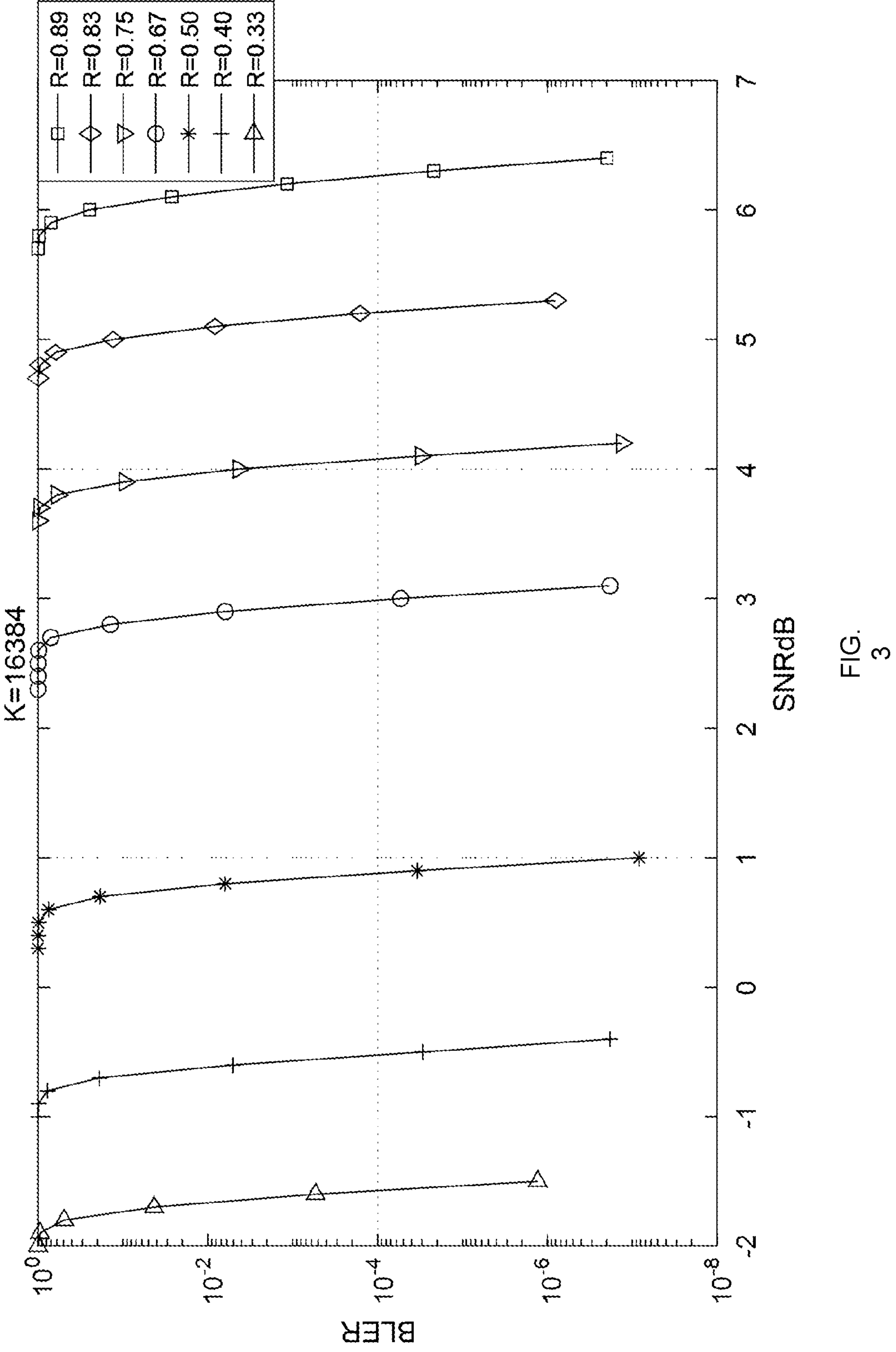
FIG. 3 is a schematic diagram of simulation performance of LDPC encoding based on a target parity check matrix provided by an embodiment.

FIG. 3 is a schematic diagram of simulation performance of LDPC encoding based on a target parity check matrix provided by an embodiment. As shown in FIG. 3, the horizontal coordinate is signal noise ratio (SNR), the unit is dB, and the vertical coordinate is BLER. For the parity check matrix set P2, a corresponding information length is 16384, and a code rate R includes {8/9, 5/6, 3/4, 2/3, 1/2, 2/5, 1/3}, it can be seen that under different code rates, performing LDPC encoding by determining the target parity check matrix from the second parity check matrix set has good performance, and there is no error floor.

TABLE 3 positions and element values of elements equal to 1 in the base graph of the parity check matrix set P1 (i represents a row index, and j represents a column index)

| $HB_G$ | | $V_{i,j}$ Lifting size sub-set index $i_{LS}$ | | | | | | | |
|---|---|---|---|---|---|---|---|---|---|
| i | j | 0 | 1 | 2 | 3 | 4 | 5 | 6 | 7 |
| 0 | 0 | 1018 | 691 | 393 | 223 | 211 | 646 | 624 | 855 |
| | 1 | 325 | 19 | 15 | 464 | 198 | 118 | 208 | 947 |
| | 2 | 226 | 50 | 103 | 94 | 188 | 167 | 0 | 126 |
| | 3 | 927 | 369 | 369 | 763 | 186 | 682 | 624 | 614 |
| | 5 | 100 | 181 | 240 | 74 | 219 | 207 | 0 | 84 |
| | 6 | 778 | 600 | 359 | 234 | 292 | 517 | 208 | 83 |
| | 9 | 59 | 317 | 15 | 0 | 29 | 243 | 0 | 53 |
| | 10 | 997 | 288 | 162 | 429 | 144 | 602 | 416 | 945 |
| | 11 | 622 | 493 | 215 | 440 | 404 | 353 | 624 | 925 |
| | 12 | 191 | 17 | 164 | 21 | 504 | 339 | 0 | 508 |
| | 13 | 777 | 357 | 133 | 887 | 115 | 553 | 0 | 75 |
| | 15 | 195 | 215 | 298 | 14 | 233 | 53 | 0 | 135 |
| | 16 | 23 | 490 | 430 | 742 | 432 | 699 | 624 | 457 |
| | 18 | 446 | 626 | 433 | 141 | 383 | 304 | 0 | 460 |
| | 19 | 35 | 180 | 16 | 198 | 216 | 167 | 0 | 90 |
| | 20 | 239 | 330 | 189 | 104 | 73 | 47 | 0 | 105 |
| | 21 | 799 | 346 | 32 | 753 | 261 | 188 | 624 | 857 |
| | 22 | 1 | 1 | 1 | 1 | 1 | 1 | 0 | 1 |
| | 23 | 0 | 0 | 0 | 0 | 0 | 0 | 0 | 0 |
| 1 | 0 | 258 | 460 | 303 | 813 | 179 | 429 | 230 | 576 |
| | 2 | 239 | 76 | 294 | 45 | 162 | 225 | 11 | 236 |
| | 3 | 629 | 457 | 347 | 599 | 511 | 96 | 124 | 616 |
| | 4 | 124 | 288 | 261 | 270 | 256 | 338 | 624 | 941 |
| | 5 | 71 | 144 | 161 | 119 | 160 | 268 | 10 | 128 |
| | 7 | 222 | 715 | 133 | 157 | 76 | 112 | 0 | 812 |
| | 8 | 872 | 715 | 324 | 581 | 202 | 654 | 416 | 892 |
| | 9 | 173 | 178 | 80 | 87 | 117 | 50 | 2 | 56 |
| | 11 | 988 | 679 | 449 | 654 | 397 | 167 | 640 | 251 |
| | 12 | 614 | 342 | 300 | 765 | 303 | 253 | 268 | 669 |
| | 14 | 621 | 217 | 76 | 303 | 72 | 686 | 416 | 95 |
| | 15 | 132 | 99 | 266 | 9 | 152 | 242 | 6 | 85 |
| | 16 | 398 | 738 | 392 | 790 | 446 | 609 | 238 | 153 |
| | 17 | 667 | 114 | 83 | 642 | 435 | 485 | 208 | 327 |
| | 19 | 255 | 331 | 260 | 31 | 156 | 9 | 168 | 163 |
| | 21 | 284 | 112 | 301 | 635 | 119 | 302 | 31 | 696 |
| | 22 | 0 | 0 | 0 | 0 | 0 | 0 | 105 | 0 |
| | 23 | 0 | 0 | 0 | 0 | 0 | 0 | 0 | 0 |
| | 24 | 0 | 0 | 0 | 0 | 0 | 0 | 0 | 0 |
| 2 | 0 | 874 | 205 | 388 | 431 | 258 | 226 | 132 | 669 |
| | 1 | 111 | 634 | 327 | 427 | 455 | 387 | 453 | 244 |
| | 2 | 185 | 328 | 80 | 31 | 220 | 213 | 21 | 225 |
| | 4 | 63 | 332 | 600 | 400 | 133 | 302 | 596 | 871 |
| | 5 | 117 | 256 | 38 | 180 | 243 | 111 | 4 | 236 |
| | 6 | 93 | 161 | 227 | 410 | 490 | 617 | 357 | 837 |
| | 7 | 229 | 651 | 522 | 767 | 506 | 480 | 48 | 419 |
| | 8 | 433 | 544 | 200 | 377 | 351 | 589 | 454 | 812 |
| | 9 | 95 | 63 | 71 | 177 | 0 | 294 | 122 | 24 |
| | 10 | 39 | 129 | 106 | 518 | 3 | 479 | 195 | 68 |
| | 13 | 654 | 200 | 295 | 525 | 362 | 110 | 571 | 6 |
| | 14 | 481 | 88 | 603 | 886 | 229 | 638 | 652 | 821 |
| | 15 | 225 | 53 | 301 | 77 | 0 | 125 | 85 | 33 |
| | 17 | 757 | 131 | 184 | 198 | 216 | 483 | 47 | 336 |
| | 18 | 973 | 624 | 246 | 117 | 269 | 163 | 803 | 845 |
| | 19 | 251 | 205 | 230 | 223 | 200 | 210 | 42 | 67 |
| | 20 | 117 | 13 | 276 | 90 | 234 | 7 | 66 | 230 |
| | 24 | 0 | 0 | 0 | 0 | 0 | 0 | 0 | 0 |
| | 25 | 0 | 0 | 0 | 0 | 0 | 0 | 0 | 0 |
| 3 | 0 | 121 | 276 | 220 | 425 | 187 | 97 | 212 | 128 |
| | 1 | 89 | 471 | 208 | 690 | 433 | 446 | 6 | 503 |
| | 3 | 340 | 0 | 350 | 613 | 454 | 401 | 33 | 402 |
| | 4 | 20 | 659 | 197 | 5 | 396 | 279 | 737 | 220 |
| | 6 | 406 | 199 | 381 | 493 | 370 | 491 | 673 | 283 |
| | 7 | 643 | 153 | 175 | 590 | 420 | 166 | 645 | 426 |
| | 8 | 755 | 440 | 399 | 688 | 485 | 443 | 6 | 336 |
| | 10 | 904 | 516 | 601 | 706 | 329 | 458 | 775 | 1 |
| | 11 | 86 | 305 | 303 | 827 | 450 | 598 | 707 | 216 |
| | 12 | 502 | 231 | 573 | 437 | 345 | 345 | 778 | 742 |
| | 13 | 987 | 725 | 164 | 371 | 324 | 269 | 711 | 504 |
| | 14 | 723 | 596 | 373 | 69 | 403 | 185 | 421 | 407 |
| | 16 | 752 | 304 | 44 | 320 | 530 | 249 | 716 | 680 |
| | 17 | 844 | 300 | 348 | 746 | 165 | 567 | 173 | 752 |

TABLE 3-continued positions and element values of elements equal to 1 in the base graph of the parity check matrix set P1 (i represents a row index, and j represents a column index)

| $HB_G$ | | $V_{i,j}$ Lifting size sub-set index $i_{LS}$ | | | | | | | |
|---|---|---|---|---|---|---|---|---|---|
| i | j | 0 | 1 | 2 | 3 | 4 | 5 | 6 | 7 |
| | 18 | 500 | 271 | 77 | 99 | 0 | 495 | 744 | 955 |
| | 20 | 144 | 39 | 319 | 30 | 113 | 121 | 2 | 172 |
| | 21 | 780 | 741 | 388 | 830 | 396 | 473 | 142 | 939 |
| | 22 | 1 | 1 | 1 | 1 | 1 | 1 | 0 | 1 |
| | 25 | 0 | 0 | 0 | 0 | 0 | 0 | 0 | 0 |
| 4 | 0 | 413 | 332 | 233 | 394 | 246 | 394 | 232 | 304 |
| | 1 | 870 | 181 | 525 | 234 | 523 | 608 | 204 | 211 |
| | 26 | 0 | 0 | 0 | 0 | 0 | 0 | 0 | 0 |
| 5 | 0 | 461 | 195 | 83 | 612 | 261 | 219 | 185 | 482 |
| | 1 | 748 | 398 | 292 | 731 | 469 | 130 | 724 | 891 |
| | 3 | 450 | 115 | 50 | 758 | 72 | 603 | 24 | 47 |
| | 12 | 743 | 550 | 318 | 752 | 283 | 674 | 689 | 863 |
| | 16 | 284 | 241 | 521 | 182 | 542 | 647 | 831 | 210 |
| | 21 | 891 | 435 | 267 | 578 | 367 | 258 | 161 | 900 |
| | 22 | 883 | 541 | 279 | 153 | 144 | 283 | 280 | 180 |
| | 27 | 0 | 0 | 0 | 0 | 0 | 0 | 0 | 0 |
| 6 | 0 | 183 | 278 | 289 | 158 | 80 | 294 | 6 | 199 |
| | 6 | 22 | 257 | 21 | 119 | 144 | 73 | 27 | 22 |
| | 10 | 28 | 1 | 293 | 113 | 169 | 330 | 163 | 23 |
| | 11 | 67 | 351 | 13 | 21 | 90 | 99 | 50 | 100 |
| | 13 | 244 | 92 | 232 | 63 | 59 | 172 | 48 | 92 |
| | 17 | 11 | 253 | 302 | 51 | 177 | 150 | 24 | 207 |
| | 18 | 157 | 18 | 138 | 136 | 151 | 284 | 38 | 52 |
| | 20 | 211 | 225 | 235 | 116 | 108 | 305 | 91 | 13 |
| | 28 | 0 | 0 | 0 | 0 | 0 | 0 | 0 | 0 |
| 7 | 0 | 476 | 9 | 12 | 689 | 169 | 3 | 769 | 77 |
| | 1 | 812 | 446 | 408 | 748 | 189 | 455 | 296 | 626 |
| | 4 | 671 | 316 | 527 | 104 | 154 | 224 | 736 | 929 |
| | 7 | 31 | 333 | 50 | 548 | 472 | 649 | 569 | 752 |
| | 8 | 423 | 671 | 25 | 822 | 392 | 567 | 783 | 406 |
| | 14 | 616 | 498 | 76 | 382 | 452 | 39 | 284 | 738 |
| | 29 | 0 | 0 | 0 | 0 | 0 | 0 | 0 | 0 |
| 8 | 0 | 880 | 691 | 615 | 33 | 54 | 348 | 380 | 421 |
| | 1 | 516 | 563 | 453 | 767 | 0 | 427 | 2 | 825 |
| | 3 | 775 | 165 | 130 | 676 | 252 | 374 | 547 | 621 |
| | 12 | 211 | 18 | 551 | 441 | 41 | 664 | 557 | 703 |
| | 16 | 102 | 39 | 296 | 428 | 386 | 576 | 720 | 657 |
| | 19 | 164 | 224 | 110 | 39 | 46 | 17 | 99 | 145 |
| | 21 | 365 | 752 | 269 | 282 | 303 | 411 | 309 | 919 |
| | 22 | 241 | 67 | 565 | 716 | 518 | 666 | 659 | 633 |
| | 24 | 602 | 554 | 474 | 201 | 342 | 244 | 532 | 38 |
| | 30 | 0 | 0 | 0 | 0 | 0 | 0 | 0 | 0 |
| 9 | 0 | 359 | 360 | 500 | 681 | 450 | 508 | 422 | 409 |
| | 1 | 182 | 616 | 244 | 37 | 159 | 440 | 218 | 492 |
| | 10 | 365 | 705 | 356 | 213 | 93 | 645 | 353 | 686 |
| | 11 | 277 | 133 | 286 | 553 | 422 | 111 | 261 | 941 |
| | 13 | 910 | 57 | 151 | 313 | 45 | 444 | 409 | 737 |
| | 17 | 526 | 687 | 267 | 409 | 420 | 152 | 4 | 212 |
| | 18 | 61 | 447 | 455 | 781 | 76 | 23 | 580 | 332 |
| | 20 | 216 | 82 | 209 | 218 | 209 | 337 | 173 | 205 |
| | 31 | 0 | 0 | 0 | 0 | 0 | 0 | 0 | 0 |
| 10 | 1 | 866 | 101 | 14 | 306 | 178 | 527 | 750 | 596 |
| | 2 | 149 | 339 | 80 | 165 | 1 | 253 | 77 | 151 |
| | 4 | 935 | 658 | 531 | 846 | 28 | 27 | 156 | 790 |
| | 7 | 928 | 495 | 75 | 691 | 555 | 231 | 224 | 230 |
| | 8 | 561 | 383 | 161 | 866 | 234 | 401 | 12 | 595 |
| | 14 | 826 | 354 | 631 | 551 | 201 | 267 | 694 | 564 |
| | 32 | 0 | 0 | 0 | 0 | 0 | 0 | 0 | 0 |
| 11 | 0 | 77 | 48 | 16 | 52 | 55 | 25 | 184 | 45 |
| | 1 | 41 | 102 | 147 | 11 | 23 | 322 | 194 | 115 |
| | 12 | 83 | 8 | 290 | 2 | 274 | 200 | 123 | 134 |
| | 16 | 182 | 47 | 289 | 35 | 181 | 351 | 16 | 1 |
| | 21 | 78 | 188 | 177 | 32 | 273 | 166 | 104 | 152 |
| | 22 | 252 | 334 | 43 | 84 | 39 | 338 | 109 | 165 |
| | 23 | 22 | 115 | 280 | 201 | 26 | 192 | 124 | 107 |
| | 33 | 0 | 0 | 0 | 0 | 0 | 0 | 0 | 0 |
| 12 | 0 | 160 | 77 | 549 | 366 | 225 | 475 | 630 | 426 |
| | 1 | 42 | 570 | 555 | 847 | 162 | 569 | 20 | 695 |
| | 10 | 789 | 174 | 169 | 808 | 532 | 494 | 619 | 124 |
| | 11 | 32 | 232 | 368 | 675 | 151 | 110 | 777 | 420 |
| | 13 | 234 | 434 | 105 | 28 | 526 | 528 | 728 | 98 |

TABLE 3-continued positions and element values of elements equal to 1 in the base graph of the parity check matrix set P1 (i represents a row index, and j represents a column index)

| $HB_G$ | | $V_{i,j}$ Lifting size sub-set index $i_{LS}$ | | | | | | | |
|---|---|---|---|---|---|---|---|---|---|
| i | j | 0 | 1 | 2 | 3 | 4 | 5 | 6 | 7 |
| | 18 | 263 | 74 | 52 | 854 | 243 | 76 | 831 | 320 |
| | 34 | 0 | 0 | 0 | 0 | 0 | 0 | 0 | 0 |
| 13 | 0 | 177 | 313 | 39 | 81 | 231 | 311 | 52 | 220 |
| | 3 | 248 | 177 | 302 | 56 | 0 | 251 | 147 | 185 |
| | 7 | 151 | 266 | 303 | 72 | 216 | 265 | 1 | 154 |
| | 20 | 185 | 115 | 160 | 217 | 47 | 94 | 16 | 178 |
| | 23 | 62 | 370 | 37 | 78 | 36 | 81 | 46 | 150 |
| | 35 | 0 | 0 | 0 | 0 | 0 | 0 | 0 | 0 |
| 14 | 0 | 206 | 142 | 78 | 14 | 0 | 22 | 1 | 124 |
| | 12 | 55 | 248 | 299 | 175 | 186 | 322 | 202 | 144 |
| | 15 | 206 | 137 | 54 | 211 | 253 | 277 | 118 | 182 |
| | 16 | 127 | 89 | 61 | 191 | 16 | 156 | 130 | 95 |
| | 17 | 16 | 347 | 179 | 51 | 0 | 66 | 1 | 72 |
| | 21 | 229 | 12 | 258 | 43 | 79 | 78 | 2 | 76 |
| | 36 | 0 | 0 | 0 | 0 | 0 | 0 | 0 | 0 |
| 15 | 0 | 552 | 241 | 229 | 314 | 170 | 176 | 589 | 759 |
| | 1 | 96 | 2 | 610 | 568 | 0 | 348 | 422 | 858 |
| | 10 | 321 | 594 | 60 | 355 | 471 | 15 | 589 | 700 |
| | 13 | 575 | 702 | 130 | 209 | 108 | 433 | 806 | 413 |
| | 18 | 587 | 55 | 784 | 433 | 356 | 176 | 261 | 622 |
| | 25 | 691 | 269 | 371 | 81 | 352 | 465 | 670 | 289 |
| | 37 | 0 | 0 | 0 | 0 | 0 | 0 | 0 | 0 |
| 16 | 1 | 320 | 397 | 389 | 378 | 270 | 190 | 296 | 78 |
| | 3 | 49 | 338 | 460 | 612 | 13 | 293 | 198 | 392 |
| | 11 | 561 | 441 | 45 | 43 | 387 | 684 | 160 | 804 |
| | 20 | 51 | 289 | 115 | 189 | 54 | 331 | 122 | 5 |
| | 22 | 410 | 441 | 300 | 773 | 288 | 466 | 182 | 445 |
| | 38 | 0 | 0 | 0 | 0 | 0 | 0 | 0 | 0 |
| 17 | 0 | 7 | 260 | 257 | 56 | 153 | 110 | 91 | 183 |
| | 14 | 164 | 303 | 147 | 110 | 137 | 228 | 184 | 112 |
| | 16 | 59 | 81 | 128 | 200 | 0 | 247 | 30 | 106 |
| | 17 | 1 | 358 | 51 | 63 | 0 | 116 | 3 | 219 |
| | 21 | 144 | 375 | 228 | 4 | 162 | 190 | 155 | 129 |
| | 39 | 0 | 0 | 0 | 0 | 0 | 0 | 0 | 0 |
| 18 | 1 | 42 | 130 | 580 | 199 | 161 | 399 | 625 | 183 |
| | 12 | 233 | 547 | 294 | 334 | 151 | 638 | 665 | 455 |
| | 13 | 776 | 280 | 291 | 648 | 0 | 246 | 791 | 900 |
| | 18 | 923 | 516 | 141 | 367 | 241 | 181 | 276 | 623 |
| | 19 | 147 | 4 | 295 | 186 | 144 | 73 | 148 | 14 |
| | 40 | 0 | 0 | 0 | 0 | 0 | 0 | 0 | 0 |
| 19 | 0 | 828 | 145 | 64 | 8 | 0 | 439 | 12 | 419 |
| | 1 | 585 | 597 | 501 | 6 | 288 | 110 | 214 | 108 |
| | 7 | 584 | 344 | 421 | 327 | 406 | 499 | 374 | 879 |
| | 8 | 127 | 242 | 270 | 198 | 432 | 258 | 600 | 138 |
| | 10 | 736 | 581 | 41 | 456 | 0 | 204 | 815 | 196 |
| | 41 | 0 | 0 | 0 | 0 | 0 | 0 | 0 | 0 |
| 20 | 0 | 407 | 571 | 301 | 777 | 265 | 89 | 214 | 557 |
| | 3 | 698 | 206 | 162 | 882 | 369 | 417 | 220 | 667 |
| | 9 | 217 | 264 | 40 | 121 | 90 | 155 | 15 | 203 |
| | 11 | 559 | 341 | 450 | 438 | 432 | 244 | 213 | 647 |
| | 22 | 160 | 443 | 330 | 183 | 516 | 30 | 30 | 130 |
| | 42 | 0 | 0 | 0 | 0 | 0 | 0 | 0 | 0 |
| 21 | 1 | 249 | 205 | 79 | 192 | 64 | 162 | 6 | 197 |
| | 5 | 121 | 102 | 175 | 131 | 46 | 264 | 86 | 122 |
| | 16 | 109 | 328 | 132 | 220 | 266 | 346 | 96 | 215 |
| | 20 | 131 | 213 | 283 | 50 | 9 | 143 | 42 | 65 |
| | 21 | 171 | 97 | 103 | 106 | 18 | 109 | 199 | 216 |
| | 43 | 0 | 0 | 0 | 0 | 0 | 0 | 0 | 0 |
| 22 | 0 | 64 | 30 | 497 | 501 | 72 | 280 | 44 | 745 |
| | 12 | 142 | 395 | 20 | 0 | 477 | 509 | 474 | 527 |
| | 13 | 956 | 233 | 375 | 3 | 72 | 588 | 338 | 846 |
| | 17 | 158 | 406 | 636 | 148 | 257 | 465 | 547 | 178 |
| | 44 | 0 | 0 | 0 | 0 | 0 | 0 | 0 | 0 |
| 23 | 1 | 668 | 408 | 249 | 312 | 180 | 370 | 45 | 185 |
| | 2 | 147 | 89 | 50 | 203 | 0 | 6 | 18 | 127 |
| | 10 | 170 | 445 | 133 | 392 | 0 | 181 | 132 | 357 |
| | 18 | 920 | 411 | 425 | 346 | 165 | 304 | 100 | 439 |
| | 45 | 0 | 0 | 0 | 0 | 0 | 0 | 0 | 0 |
| 24 | 0 | 624 | 682 | 609 | 497 | 524 | 38 | 633 | 272 |
| | 3 | 854 | 542 | 280 | 381 | 199 | 170 | 125 | 898 |
| | 4 | 492 | 235 | 430 | 512 | 288 | 249 | 607 | 722 |

TABLE 3-continued positions and element values of elements equal to 1 in the base graph of the parity check matrix set P1 (i represents a row index, and j represents a column index)

| $HB_G$ | | $V_{i,j}$ Lifting size sub-set index $i_{LS}$ | | | | | | | |
|---|---|---|---|---|---|---|---|---|---|
| i | j | 0 | 1 | 2 | 3 | 4 | 5 | 6 | 7 |
| | 11 | 116 | 723 | 187 | 865 | 266 | 640 | 236 | 156 |
| | 22 | 222 | 618 | 281 | 796 | 288 | 194 | 630 | 778 |
| | 46 | 0 | 0 | 0 | 0 | 0 | 0 | 0 | 0 |
| 25 | 1 | 535 | 72 | 172 | 449 | 493 | 631 | 628 | 507 |
| | 6 | 136 | 401 | 615 | 614 | 288 | 255 | 698 | 621 |
| | 7 | 884 | 797 | 96 | 65 | 288 | 111 | 224 | 11 |
| | 14 | 182 | 696 | 366 | 753 | 471 | 54 | 652 | 661 |
| | 47 | 0 | 0 | 0 | 0 | 0 | 0 | 0 | 0 |
| 26 | 0 | 195 | 71 | 270 | 107 | 0 | 325 | 21 | 163 |
| | 2 | 243 | 81 | 110 | 176 | 0 | 326 | 142 | 131 |
| | 4 | 215 | 76 | 318 | 212 | 0 | 226 | 192 | 169 |
| | 15 | 61 | 136 | 67 | 127 | 277 | 99 | 197 | 98 |
| | 48 | 0 | 0 | 0 | 0 | 0 | 0 | 0 | 0 |
| 27 | 1 | 25 | 194 | 210 | 208 | 45 | 91 | 98 | 165 |
| | 6 | 104 | 194 | 29 | 141 | 36 | 326 | 140 | 232 |
| | 8 | 194 | 101 | 304 | 174 | 72 | 268 | 22 | 9 |
| | 49 | 0 | 0 | 0 | 0 | 0 | 0 | 0 | 0 |
| 28 | 0 | 384 | 606 | 11 | 370 | 275 | 102 | 212 | 32 |
| | 4 | 677 | 19 | 293 | 153 | 288 | 1 | 625 | 523 |
| | 19 | 181 | 244 | 50 | 217 | 155 | 40 | 40 | 200 |
| | 21 | 575 | 274 | 234 | 562 | 62 | 519 | 717 | 685 |
| | 50 | 0 | 0 | 0 | 0 | 0 | 0 | 0 | 0 |
| 29 | 1 | 854 | 636 | 347 | 150 | 0 | 625 | 508 | 472 |
| | 14 | 748 | 5 | 308 | 459 | 180 | 104 | 136 | 272 |
| | 18 | 84 | 147 | 117 | 53 | 288 | 595 | 314 | 598 |
| | 25 | 518 | 78 | 349 | 68 | 42 | 459 | 214 | 583 |
| | 51 | 0 | 0 | 0 | 0 | 0 | 0 | 0 | 0 |
| 30 | 0 | 984 | 159 | 91 | 482 | 288 | 523 | 418 | 170 |
| | 10 | 841 | 229 | 343 | 802 | 90 | 16 | 712 | 919 |
| | 13 | 888 | 260 | 425 | 434 | 540 | 447 | 736 | 506 |
| | 24 | 521 | 474 | 455 | 347 | 461 | 212 | 20 | 105 |
| | 52 | 0 | 0 | 0 | 0 | 0 | 0 | 0 | 0 |
| 31 | 1 | 95 | 484 | 222 | 623 | 144 | 101 | 212 | 793 |
| | 7 | 433 | 215 | 308 | 497 | 432 | 649 | 465 | 869 |
| | 22 | 940 | 258 | 386 | 401 | 166 | 279 | 541 | 175 |
| | 25 | 317 | 256 | 162 | 800 | 19 | 222 | 818 | 828 |
| | 53 | 0 | 0 | 0 | 0 | 0 | 0 | 0 | 0 |
| 32 | 0 | 733 | 102 | 210 | 192 | 288 | 351 | 214 | 823 |
| | 12 | 624 | 585 | 342 | 657 | 499 | 617 | 750 | 830 |
| | 14 | 199 | 559 | 591 | 282 | 36 | 690 | 63 | 631 |
| | 24 | 633 | 287 | 217 | 30 | 450 | 435 | 436 | 931 |
| | 54 | 0 | 0 | 0 | 0 | 0 | 0 | 0 | 0 |
| 33 | 1 | 258 | 323 | 170 | 562 | 0 | 56 | 218 | 199 |
| | 2 | 187 | 8 | 20 | 49 | 0 | 304 | 30 | 132 |
| | 11 | 297 | 361 | 460 | 161 | 76 | 141 | 6 | 892 |
| | 21 | 467 | 105 | 33 | 809 | 306 | 101 | 92 | 545 |
| | 55 | 0 | 0 | 0 | 0 | 0 | 0 | 0 | 0 |
| 34 | 0 | 383 | 614 | 507 | 530 | 485 | 60 | 212 | 881 |
| | 7 | 935 | 148 | 616 | 634 | 288 | 672 | 153 | 717 |
| | 15 | 164 | 202 | 5 | 68 | 108 | 112 | 197 | 142 |
| | 17 | 671 | 696 | 44 | 822 | 288 | 406 | 571 | 900 |
| | 56 | 0 | 0 | 0 | 0 | 0 | 0 | 0 | 0 |
| 35 | 1 | 161 | 320 | 207 | 192 | 199 | 100 | 4 | 231 |
| | 6 | 197 | 335 | 158 | 173 | 278 | 210 | 45 | 174 |
| | 12 | 207 | 2 | 55 | 26 | 0 | 195 | 168 | 145 |
| | 22 | 103 | 266 | 285 | 187 | 205 | 268 | 185 | 100 |
| | 57 | 0 | 0 | 0 | 0 | 0 | 0 | 0 | 0 |
| 36 | 0 | 37 | 210 | 259 | 222 | 216 | 135 | 6 | 11 |
| | 14 | 105 | 313 | 179 | 157 | 16 | 15 | 200 | 207 |
| | 15 | 51 | 297 | 178 | 0 | 0 | 35 | 177 | 42 |
| | 18 | 120 | 297 | 178 | 0 | 0 | 35 | 177 | 42 |
| | 58 | 0 | 0 | 0 | 0 | 0 | 0 | 0 | 0 |
| 37 | 1 | 198 | 269 | 298 | 81 | 72 | 319 | 82 | 59 |
| | 13 | 220 | 82 | 15 | 195 | 144 | 236 | 2 | 204 |
| | 23 | 122 | 115 | 115 | 138 | 0 | 85 | 135 | 161 |
| | 59 | 0 | 0 | 0 | 0 | 0 | 0 | 0 | 0 |
| 38 | 0 | 423 | 185 | 151 | 795 | 478 | 164 | 715 | 601 |
| | 9 | 151 | 177 | 179 | 90 | 0 | 196 | 64 | 90 |
| | 10 | 925 | 673 | 64 | 745 | 288 | 561 | 198 | 26 |
| | 12 | 931 | 214 | 501 | 10 | 0 | 246 | 516 | 620 |
| | 60 | 0 | 0 | 0 | 0 | 0 | 0 | 0 | 0 |

TABLE 3-continued positions and element values of elements equal to 1 in the base graph of the parity check matrix set P1 (i represents a row index, and j represents a column index)

| $HB_G$ | | $V_{i,j}$ Lifting size sub-set index $i_{LS}$ | | | | | | | |
|---|---|---|---|---|---|---|---|---|---|
| i | j | 0 | 1 | 2 | 3 | 4 | 5 | 6 | 7 |
| 39 | 1 | 173 | 642 | 102 | 460 | 153 | 236 | 420 | 835 |
| | 3 | 139 | 93 | 397 | 749 | 288 | 616 | 444 | 908 |
| | 7 | 917 | 346 | 512 | 273 | 165 | 37 | 317 | 168 |
| | 19 | 0 | 297 | 208 | 114 | 117 | 272 | 188 | 52 |
| | 61 | 0 | 0 | 0 | 0 | 0 | 0 | 0 | 0 |
| 40 | 0 | 413 | 175 | 32 | 515 | 216 | 304 | 218 | 484 |
| | 8 | 905 | 37 | 400 | 269 | 144 | 237 | 84 | 343 |
| | 17 | 149 | 696 | 517 | 544 | 290 | 135 | 428 | 510 |
| | 62 | 0 | 0 | 0 | 0 | 0 | 0 | 0 | 0 |
| 41 | 1 | 167 | 52 | 154 | 23 | 0 | 123 | 2 | 53 |
| | 3 | 173 | 314 | 47 | 215 | 0 | 77 | 75 | 189 |
| | 9 | 139 | 139 | 124 | 60 | 0 | 25 | 142 | 215 |
| | 18 | 151 | 288 | 207 | 167 | 183 | 272 | 128 | 24 |
| | 63 | 0 | 0 | 0 | 0 | 0 | 0 | 0 | 0 |
| 42 | 0 | 661 | 497 | 226 | 562 | 315 | 640 | 371 | 222 |
| | 4 | 669 | 398 | 65 | 315 | 0 | 83 | 426 | 890 |
| | 24 | 393 | 602 | 126 | 750 | 35 | 17 | 162 | 311 |
| | 64 | 0 | 0 | 0 | 0 | 0 | 0 | 0 | 0 |
| 43 | 1 | 151 | 113 | 548 | 430 | 52 | 562 | 1 | 742 |
| | 16 | 419 | 516 | 69 | 694 | 243 | 3 | 579 | 127 |
| | 18 | 173 | 114 | 496 | 582 | 288 | 405 | 99 | 529 |
| | 25 | 651 | 552 | 102 | 385 | 558 | 519 | 722 | 605 |
| | 65 | 0 | 0 | 0 | 0 | 0 | 0 | 0 | 0 |
| 44 | 0 | 139 | 464 | 554 | 532 | 306 | 431 | 628 | 671 |
| | 7 | 669 | 78 | 547 | 228 | 288 | 596 | 422 | 211 |
| | 9 | 163 | 163 | 259 | 9 | 0 | 293 | 142 | 187 |
| | 22 | 685 | 658 | 260 | 12 | 57 | 272 | 627 | 868 |
| | 66 | 0 | 0 | 0 | 0 | 0 | 0 | 0 | 0 |
| 45 | 1 | 149 | 519 | 421 | 408 | 456 | 82 | 805 | 177 |
| | 6 | 663 | 149 | 228 | 793 | 288 | 419 | 45 | 834 |
| | 10 | 423 | 15 | 446 | 253 | 432 | 235 | 777 | 333 |
| | 67 | 0 | 0 | 0 | 0 | 0 | 0 | 0 | 0 |

Example 6

In this example, the row index sequence α is a sub-set of or equal to the set [0, 1, 2, 3, 4, 7, 8, 15, 9, 12, 6, 13, 19, 18, 22, 43, 29, 31, 30, 40, 32, 25, 10, 42, 23, 5, 36, 38, 41, 28, 34, 16, 20, 35]; a set of first kb2 elements of the column index sequence β is a sub-set of or equal to the set [0, 1, 3, 4, 7, 8, 10, 11, 12, 13, 14, 16, 17, 18, 19, 21].

Alternatively, the row index sequence α is a sub-set of or equal to the set [0, 1, 2, 3, 4, 7, 8, 15, 6, 12, 9, 25, 22, 29, 10, 30, 11, 36, 34, 32, 18, 31, 19, 43, 45, 17, 26, 44, 35, 42, 28, 38, 33, 13]; a set of first kb2 elements of the column index sequence β is a sub-set of or equal to the set [0, 1, 3, 4, 6, 7, 10, 11, 12, 13, 14, 15, 16, 17, 18, 21].

Alternatively, the row index sequence α is a sub-set of or equal to the set [0, 1, 2, 3, 4, 7, 8, 15, 6, 12, 9, 25, 22, 13, 10, 30, 32, 38, 29, 18, 35, 31, 34, 44, 19, 5, 45, 41, 42, 43, 16, 36, 33, 23]; a set of first kb2 elements of the column index sequence β is a sub-set of or equal to the set [0, 1, 3, 4, 6, 7, 9, 10, 11, 12, 13, 14, 16, 17, 18, 21].

Alternatively, the row index sequence α is a sub-set of or equal to the set [0, 1, 2, 3, 7, 19, 8, 15, 9, 12, 29, 18, 22, 31, 38, 43, 30, 5, 39, 13, 41, 20, 24, 34, 33, 28, 23, 16, 44, 21, 42, 32, 10, 6]; a set of first kb2 elements of the column index sequence β is a sub-set of or equal to the set [0, 1, 3, 6, 7, 10, 11, 12, 13, 14, 16, 17, 18, 19, 20, 21].

Alternatively, the row index sequence α is a sub-set of or equal to the set [0, 1, 2, 3, 4, 7, 8, 15, 9, 12, 19, 6, 10, 22, 18, 5, 30, 45, 34, 16, 31, 29, 24, 40, 20, 23, 41, 35, 44, 33, 38, 43, 42, 32]; a set of first kb2 elements of the column index sequence β is a sub-set of or equal to the set [0, 1, 3, 4, 6, 7, 8, 10, 11, 12, 13, 16, 17, 18, 20, 21].

Alternatively, the row index sequence α is a sub-set of or equal to the set [0, 1, 2, 3, 4, 7, 8, 15, 9, 12, 6, 19, 22, 25, 29, 32, 30, 13, 21, 18, 43, 34, 33, 14, 23, 17, 10, 45, 28, 42, 38, 41, 20, 36]; a set of first kb2 elements of the column index sequence β is a sub-set of or equal to the set [0, 1, 3, 4, 6, 7, 10, 11, 12, 13, 14, 16, 17, 18, 20, 21].

Alternatively, the row index sequence α is a sub-set of or equal to the set [0, 1, 2, 3, 4, 7, 11, 15, 5, 8, 14, 24, 30, 35, 16, 21, 13, 32, 20, 17, 44, 39, 31, 28, 33, 10, 42, 22, 25, 19, 27, 38, 34, 43]; a set of first kb2 elements of the column index sequence β is a sub-set of or equal to the set [0, 1, 3, 4, 7, 8, 9, 10, 11, 12, 13, 14, 16, 18, 20, 21].

Example 7

In this example, a maximum lifting size Zmax2 supported by the parity check matrix set P2 includes one of 416, 448, 480, 512, 576, 640, 704, 768, 832, 896, 960, 1024, 1152, 1280, 1408, 1536, 1664, 1792, 1920 or 2048. Since a maximum lifting size Zmax2 supported by the parity check matrix set P2 is relatively large (for example, greater than 384), the decoder of the parity check matrix set P2 may adopt a greater decoding parallelism. Therefore, decoding speed of the decoder is faster, and a corresponding decoding throughput is higher.

Table 4 shows lifting sizes supported by the parity check matrix set P2 provided in an example. As shown in Table 4, a maximum lifting size supported by the parity check matrix set P2 is 2048.

TABLE 4 lifting sizes supported by the parity check matrix set P2

| Lifting size sub-set index ($i_{LS}$) | Lifting sizes supported by P2 |
|---|---|
| 0 | {2, 4, 8, 16, 32, 64, 128, 256, 512, 1024, 2048} |
| 1 | {3, 6, 12, 24, 48, 96, 192, 384, 768, 1536} |
| 2 | {5, 10, 20, 40, 80, 160, 320, 640, 1280} |
| 3 | {7, 14, 28, 56, 112, 224, 448, 896, 1792} |
| 4 | {9, 18, 36, 72, 144, 288, 576, 1152} |
| 5 | {11, 22, 44, 88, 176, 352, 704, 1408} |
| 6 | {13, 26, 52, 104, 208, 416, 832, 1664} |
| 7 | {15, 30, 60, 120, 240, 480, 960, 1920} |

Table 5 shows lifting sizes supported by the parity check matrix set P2 provided in an example. As shown in Table 5, a maximum lifting size supported by the parity check matrix set P2 is 1920.

TABLE 5 lifting sizes supported by the parity check matrix set P2

| Lifting size sub-set index ($i_{LS}$) | Lifting sizes supported by P2 |
|---|---|
| 0 | {2, 4, 8, 16, 32, 64, 128, 256, 512, 1024} |
| 1 | {3, 6, 12, 24, 48, 96, 192, 384, 768, 1536} |
| 2 | {5, 10, 20, 40, 80, 160, 320, 640, 1280} |
| 3 | {7, 14, 28, 56, 112, 224, 448, 896, 1792} |
| 4 | {9, 18, 36, 72, 144, 288, 576, 1152} |
| 5 | {11, 22, 44, 88, 176, 352, 704, 1408} |
| 6 | {13, 26, 52, 104, 208, 416, 832, 1664} |
| 7 | {15, 30, 60, 120, 240, 480, 960, 1920} |

Table 6 shows lifting sizes supported by the parity check matrix set P2 provided in another example. As shown in Table 6, the maximum lifting size supported by the parity check matrix set P2 is 1664.

TABLE 6 lifting sizes supported by the parity check matrix set P2

| Lifting size sub-set index ($i_{LS}$) | Lifting sizes supported by P2 |
|---|---|
| 0 | {2, 4, 8, 16, 32, 64, 128, 256, 512, 1024} |
| 1 | {3, 6, 12, 24, 48, 96, 192, 384, 768, 1536} |
| 2 | {5, 10, 20, 40, 80, 160, 320, 640, 1280} |
| 3 | {7, 14, 28, 56, 112, 224, 448, 896} |
| 4 | {9, 18, 36, 72, 144, 288, 576, 1152} |
| 5 | {11, 22, 44, 88, 176, 352, 704, 1408} |
| 6 | {13, 26, 52, 104, 208, 416, 832, 1664} |
| 7 | {15, 30, 60, 120, 240, 480, 960} |

Example 8

In this example, a number of systematic columns of the base graph of the parity check matrix set P2 is kb2, where kb2 is equal to 12, 14, 16, 18 or 20, a length of kb2 is equal to a difference between a length of the column index sequence and a length of the row index sequence. The length of the row index sequence is equal to 4, 5, 6, 7, 8, 9, 10, 11, 12, 14, 16, 18, 20, 22, 23, 26, 29, 30, 32, 34, 38 or 42.

In an example, a number of systematic columns of the base graph of the parity check matrix set P2 is kb2=20, and a set consisting of first kb2 elements of the column index sequence β is β0=[0, 1, 2, 3, 4, 5, 6, 7, 8, 9, 10, 11, 12, 13, 14, 15, 16, 17, 18, 19]. A length of the row index sequence is equal to 42, 32, 22, 12, 9, 6 or 5. For example, a length of the row index sequence is equal to 22, and the row index sequence α=[0, 1, 2, 3, 4, 5, 6, 7, 8, 9, 10, 11, 12, 13, 14, 15, 16, 17, 18, 19, 20, 21]; a length of the row index sequence is equal to 12, and the row index sequence α=[0, 1, 2, 3, 4, 5, 6, 7, 8, 9, 10, 11]; a length of the row index sequence is equal to 6, and the row index sequence α=[0, 1, 2, 3, 4, 5]; or a length of the row index sequence is equal to 5, and the row index sequence α=[0, 1, 2, 3, 4]. A maximum information length supported by the parity check matrix set P2 is Kmax2, where Kmax2 is equal to 20480.

In an example, a number of systematic columns of the base graph of the parity check matrix set P2 is kb2=18, and a set consisting of first kb2 elements of the column index sequence β is β0=[0, 1, 2, 3, 4, 5, 6, 7, 8, 9, 10, 11, 12, 13, 14, 15, 16, 17]. A length of the row index sequence is equal to 38, 29, 20, 11, 8, 6 or 5. For example, a length of the row index sequence is equal to 29, and the row index sequence α=[0, 1, 2, 3, 4, 5, 6, 7, 8, 9, 10, 11, 12, 13, 14, 15, 16, 17, 18, 19, 20, 21, 22, 23, 24, 25, 26, 27, 28]; a length of the row index sequence is equal to 11, and the row index sequence α=[0, 1, 2, 3, 4, 5, 6, 7, 8, 9, 10]; or a length of the row index sequence is equal to 5, and the row index sequence α=[0, 1, 2, 3, 4]. A maximum information length supported by the parity check matrix set P2 is Kmax2, where Kmax2 is equal to 18432.

In an example, a number of systematic columns of the base graph of the parity check matrix set P2 is kb2=16, and a set consisting of first kb2 elements of the column index sequence β is 80=[0, 1, 2, 3, 4, 5, 6, 7, 8, 9, 10, 11, 12, 13, 14, 15]. A length of the row index sequence is equal to 34, 26, 18, 10, 8, 6 or 4. For example, a row index sequence includes at least one of 1) a length of the row index sequence is equal to 26, and the row index sequence is α=[0, 1, 2, 3, 4, 5, 6, 7, 8, 9, 10, 11, 12, 13, 14, 15, 16, 17, 18, 19, 20, 21, 22, 23, 24, 25]; 2) a length of the row index sequence is equal to 18, and the row index sequence is α=[0, 1, 2, 3, 4, 5, 6, 7, 8, 9, 10, 11, 12, 13, 14, 15, 16, 17]; 3) a length of the row index sequence is equal to 10, and the row index sequence is α=[0, 1, 2, 3, 4, 5, 6, 7, 8, 9]; 4) a length of the row index sequence is equal to 8, and the row index sequence is α=[0, 1, 2, 3, 4, 5, 6, 7]; 5) the length of the row index sequence is equal to 6, and the row index sequence is α=[0, 1, 2, 3, 4, 5]; 6) a length of the row index sequence is equal to 4, and the row index sequence is α=[0, 1, 2, 3]. A maximum information length supported by the parity check matrix set P2 is Kmax2, where Kmax2 is equal to 16384.

In an example, a number of systematic columns of the base graph of the parity check matrix set P2 is kb2=14, and a set consisting of first kb2 elements of the column index sequence β is 80=[0, 1, 2, 3, 4, 5, 6, 7, 8, 9, 10, 11, 12, 13]. A length of the row index sequence is equal to 30, 23, 16, 9, 7, 5 or 4. For example, the row index sequence includes at least one of 1) a length of the row index sequence is equal to 30, and the row index sequence is α=[0, 1, 2, 3, 4, 5, 6, 7, 8, 9, 10, 11, 12, 13, 14, 15, 16, 17, 18, 19, 20, 21, 22, 23, 24, 25, 26, 27, 28, 29]; 2) a length of the row index sequence is equal to 23, and the row index sequence is α=[0, 1, 2, 3, 4, 5, 6, 7, 8, 9, 10, 11, 12, 13, 14, 15, 16, 17, 18, 19, 20, 21, 22]; 3) a length of the row index sequence is equal to 16, and the row index sequence is α=[0, 1, 2, 3, 4, 5, 6, 7, 8, 9, 10, 11, 12, 13, 14, 15]; 4) a length of the row index sequence is equal to 9, and the row index sequence is α=[0, 1, 2, 3, 4, 5, 6, 7, 8]; 5) a length of the row index sequence is equal to 7, and the row index sequence is α=[0, 1, 2, 3, 4, 5, 6]; 6) a length of the row index sequence is equal to 5, and the row index sequence is α=[0, 1, 2, 3, 4]; 7) a length of the row index sequence is equal to 4, and the row index sequence is α=[0, 1, 2, 3]. A maximum information length supported by the parity check matrix set P2 is Kmax2, where Kmax2 is equal to 14336.

In an example, the column index sequence β is a union of a set β0 and a set obtained by adding 22 to each element in α, that is, {β0, (α+22)}.

Example 9

In this example, a base graph of the parity check matrix set P2 may be determined only according to the row index sequence α and the base graph of the parity check matrix set P1. The process of determining the base graph of the parity check matrix set P2 includes the following two formulas:

$$H'_{BG} = H_{BG1}(\alpha,\ :)$$

$$H_{BG2}{=}H'_{BG}(:,\ [0\sim(kb2-1),\ 22+\alpha])$$

In this example, $H_{BG1}$ is a base graph of the parity check matrix set P1; $H_{BG2}$ is a base graph of the parity check matrix set P2; $H_{BG1}$ (α, :) represents a new matrix constituted by rows with row index a taken out from the matrix $H_{BG1}$; similarly, $H'_{BG}$ (:, x) represents a new matrix constituted by columns with column index x taken out from the matrix $H'_{BG}$. That is, the base graph $H_{BG2}$ of the parity check matrix set P2 is a sub-matrix (or an extracted matrix) of the base graph $H_{BG1}$ of the parity check matrix set P1; where [0−(kb2−1)] represents a set consisting of all the integers from 0 to kb2−1. (22+α) represents a set obtained by adding 22 to each element in the set α. [0~(kb2−1), 22+α] represents a union of a set consisting of all the integers from 0 to (kb2−1) and a set obtained by adding 22 to each element in the set α. The row index sequence α=[0, 1, 2, 3, 4, 5, 6, 7, 8, 10, 11, 12, 13, 19, 20, 24, 25, 26, 27, 29, 30, 31, 32, 33, 34, 35, 36, 37, 38, 39, 41, 42, 44, 45]. It can be seen that the column index sequence β is a set consisting of integers from 0 to (kb2−1), where kb2 is equal to 12, 14, 15, 16, 17, 18, 19, or 20.

Example 10

In this example, the base graph of the parity check matrix set P2 may be determined only according to the column index sequence β and the base graph of the parity check matrix set P1. The process of determining the base graph of the parity check matrix set P2 includes the following two formulas:

$$H'_{BG} = H_{BG1}([0 \sim mb2-1], :)$$

$$H_{BG2} = H'_{BG}(:, \beta)$$

In this example, $H_{BG1}$ is a base graph of the parity check matrix set P1; $H_{BG2}$ is a base graph of the parity check matrix set P2; $H_{BG1}$ (x, :) represents a new matrix constituted by rows with row index x taken out from the matrix $H_{BG1}$; similarly, $H'_{BG}$ (:, x) represents a new matrix constituted by columns with column index x taken out from the matrix $H'_{BG}$. That is, the base graph $H_{BG2}$ of the parity check matrix set P2 is a sub-matrix (or an extracted matrix) of the base graph $H_{BG1}$ of the parity check matrix set P1; where [0~(mb2−1)] represents a set consisting of all the integers greater than or equal to 0 and less than or equal to (mb2−1). The column index sequence is β=[0, 1, 2, 3, 4, 5, 6, 8, 10, 12, 14, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55], and mb2 is equal to 34.

Example 11

In this example, there are G lifting size sub-sets, where indexes of the lifting size sub-sets are 0, 1, . . . , (G−1) respectively, where G is an integer greater than 1, and there is no intersection between any two lifting size sub-sets. The indexes of the lifting size sub-sets supported by the parity check matrix set P1 constitute a set Set1; the indexes of the lifting size sub-sets supported by the parity check matrix set P2 constitute a set Set2. The intersection of Set2 and Set1 is an empty set.

The indexes of the lifting size sub-sets supported by the parity check matrix set P1 is $i_{LS}$=0 to 7, that is, the indexes of all the supported lifting size sub-sets constitute the Set1={0, 1, 2, 3, 4, 5, 6, 7}. The lifting size sub-sets supported by the parity check matrix set P2 include at least one lifting size sub-set with the following characteristics: all the lifting sizes in the lifting size sub-set meet $a \cdot 2^b$, where a is an odd integer greater than 15, and b is a set of non-negative integers.

In an example, a is equal to 17, 19, 21, 23, 25, 27, 29, 31, 33, 35, 37, 39, or 41; b is a set consisting of 0 to B, where B is equal to 2, 3, 4, 5, 6, 7, 8, 9 or 10.

Table 7 shows lifting size sub-sets supported by the parity check matrix set P1 provided in an example. As shown in Table 7, G is equal to 12, that is, there are 12 lifting size sub-sets. The lifting size sub-sets supported by the parity check matrix set P1 include 8 lifting size sub-sets (Set1={0, 1, 2, 3, 4, 5, 6, 7}) corresponding to $i_{LS}$=0 to 7, and the lifting size sub-sets supported by the parity check matrix set P2 include 4 lifting size sub-sets (Set2={8, 9, 10, 11}) corresponding to $i_{LS}$=8 to 11. The intersection of Set2 and Set1 is an empty set.

TABLE 7 lifting size sub-sets supported by the parity check matrix set P1

| Lifting size sub-set index $i_{LS}$ | Lifting sizes |
|---|---|
| 0 | {2, 4, 8, 16, 32, 64, 128, 256} |
| 1 | {3, 6, 12, 24, 48, 96, 192, 384} |
| 2 | {5, 10, 20, 40, 80, 160, 320} |
| 3 | {7, 14, 28, 56, 112, 224} |
| 4 | {9, 18, 36, 72, 144, 288} |
| 5 | {11, 22, 44, 88, 176, 352} |
| 6 | {13, 26, 52, 104, 208} |
| 7 | {15, 30, 60, 120, 240} |
| 8 | {17, 34, 68, 136, 272, 544, 1088} |
| 9 | {19, 38, 76, 152, 304, 608} |
| 10 | {21, 42, 84, 168, 336, 672} |
| 11 | {23, 46, 92, 184, 368, 736} |

Example 12

In this example, there are G lifting size sub-sets, and indexes of the lifting size sub-sets are 0, 1, . . . , (G−1), respectively, where G is an integer greater than 1, and there is no intersection between any two lifting size sub-sets. The indexes of the lifting size sub-sets supported by the parity check matrix set P1 constitute a set Set1, and indexes of the lifting size sub-sets supported by the parity check matrix set P2 constitute a set Set2. Set2 is a sub-set of Set1, and a length of Set2 is less than a length of Set1.

In an example, Set1={0, 1, 2, 3, 4, 5, 6, 7}.

Table 8 shows lifting size sub-sets supported by the parity check matrix set P1 provided in another example. As shown in Table 8, the parity check matrix set P1 supports a set consisting of all the lifting sizes less than or equal to 384, and the corresponding indexes $i_{LS}$ are equal to integers in Set1, that is, equal to 0 to 7. That is, a set of the lifting sizes supported by the parity check matrix set P1 is Zset1={2, 3, 4, 5, 6, 7, 8, 9, 10, 11, 12, 13, 14, 15, 16, 18, 20, 22, 24, 26, 28, 30, 32, 36, 40, 44, 48, 52, 56, 60, 64, 72, 80, 88, 96, 104, 112, 120, 128, 144, 160, 176, 192, 208, 224, 240, 256, 288, 320, 352, 384}.

TABLE 8 lifting size sub-sets supported by the parity check matrix set P1

| Lifting size sub-set index $i_{LS}$ | Lifting sizes |
|---|---|
| 0 | {2, 4, 8, 16, 32, 64, 128, 256, 512, 1024} |
| 1 | {3, 6, 12, 24, 48, 96, 192, 384, 768} |
| 2 | {5, 10, 20, 40, 80, 160, 320, 640} |
| 3 | {7, 14, 28, 56, 112, 224, 448, 896} |
| 4 | {9, 18, 36, 72, 144, 288} |
| 5 | {11, 22, 44, 88, 176, 352} |
| 6 | {13, 26, 52, 104, 208} |
| 7 | {15, 30, 60, 120, 240} |

The indexes $i_{LS}$ of the lifting size sub-sets supported by the parity check matrix set P2 are 0 to 3, that is, Set2={0, 1, 2, 3}. The lifting sizes supported by the parity check matrix set P2 include one of:

1) The parity check matrix set P2 supports all the lifting sizes greater than 384 in the lifting size sub-sets with indexes $i_{LS}$ belonging to Set2={0, 1, 2, 3}, that is, the supported lifting sizes belong to {448, 512, 640, 768, 896, 1024}. That is, a set of all the lifting sizes supported by the parity check matrix set P2 is Zset2={448, 512, 640, 768, 896, 1024}, and there is no intersection between Zset1 and Zset2;

2) The parity check matrix set P2 supports all the lifting sizes in the lifting size sub-sets with indexes $i_{LS}$ belonging to Set2={0, 1, 2, 3}, that is, a set consisting of all lifting sizes supported by the parity check matrix set P2 is Zset2={2, 3, 4, 5, 6, 7, 8, 10, 12, 14, 16, 20, 24, 28, 32, 40, 48, 56, 64, 80, 96, 112, 128, 160, 192, 224, 256, 320, 384, 448, 512, 640, 768, 896, 1024}. That is, an intersection of Zset1 and Zset2 is Zset, which is equal to {2, 3, 4, 5, 6, 7, 8, 10, 12, 14, 16, 20, 24, 28, 32, 40, 48, 56, 64, 80, 96, 112, 128, 160, 192, 224, 256, 320, 384}, a number of elements of Zset (29) is less than a number of elements of Zset1 (51), and a number of elements of Zset (29) is less than a number of the elements of Zset2 (35).

Example 13

In this example, the parity check matrix set P2 includes at least one parity check matrix. The parity check matrix (which is the second parity check matrix) includes k0 up-and-down adjacent pairs $\{h_{i,j}, h_{(i+1)mod\ mb,j}\}$, two elements in an up-and-down adjacent pair are elements indicating cyclical shifts of identity matrixes, and mb is a number of rows of the parity check matrix. The first type of up-and-down adjacent pair refers to an up-and-down adjacent pair ($h_{i,k}$ and $h_{j,k}$) meeting the following relationship: $mod(h_{i,k}-h_{j,k}, 2)\leq 0$, $j=(i+1)$ mod mb; the second type of up-and-down adjacent pair refers to an up-and-down adjacent pair ($h_{i,k}$ and $h_{j,k}$) meeting the following relationship: $mod(h_{i,k}-h_{j,k}, 2)>0$, $j=(i+1)$ mod mb, where k0, k1 and k2 are positive integers, and k1 is greater than 3 times of k2.

In this example, the parity check matrix set P2 includes at least one of the parity check matrixes shown in Table 9; or the parity check matrix set P2 includes at least a sub-matrix of one of the parity check matrixes shown in Table 9, such as, a sub-matrix consisting of the first mb rows and the first (mb+16) columns of a parity check matrix shown in Table 9, where mb is an integer greater than 3. mb is equal to 4, 6, 8, 10, or 18. LDPC encoding is performed based on the parity check matrix set P2.

Table 9 shows positions and element values of elements equal to 1 in the base graph of the parity check matrix set P2, where a position of an element equal to 1 is represented by row index (i) and column index (j), and a position of an element equal to 1 corresponds to a position of an element indicating a cyclical shift of an identity matrix, and defines an element value ($V_{i,j}$) at the position in the corresponding parity check matrix, i.e., a number of bits of the cyclical shift. In the base graph $H_{BG1}$ of the parity check matrix set P2, element values corresponding to positions (i.e., positions not defined in Table 9) of other row indexes or column indexes (that is, corresponding to positions indicating the all-zero square matrix) are "0". There are 8 parity check matrixes in Table 9, where:

the 0th parity check matrix has k0=57 up-and-down adjacent pairs, including k1=51 first type of up-and-down adjacent pairs and k2=6 second type of up-and-down adjacent pairs; the 1st parity check matrix has k0=57 up-and-down adjacent pairs, including k1=50 first type of up-and-down adjacent pairs and k2=7 second type of up-and-down adjacent pairs; the 2nd parity check matrix has k0=57 up-and-down adjacent pairs, including k1=50 first type of up-and-down adjacent pairs and k2=7 second type of up-and-down adjacent pairs; the 3rd parity check matrix has k0=57 up-and-down adjacent pairs, including k1=52 first type of up-and-down adjacent pairs and k2=5 second type of up-and-down adjacent pairs; the 4th parity check matrix has k0=57 up-and-down adjacent pairs, including k1=53 first type of up-and-down adjacent pairs and k2=4 second type of up-and-down adjacent pairs; the 5th parity check matrix has k0=57 up-and-down adjacent pairs, including k1=52 first type of up-and-down adjacent pairs and k2=5 second type of up-and-down adjacent pairs; the 6th parity check matrix has k0=57 up-and-down adjacent pairs, including k1=50 first type of up-and-down adjacent pairs and k2=7 second type of up-and-down adjacent pairs; the 7th parity check matrix has k0=57 up-and-down adjacent pairs, including k1=51 first type of up-and-down adjacent pairs and k2=6 second type of up-and-down adjacent pairs.

In an example, k1 is greater than 5 times of k2.

In this example, the parity check matrix set P2 includes at least one of the second parity check matrixes corresponding to index $i_{LS}$ equal to 0 to 7 as shown in Table 9.

TABLE 9 positions and element values of elements equal to 1 in the base graph of the parity check matrix set P2 (i represents a row index, and j represents a column index)

| $HB_{G2}$ | | $V_{i,j}$ Lifting size sub-set index $i_{LS}$ | | | | | | | |
|---|---|---|---|---|---|---|---|---|---|
| i | j | 0 | 1 | 2 | 3 | 4 | 5 | 6 | 7 |
| 0 | 0 | 541 | 203 | 128 | 614 | 441 | 330 | 263 | 618 |
| | 1 | 635 | 41 | 122 | 402 | 49 | 502 | 596 | 662 |
| | 2 | 914 | 147 | 138 | 54 | 117 | 317 | 520 | 299 |
| | 3 | 312 | 44 | 221 | 207 | 549 | 11 | 68 | 607 |
| | 5 | 382 | 13 | 132 | 790 | 187 | 411 | 17 | 799 |
| | 6 | 566 | 660 | 193 | 699 | 209 | 406 | 257 | 432 |
| | 9 | 199 | 570 | 329 | 573 | 520 | 221 | 396 | 831 |
| | 10 | 635 | 671 | 534 | 894 | 156 | 87 | 721 | 472 |
| | 11 | 963 | 26 | 453 | 394 | 272 | 433 | 643 | 735 |
| | 12 | 298 | 181 | 338 | 203 | 263 | 122 | 166 | 506 |
| | 13 | 889 | 416 | 457 | 257 | 421 | 666 | 29 | 834 |
| | 15 | 932 | 704 | 12 | 60 | 173 | 551 | 743 | 619 |
| | 16 | 0 | 0 | 0 | 0 | 0 | 0 | 0 | 0 |
| | 17 | 0 | 0 | 0 | 0 | 0 | 0 | 0 | 0 |
| 1 | 0 | 123 | 226 | 455 | 304 | 155 | 59 | 824 | 540 |
| | 2 | 780 | 479 | 90 | 462 | 374 | 343 | 292 | 27 |
| | 3 | 181 | 211 | 271 | 310 | 93 | 339 | 418 | 428 |
| | 4 | 321 | 261 | 572 | 195 | 467 | 318 | 767 | 84 |
| | 5 | 770 | 425 | 284 | 372 | 335 | 559 | 293 | 691 |
| | 7 | 844 | 757 | 342 | 57 | 365 | 118 | 97 | 42 |
| | 8 | 708 | 394 | 268 | 707 | 45 | 373 | 229 | 613 |
| | 9 | 629 | 302 | 139 | 621 | 568 | 137 | 622 | 301 |
| | 11 | 415 | 376 | 546 | 858 | 269 | 511 | 777 | 161 |
| | 12 | 694 | 407 | 450 | 512 | 555 | 698 | 753 | 819 |
| | 14 | 943 | 557 | 474 | 406 | 143 | 505 | 22 | 488 |
| | 15 | 102 | 528 | 547 | 792 | 499 | 561 | 535 | 863 |
| | 16 | 1 | 1 | 1 | 1 | 1 | 1 | 1 | 1 |
| | 17 | 0 | 0 | 0 | 0 | 0 | 0 | 0 | 0 |
| | 18 | 0 | 0 | 0 | 0 | 0 | 0 | 0 | 0 |
| 2 | 0 | 543 | 392 | 331 | 416 | 11 | 183 | 774 | 198 |
| | 1 | 850 | 646 | 525 | 853 | 328 | 73 | 226 | 813 |
| | 2 | 516 | 717 | 614 | 318 | 458 | 79 | 352 | 419 |
| | 4 | 629 | 3 | 28 | 55 | 203 | 360 | 639 | 660 |
| | 5 | 838 | 219 | 114 | 461 | 259 | 393 | 155 | 745 |
| | 6 | 968 | 476 | 173 | 429 | 389 | 284 | 697 | 326 |
| | 7 | 986 | 253 | 548 | 849 | 429 | 274 | 139 | 748 |
| | 8 | 460 | 543 | 226 | 223 | 447 | 172 | 448 | 405 |
| | 9 | 611 | 322 | 58 | 453 | 182 | 457 | 751 | 845 |
| | 10 | 377 | 193 | 506 | 698 | 34 | 409 | 31 | 262 |
| | 13 | 105 | 502 | 280 | 365 | 382 | 75 | 696 | 270 |
| | 14 | 990 | 346 | 444 | 161 | 489 | 139 | 316 | 920 |
| | 15 | 65 | 718 | 151 | 142 | 331 | 18 | 777 | 220 |
| | 18 | 0 | 0 | 0 | 0 | 0 | 0 | 0 | 0 |
| | 19 | 0 | 0 | 0 | 0 | 0 | 0 | 0 | 0 |
| 3 | 0 | 859 | 456 | 449 | 212 | 549 | 363 | 86 | 24 |
| | 1 | 884 | 733 | 438 | 17 | 479 | 644 | 710 | 355 |
| | 3 | 550 | 402 | 637 | 813 | 493 | 55 | 308 | 237 |
| | 4 | 483 | 483 | 222 | 409 | 245 | 646 | 715 | 380 |
| | 6 | 872 | 318 | 261 | 83 | 91 | 700 | 489 | 494 |
| | 7 | 1016 | 672 | 588 | 47 | 543 | 58 | 629 | 824 |
| | 8 | 114 | 685 | 230 | 435 | 29 | 132 | 478 | 53 |
| | 10 | 125 | 563 | 264 | 22 | 176 | 299 | 657 | 108 |
| | 11 | 907 | 570 | 51 | 202 | 464 | 463 | 3 | 83 |

TABLE 9-continued positions and element values of elements equal to 1 in the base graph of the parity check matrix set P2 (i represents a row index, and j represents a column index)

| $HB_{G2}$ | | $V_{i,j}$ Lifting size sub-set index $i_{LS}$ | | | | | | | |
|---|---|---|---|---|---|---|---|---|---|
| i | j | 0 | 1 | 2 | 3 | 4 | 5 | 6 | 7 |
| | 12 | 316 | 479 | 224 | 641 | 109 | 490 | 6 | 554 |
| | 13 | 187 | 456 | 71 | 189 | 98 | 497 | 614 | 136 |
| | 14 | 388 | 50 | 470 | 435 | 137 | 649 | 446 | 700 |
| | 16 | 0 | 0 | 0 | 0 | 0 | 0 | 0 | 0 |
| | 19 | 0 | 0 | 0 | 0 | 0 | 0 | 0 | 0 |
| 4 | 0 | 715 | 684 | 557 | 432 | 269 | 249 | 490 | 360 |
| | 1 | 288 | 365 | 490 | 777 | 331 | 320 | 672 | 769 |
| | 20 | 0 | 0 | 0 | 0 | 0 | 0 | 0 | 0 |
| 5 | 0 | 527 | 438 | 77 | 28 | 45 | 655 | 94 | 592 |
| | 1 | 1 | 509 | 188 | 385 | 345 | 62 | 99 | 107 |
| | 3 | 844 | 470 | 221 | 105 | 107 | 419 | 567 | 303 |
| | 12 | 726 | 279 | 246 | 761 | 403 | 586 | 396 | 578 |
| | 16 | 430 | 156 | 238 | 586 | 206 | 442 | 648 | 624 |
| | 21 | 0 | 0 | 0 | 0 | 0 | 0 | 0 | 0 |
| 6 | 0 | 73 | 610 | 357 | 742 | 247 | 77 | 148 | 596 |
| | 6 | 497 | 228 | 447 | 801 | 265 | 246 | 353 | 543 |
| | 10 | 367 | 65 | 568 | 446 | 141 | 359 | 289 | 544 |
| | 11 | 371 | 568 | 372 | 310 | 22 | 528 | 139 | 360 |
| | 13 | 115 | 697 | 273 | 188 | 59 | 588 | 367 | 253 |
| | 22 | 0 | 0 | 0 | 0 | 0 | 0 | 0 | 0 |
| 7 | 0 | 297 | 552 | 389 | 562 | 375 | 639 | 238 | 822 |
| | 1 | 619 | 611 | 498 | 378 | 285 | 634 | 136 | 780 |
| | 4 | 502 | 120 | 609 | 372 | 105 | 142 | 218 | 212 |
| | 7 | 1012 | 278 | 306 | 39 | 490 | 276 | 84 | 763 |
| | 8 | 61 | 210 | 524 | 676 | 62 | 665 | 716 | 603 |
| | 14 | 614 | 317 | 182 | 395 | 440 | 433 | 187 | 676 |
| | 23 | 0 | 0 | 0 | 0 | 0 | 0 | 0 | 0 |
| 8 | 0 | 283 | 610 | 487 | 708 | 45 | 217 | 302 | 270 |
| | 1 | 199 | 375 | 176 | 60 | 461 | 92 | 406 | 396 |
| | 3 | 552 | 266 | 417 | 881 | 405 | 287 | 414 | 29 |
| | 12 | 704 | 744 | 228 | 841 | 23 | 67 | 656 | 496 |
| | 16 | 732 | 172 | 444 | 416 | 528 | 642 | 2 | 310 |
| | 18 | 245 | 502 | 13 | 375 | 317 | 696 | 503 | 782 |
| | 24 | 0 | 0 | 0 | 0 | 0 | 0 | 0 | 0 |
| 9 | 1 | 557 | 477 | 530 | 780 | 109 | 574 | 554 | 334 |
| | 2 | 40 | 509 | 262 | 220 | 529 | 149 | 22 | 677 |
| | 4 | 802 | 501 | 591 | 772 | 347 | 400 | 10 | 546 |
| | 7 | 161 | 35 | 287 | 15 | 4 | 393 | 623 | 518 |
| | 8 | 806 | 510 | 530 | 43 | 481 | 11 | 824 | 0 |
| | 14 | 827 | 395 | 260 | 9 | 22 | 157 | 107 | 711 |
| | 25 | 0 | 0 | 0 | 0 | 0 | 0 | 0 | 0 |
| 10 | 0 | 965 | 145 | 322 | 378 | 545 | 372 | 615 | 80 |
| | 1 | 189 | 431 | 366 | 350 | 513 | 162 | 88 | 808 |
| | 12 | 828 | 697 | 320 | 315 | 399 | 452 | 618 | 926 |
| | 16 | 72 | 380 | 332 | 155 | 352 | 588 | 558 | 579 |
| | 17 | 658 | 720 | 452 | 256 | 466 | 498 | 690 | 642 |
| | 26 | 0 | 0 | 0 | 0 | 0 | 0 | 0 | 0 |
| 11 | 0 | 249 | 197 | 520 | 858 | 477 | 468 | 779 | 458 |
| | 1 | 267 | 721 | 324 | 364 | 479 | 538 | 168 | 940 |
| | 10 | 999 | 413 | 348 | 767 | 378 | 439 | 693 | 73 |
| | 11 | 593 | 592 | 531 | 334 | 266 | 1 | 355 | 359 |
| | 13 | 243 | 462 | 599 | 73 | 453 | 456 | 331 | 114 |
| | 27 | 0 | 0 | 0 | 0 | 0 | 0 | 0 | 0 |
| 12 | 0 | 625 | 157 | 550 | 486 | 67 | 386 | 717 | 392 |
| | 3 | 456 | 20 | 217 | 767 | 127 | 293 | 526 | 481 |
| | 7 | 810 | 262 | 30 | 770 | 398 | 485 | 184 | 69 |
| | 17 | 770 | 688 | 248 | 496 | 304 | 260 | 106 | 554 |
| | 28 | 0 | 0 | 0 | 0 | 0 | 0 | 0 | 0 |
| 13 | 0 | 475 | 689 | 200 | 96 | 489 | 178 | 789 | 274 |
| | 1 | 563 | 383 | 482 | 830 | 395 | 354 | 352 | 404 |
| | 7 | 28 | 58 | 204 | 526 | 414 | 7 | 388 | 825 |
| | 8 | 805 | 508 | 460 | 500 | 443 | 118 | 133 | 705 |
| | 10 | 137 | 673 | 146 | 442 | 428 | 13 | 347 | 294 |
| | 29 | 0 | 0 | 0 | 0 | 0 | 0 | 0 | 0 |
| 14 | 0 | 597 | 483 | 218 | 718 | 477 | 616 | 563 | 550 |
| | 3 | 762 | 760 | 199 | 513 | 427 | 401 | 200 | 907 |
| | 9 | 193 | 572 | 29 | 551 | 142 | 335 | 16 | 369 |
| | 11 | 251 | 252 | 239 | 768 | 118 | 121 | 9 | 135 |
| | 16 | 92 | 286 | 280 | 794 | 98 | 492 | 586 | 690 |
| | 30 | 0 | 0 | 0 | 0 | 0 | 0 | 0 | 0 |

TABLE 9-continued positions and element values of elements equal to 1 in the base graph of the parity check matrix set P2 (i represents a row index, and j represents a column index)

| $HB_{G2}$ | | $V_{i,j}$ Lifting size sub-set index $i_{LS}$ | | | | | | | |
|---|---|---|---|---|---|---|---|---|---|
| i | j | 0 | 1 | 2 | 3 | 4 | 5 | 6 | 7 |
| 15 | 0 | 805 | 331 | 76 | 10 | 169 | 660 | 15 | 560 |
| | 3 | 318 | 636 | 321 | 691 | 331 | 451 | 256 | 889 |
| | 4 | 85 | 8 | 2 | 562 | 92 | 305 | 703 | 445 |
| | 11 | 1000 | 544 | 343 | 450 | 98 | 587 | 118 | 727 |
| | 16 | 218 | 390 | 20 | 130 | 332 | 6 | 110 | 326 |
| | 31 | 0 | 0 | 0 | 0 | 0 | 0 | 0 | 0 |
| 16 | 1 | 875 | 347 | 356 | 452 | 85 | 40 | 238 | 526 |
| | 6 | 428 | 114 | 443 | 129 | 229 | 58 | 29 | 192 |
| | 7 | 791 | 315 | 11 | 616 | 120 | 666 | 177 | 410 |
| | 14 | 904 | 248 | 174 | 654 | 239 | 414 | 206 | 380 |
| | 32 | 0 | 0 | 0 | 0 | 0 | 0 | 0 | 0 |
| 17 | 0 | 561 | 27 | 512 | 622 | 353 | 664 | 557 | 706 |
| | 2 | 946 | 89 | 377 | 426 | 359 | 337 | 640 | 581 |
| | 4 | 931 | 553 | 398 | 823 | 48 | 529 | 591 | 25 |
| | 15 | 710 | 422 | 370 | 198 | 299 | 463 | 45 | 409 |
| | 33 | 0 | 0 | 0 | 0 | 0 | 0 | 0 | 0 |
| 18 | 1 | 223 | 455 | 484 | 234 | 285 | 216 | 626 | 902 |
| | 6 | 570 | 638 | 449 | 377 | 317 | 94 | 767 | 388 |
| | 8 | 345 | 492 | 160 | 439 | 353 | 10 | 703 | 192 |
| | 34 | 0 | 0 | 0 | 0 | 0 | 0 | 0 | 0 |
| 19 | 1 | 559 | 163 | 484 | 548 | 513 | 588 | 748 | 522 |
| | 14 | 55 | 571 | 568 | 357 | 7 | 22 | 263 | 329 |
| | 19 | 224 | 100 | 409 | 844 | 339 | 694 | 684 | 22 |
| | 35 | 0 | 0 | 0 | 0 | 0 | 0 | 0 | 0 |
| 20 | 0 | 181 | 421 | 556 | 426 | 191 | 524 | 573 | 796 |
| | 10 | 111 | 225 | 182 | 822 | 342 | 275 | 239 | 768 |
| | 13 | 1015 | 434 | 241 | 511 | 314 | 656 | 215 | 794 |
| | 18 | 394 | 297 | 279 | 107 | 513 | 13 | 191 | 859 |
| | 36 | 0 | 0 | 0 | 0 | 0 | 0 | 0 | 0 |
| 21 | 1 | 967 | 729 | 166 | 714 | 47 | 58 | 280 | 842 |
| | 7 | 881 | 737 | 430 | 51 | 387 | 408 | 141 | 153 |
| | 16 | 1018 | 472 | 228 | 494 | 126 | 88 | 98 | 600 |
| | 19 | 663 | 289 | 226 | 408 | 385 | 84 | 754 | 522 |
| | 37 | 0 | 0 | 0 | 0 | 0 | 0 | 0 | 0 |
| 22 | 0 | 901 | 393 | 566 | 320 | 13 | 518 | 537 | 194 |
| | 12 | 808 | 130 | 384 | 310 | 306 | 224 | 312 | 90 |
| | 14 | 681 | 739 | 432 | 413 | 373 | 319 | 794 | 742 |
| | 18 | 30 | 536 | 297 | 379 | 564 | 124 | 561 | 387 |
| | 38 | 0 | 0 | 0 | 0 | 0 | 0 | 0 | 0 |
| 23 | 1 | 113 | 141 | 2 | 160 | 529 | 630 | 420 | 340 |
| | 2 | 72 | 693 | 636 | 518 | 361 | 15 | 774 | 819 |
| | 11 | 672 | 340 | 221 | 607 | 498 | 671 | 351 | 693 |
| | 39 | 0 | 0 | 0 | 0 | 0 | 0 | 0 | 0 |
| 24 | 0 | 775 | 699 | 202 | 308 | 417 | 516 | 1 | 524 |
| | 7 | 657 | 540 | 142 | 772 | 270 | 248 | 34 | 494 |
| | 15 | 400 | 486 | 448 | 660 | 71 | 555 | 703 | 233 |
| | 40 | 0 | 0 | 0 | 0 | 0 | 0 | 0 | 0 |
| 25 | 1 | 677 | 17 | 622 | 742 | 291 | 538 | 56 | 254 |
| | 6 | 184 | 642 | 253 | 63 | 363 | 284 | 559 | 244 |
| | 12 | 84 | 609 | 356 | 167 | 523 | 524 | 564 | 336 |
| | 16 | 156 | 280 | 532 | 538 | 56 | 368 | 28 | 780 |
| | 41 | 0 | 0 | 0 | 0 | 0 | 0 | 0 | 0 |
| 26 | 0 | 665 | 87 | 492 | 424 | 511 | 344 | 141 | 68 |
| | 14 | 594 | 421 | 173 | 638 | 140 | 538 | 28 | 918 |
| | 15 | 824 | 294 | 610 | 524 | 59 | 181 | 167 | 305 |
| | 42 | 0 | 0 | 0 | 0 | 0 | 0 | 0 | 0 |
| 27 | 1 | 837 | 275 | 174 | 360 | 33 | 0 | 534 | 232 |
| | 13 | 351 | 717 | 631 | 837 | 575 | 462 | 433 | 206 |
| | 17 | 774 | 602 | 488 | 458 | 50 | 606 | 458 | 24 |
| | 43 | 0 | 0 | 0 | 0 | 0 | 0 | 0 | 0 |
| 28 | 0 | 677 | 191 | 336 | 612 | 479 | 24 | 791 | 646 |
| | 9 | 799 | 12 | 341 | 287 | 0 | 173 | 84 | 29 |
| | 10 | 902 | 239 | 142 | 238 | 304 | 81 | 444 | 465 |
| | 12 | 248 | 289 | 620 | 169 | 167 | 660 | 824 | 240 |
| | 44 | 0 | 0 | 0 | 0 | 0 | 0 | 0 | 0 |
| 29 | 1 | 155 | 135 | 394 | 864 | 477 | 654 | 468 | 504 |
| | 3 | 236 | 576 | 483 | 727 | 209 | 505 | 198 | 125 |
| | 7 | 777 | 549 | 280 | 59 | 202 | 665 | 664 | 552 |
| | 45 | 0 | 0 | 0 | 0 | 0 | 0 | 0 | 0 |

TABLE 9-continued positions and element values of elements equal to 1 in the base graph of the parity check matrix set P2 (i represents a row index, and j represents a column index)

| $HB_{G2}$ | | $V_{i,j}$ Lifting size sub-set index $i_{LS}$ | | | | | | | |
|---|---|---|---|---|---|---|---|---|---|
| i | j | 0 | 1 | 2 | 3 | 4 | 5 | 6 | 7 |
| 30 | 1 | 1019 | 663 | 152 | 108 | 75 | 564 | 474 | 696 |
| | 3 | 802 | 80 | 571 | 623 | 41 | 121 | 40 | 300 |
| | 9 | 913 | 258 | 233 | 743 | 296 | 407 | 30 | 199 |
| | 46 | 0 | 0 | 0 | 0 | 0 | 0 | 0 | 0 |
| 31 | 0 | 325 | 327 | 210 | 424 | 171 | 228 | 1 | 662 |
| | 4 | 371 | 89 | 467 | 883 | 330 | 447 | 761 | 408 |
| | 18 | 333 | 675 | 366 | 840 | 361 | 256 | 531 | 755 |
| | 47 | 0 | 0 | 0 | 0 | 0 | 0 | 0 | 0 |
| 32 | 0 | 711 | 307 | 32 | 458 | 353 | 658 | 125 | 660 |
| | 7 | 76 | 688 | 463 | 484 | 553 | 432 | 384 | 261 |
| | 9 | 165 | 452 | 113 | 551 | 364 | 187 | 680 | 443 |
| | 16 | 34 | 32 | 382 | 484 | 44 | 282 | 482 | 574 |
| | 48 | 0 | 0 | 0 | 0 | 0 | 0 | 0 | 0 |
| 33 | 1 | 845 | 117 | 598 | 830 | 539 | 530 | 542 | 224 |
| | 6 | 182 | 316 | 313 | 415 | 243 | 662 | 699 | 796 |
| | 10 | 417 | 117 | 110 | 268 | 114 | 441 | 443 | 609 |
| | 49 | 0 | 0 | 0 | 0 | 0 | 0 | 0 | 0 |

Example 14

In this example, the parity check matrix set P2 includes at least one parity check matrix. The parity check matrix (which is the second parity check matrix) meets: the parity check matrix includes k3 first type of elements indicating cyclical shifts of identity matrixes and k4 second type of elements indicating cyclical shifts of identity matrixes. The first type of element indicating the cyclical shift of the identity matrix meets the following relationship: $\mathrm{mod}(h_{i,j}, 2)\leq 0$, and the second type of elements indicating the cyclical shift of the identity matrix meets the following relationship: $\mathrm{mod}(h_{i,j}, 2)>0$, where $h_{i,j}$ is an element indicating a cyclical shift of an identity matrix and with a horizontal coordinate of i and a column coordinate of j in the parity check matrix. k3 and k4 are both positive integers, and k3 is greater than 3 times of k4.

In this example, positions and element values of elements equal to 1 in the base graph of the parity check matrix set P2 may be different from those defined in Table 9. Table 9 is only an exemplary illustration. In the case of different index sequences $\alpha$ or $\beta$, positions and element values of elements equal to 1 in the base graph of the parity check matrix set P2 may also be different.

Example 15

In this embodiment, the target parity check matrix is determined according to the target base graph $H_{BG}$.

An input information bit sequence (i.e., data to be transmitted) for LDPC encoding is represented as $c_0, c_1, c_2, c_3, \ldots, c_{K-1}$ with a length of K bits. The encoded bit sequence obtained by LDPC encoding is represented as $d_0, d_1, d_2, \ldots, d_{N-1}$ with a length of N bits. The process of performing LDPC encoding on the input information bit sequence includes the following steps.

In step 1, an index $i_{LS}$ of the lifting size sub-set is determined. Each index $i_{LS}$ defines a lifting size sub-set. An index of the lifting size sub-set that contains the target lifting size $Z_c$ is denoted as $i_{LS}$.

In step 2, the $(2\cdot Z_c)$th to $(K-1)$th bits in the input information bit sequence $c_0, c_1, c_2, c_3, \ldots, c_{K-1}$ are stored into the encoded bit sequence $d_0, d_1, d_2, \ldots, d_{N-1}$.

In step 3, $(N+2Z_c-K)$ parity bits are generated, which are $w=[w_0, w_1, w_2, \ldots, w_{N+2Z_c-K-1}]^T$, and $$H\times\begin{bmatrix} c \\ w \end{bmatrix}=0$$

is met, where $c=[c_0, c_1, c_2, c_3, \ldots, c_{K-1}]^T$. 0 in this relationship refers to an all-zero vector, and all LDPC encoding operations are performed in binary Galois fields (GF(2)). The target parity check matrix Hb belongs to the parity check matrix set P2, and correspondingly, the target base graph $H_{BG}$ belongs to the base graph of the parity check matrix set P2.

The process of determining the check matrix includes:

replacing all "0" elements in the target base graph $H_{BG}$ with an all-zero square matrix, a size of the all-zero square matrix being $Z_c$ by $Z_c$; and replacing all "1" elements in the target base graph $H_{BG}$ with a matrix $I(P_{i,j})$ which has been cyclically shifted an identity matrix, the identity matrix being of a size $Z_c$ by $Z_c$, where i and j are the row index and column index of the base graph $H_{BG}$, respectively. $I(P_{i,j})$ represents a matrix obtained by cyclically right shifting an identity matrix with a size $Z_c$ by $Z_c$ by $P_{i,j}$ bits. $P_{i,j}=\mathrm{mod}(V_{i,j}, Z_c)$, where $V_{i,j}$ is an element in the i-th row and j-th column of the $i_{LS}$-th parity check matrix in the parity check matrix set P1. The index $i_{LS}$ is an index of the parity check matrix in the parity check matrix set P1.

In step 4, the generated $(N+2Z_c-K)$ parity bits $w=[w_0, w_1, w_2, \ldots, w_{N+2Z_c-K-1}]^T$ is stored into the encoded bit sequence $d_0, d_1, d_2, d_{N-1}$.

In the standard version Release 15, the parity check matrix set P1 includes 8 first parity check matrixes, and the indexes $i_{LS}$ of the first parity check matrixes are 0 to 7. The $i_{LS}$-th parity check matrix supports the maximum lifting size $Z_{i_{LS}}$. That is, in parity check matrix set P1, the $(i_{LS}=0)$th parity check matrix supports a maximum lifting size $Z_0=256$; the $(i_{LS}=1)$st parity check matrix supports a maximum lifting size $Z_1=384$; the $(i_{LS}=2)$nd parity check matrix supports a maximum lifting size $Z_2=320$; the $(i_{LS}=3)$rd parity check matrix supports a maximum lifting size $Z_3=224$; the $(i_{LS}=4)$th parity check matrix supports a maximum lifting size $Z_4=288$, the $(i_{LS}=5)$th parity check matrix supports a maximum lifting size $Z_5=352$; the $(i_{LS}=6)$th parity check matrix supports a maximum lifting size $Z_6=208$; the $(i_{LS}=7)$th parity check matrix supports a maximum lifting size $Z_7=240$.

In the standard version Release X, there is a parity check matrix set P2. The parity check matrix set P2 includes at least one second parity check matrix as follows: an index corresponding to the second parity check matrix is $i_{LS}$ meeting $\mathrm{mod}(V'_{i,j}-V_{i,j}, Z_{i_{LS}})=0$, where $V_{i,j}$ is an element in the i-th row and j-th column of the $i_{LS}$-th parity check matrix in the parity check matrix set P1 in the standard version Release 15 and $V'_{i,j}$ is an element in the i-th row and the j-th column of the $i_{LS}$-th parity check matrix in the parity check matrix set P2 in the standard version Release X. $V'_{i,j}$ and $V_{i,j}$ are both elements indicating cyclical shifts of identity matrixes and there is at least one pair of $V'_{i,j}$ and $V_{i,j}$ meeting $V'_{i,j}\neq V_{i,j}$, where the index $i_{LS}$ of the second parity check matrix is an integer equal to one of 0 to 7. $Z_{i_{LS}}$ is a maximum lifting size supported by the $i_{LS}$-th parity check matrix in the parity check matrix set P1 of the standard version Release 15.

The dimensions of the base graph of the parity check matrix set P1 in the standard version Release 15 are 46 rows and 68 columns and the indexes $i_{LS}$ of the 8 first parity check matrixes in the parity check matrix set P1 are 0 to 7 (for example, 8 first parity check matrixes shown in Table 10 in Example 20). The parity check matrix set P2 in the standard version Release X includes 8 second parity check matrixes, where the indexes $i_{LS}$ of the second parity check matrixes are 0 to 7.

In this example, positions and element values of elements equal to 1 in the base graph of the parity check matrix set P1 are shown in Table 2, and may also be different from those defined in Table 2; in the case of different index sequences α or β, positions and element values of elements equal to 1 in the base graph of the parity check matrix set P1 may also be different.

In an example, the dimensions of the base graph of the parity check matrix set P1 in the standard version Release 15 are 42 rows and 52 columns and there are 8 first parity check matrixes in the parity check matrix set P1. The indexes $i_{LS}$ of the first parity check matrixes are 0 to 7. The parity check matrix set P2 in the standard version Release X includes 8 second parity check matrixes, and the indexes $i_{LS}$ of the second parity check matrixes are 0 to 7.

Example 16

In this example, in the standard version Release X, there is a parity check matrix set P2, and the base graph of the parity check matrix set P2 is a sub-matrix (an extracted matrix) of the base graph of the parity check matrix set P1 in the standard version Release 15. The parity check matrix set P2 includes at least one second parity check matrix as follows: an index corresponding to the second parity check matrix is $i_{LS}$ meeting mod $(V'_{i,j}-V_{a(i),b(j)}, Z_{i_{LS}})=0$, where $V_{a(i),b(j)}$ is an element in the a(i)-th row and b(j)-th column of the $i_{LS}$-th second parity check matrix in the parity check matrix set P1 in the standard version Release 15 and $V'_{i,j}$ is an element in the i-th row and j-column of the $i_{LS}$-th second parity check in parity check matrix set P2 in the standard version Release X. $V'_{i,j}$ and $V_{a(i),b(j)}$ are both elements indicating cyclical shifts of identity matrixes and there is at least a pair of $V'_{i,j}$ and $V_{a(i),b(j)}$ meeting $V_{i,j}\neq V_{a(i),b(j)}$. The index $i_{LS}$ of the second parity check matrix is one integer in 0 to 7. a is an extracted row index sequence, and a length of a is less than a number of rows of the base graph of the parity check matrix set P1; and b is an extracted column index sequence, and a length of b is less than a number of columns of the base graph of the parity check matrix set P1, where $Z_{i_{LS}}$ is a maximum lifting size supported by the $i_{LS}$-th parity check matrix in the parity check matrix set P1 in the standard version Release 15.

The dimensions of the base graph of the parity check matrix set P1 in the standard version Release 15 are 46 rows and 68 columns. The parity check matrix set P1 includes 8 first parity check matrixes (for example, 8 first parity check matrixes shown in Table 10 in Example 20), and the indexes $i_{LS}$ of the first parity check matrixes are 0 to 7. In the standard version Release X, the parity check matrix set P2 includes 8 second parity check matrixes PCM, and the indexes $i_{LS}$ of the second parity check matrixes are 0 to 7.

In an example, a is a row index sequence α in Example 1 to Example 6, and b is a column index sequence β in Example 1 to Example 6.

In an example, a is {0, 1, 2, 3, 4, 5, 6, 7, 8, 10, 11, 12, 13, 19, 20, 24, 25, 26, 27, 29, 30, 31, 32, 33, 34, 35, 36, 37, 38, 39, 41, 42, 44, 45}, b is {0, 1, 2, 3, 4, 5, 6, 7, 8, 9, 10, 11, 12, 13, 14, 15, 22, 23, 24, 25, 26, 27, 28, 29, 30, 32, 33, 34, 35, 41, 42, 46, 47, 48, 49, 51, 52, 53, 54, 55, 56, 57, 58, 59, 60, 61, 63, 64, 66, 67}. That is, the dimensions of the base graph of the parity check matrix set P2 in the standard version Release X are 34 rows and 50 columns.

Example 17

In this example, the target parity check matrix Hb is firstly determined; and then, low density parity check encoding is performed on data to be transmitted according to the Hb and a target lifting size.

The input information bit sequence (i.e., the data to be transmitted) for LDPC encoding is represented as $c_0, c_1, c_2, c_3, \ldots, c_{K-1}$ with a length of K bits. The encoded bit sequence obtained by LDPC encoding is represented as $d_0, d_1, d_2, \ldots, d_{N-1}$ with a length of N bits. The process includes the following steps.

In step 1, an index $i_{LS}$ of the lifting size sub-set is determined. Each index $i_{LS}$ defines a lifting size sub-set. The index of the lifting size sub-set that contains the lifting size $Z_c$ is $i_{LS}$.

In step 2, the $(2\cdot Z_c)$th to (K−1)th bits of the input information bit sequence $c_0, c_1, c_2, c_3, \ldots, c_{K-1}$ are stored into the encoded bit sequence $d_0, d_1, d_2, \ldots, d_{N-1}$.

In step 3, the parity check matrix of the parity check matrix set P2 is determined according to the row index sequence, the column index sequence and the parity check matrix set P1; and LDPC encoding is performed according to the parity check matrix of the parity check matrix set P2 and the lifting size to obtain the encoded bit sequence. $(N+2Z_c-K)$ parity bits $w=[w_0, w_1, w_2, \ldots, w_{N+2Z_c-K-1}]^T$ are generated, and $$H\times\begin{bmatrix} c \\ w \end{bmatrix}=0$$

is satisfied, where $c=[c_0, c_1, c_2, c_3, \ldots, c_{K-1}]^T$. 0 in this relationship refers to an all-zero vector, and all LDPC encoding operations are performed in binary Galois fields (GF(2)).

The process of determining the check matrix H includes:

replacing all "−1" (or NULL) elements in the parity check matrix with an all-zero square matrix, a size of the all-zero square matrix being $Z_c$ by $Z_c$; replacing all non-"−1" elements in the parity check matrix with a matrix $I(P_{i,j})$ which has been cyclically shifted an identity matrix, a size of the identity matrix being $Z_c$ by $Z_c$, where i and j are a row index and a column index corresponding to a position of the non-"−1" element, respectively.) $I(P_{i,j})$ represents a matrix obtained by cyclically right shifting an identity matrix with a size $Z_c$ by $Z_c$ by $P_{i,j}$ bits. $P_{i,j}=\mathrm{mod}(V_{i,j},Z_c)$, where $V_{i,j}$ is an element in the i-th row and j-th column of the parity check matrix.

In step 4, the generated $(N+2Z_c-K)$ parity bits $w=[w_0, w_1, w_2, \ldots, w_{N+2Z_c-K-1}]^T$ are stored into the encoded bit sequence $d_0, d_1, d_2, \ldots, d_{N-1}$.

In this embodiment, there are a parity check matrix set P2 and a parity check matrix set P1, and the parity check matrix for LDPC encoding comes from the parity check matrix set P2 or the parity check matrix set P1. The parity check matrix set P1 includes a1 parity check matrixes, where a1=8; all the a1 parity check matrixes in the parity check matrix set P1 have the same base graph. A number of rows of the base graph of the parity check matrix set P1 is mb1 and a number of columns of the base graph of the parity check matrix set P1 is nb1, where mb1 and nb1 are 46 and 68, respectively.

The parity check matrix set P2 includes a2 parity check matrixes, where a2=8; all the a2 parity check matrixes in the parity check matrix set P2 have the same base graph. A number of rows of the base graph of the parity check matrix set P2 is mb2 and a number of columns of the base graph of the parity check matrix set P2 is nb2, where mb2 and nb2 are integers both greater than 0.

There are a row index sequence and a column index sequence; where a length of the row index sequence is mb2, and a length of the column index sequence is equal to nb2. In an example, mb2 is a positive integer less than mb1, and nb2 is a positive integer less than nb1.

The parity check matrix of the parity check matrix set P2 is determined according to the row index sequence α, the column index sequence β and the parity check matrix set P1. That is, the parity check matrix for LDPC encoding is determined. The parity check matrix of the parity check matrix set P2 is a sub-matrix consisting of corresponding rows selected successively according to elements in the row index sequence and corresponding columns selected successively according to elements in the column index sequence in the parity check matrix of the parity check matrix set P1.

$$Hb' = Hb1(\alpha, :),$$

$$Hb2 = Hb'(:, \beta);$$

$$\text{or, } Hb' = Hb1(:, \beta),$$

$$Hb2 = Hb'(\alpha, :);$$

$$\text{or, } Hb2 = Hb1(\alpha, \beta).$$

Hb1 is the $i_{LS}$-th parity check matrix of the parity check matrix set P1, and Hb2 is the $i_{LS}$-th parity check matrix of the parity check matrix set P2. In the above encoding process, if the $i_{LS}$-th parity check matrix in the parity check matrix set P2 is adopted for encoding, and $V_{i,j}$ is an element in the i-th row and j-th column of the $i_{LS}$-th parity check matrix.

The row index sequence α is a row index sequence in Example 1 to Example 6, and the column index sequence β is a column index sequence in Example 1 to Example 6; positions and element values of elements equal to 1 in the base graph of P1 are shown in Table 2, and may also be different from those defined in Table 2. In the case of different index sequences α or positions and element values of elements equal to 1 in the base graph of P1 may also be different.

Example 18

In this example, the base graph of the parity check matrix set P2 is firstly determined, and then, the target parity check matrix of the parity check matrix set P2 is determined according to the base graph. The process is as follows.

In step 1, an index i of the lifting size sub-set is determined.

In step 2, the $(2 \cdot Z_c)$th to (K−1)th bits of the input information bit sequence $c_0, c_1, c_2, c_3, \ldots, c_{K-1}$ are stored into an encoded bit sequence $d_0, d_1, d_2, \ldots, d_{N-1}$.

In step 3, the base graph of the parity check matrix set P2 is determined; the parity check matrix is determined according to the base graph of the parity check matrix set P2; and LDPC encoding is performed according to the parity check matrix and the lifting size to obtain the encoded bit sequence. $(N+2Z_c-K)$ parity bits are generated, which are $w=[w_0, w_1, w_2, \ldots, w_{N+2Z_c-K-1}]^T$, and $$H \times \begin{bmatrix} c \\ w \end{bmatrix} = 0$$

is satisfied, where $[c_0, c_1, c_2, c_3, \ldots, c_{K-1}]^T$. 0 in this relationship refers to an all-zero vector, and all LDPC encoding operations are performed in binary Galois fields (GF(2)). The process of determining the matrix H is described as follows.

For the parity check matrix set P1, base graph $H_{BG1}$ thereof includes mb1 rows corresponding to row indexes i=0, 1, 2, . . . , (mb1−1), and nb1 columns corresponding to column indexes j=0, 1, 2, . . . , (nb1−1). For the parity check matrix set P2, base graph $H_{BG2}$ thereof includes mb2 rows corresponding to row indexes i=0, 1, 2, . . . , (mb2−1), and nb2 columns corresponding to column indexes j=0, 1, 2, . . . , (nb2−1). The base graph includes at least two elements, i.e., “0” and “1”.

The base graph of the parity check matrix set P2 is determined by the row index sequence α, the column index sequence β and the base graph of the parity check matrix set P1, as shown in the following formula:

$$H'_{BG} = H_{BG1}(\alpha, :),$$

$$H_{BG2} = H'_{BG}(:, \beta);$$

$$\text{or, } H''_{BG} = H_{BG1}(:, \beta),$$

$$H_{BG2} = H''_{BG}(\alpha, :);$$

$$\text{or, } H_{BG2} = H_{BG1}(\alpha, \beta).$$

$H_{BG1}$ is a base graph of the parity check matrix set P1; $H_{BG2}$ is a base graph of the parity check matrix set P2; $H_{BG1}(\alpha, :)$ represents a new matrix constituted by the rows with the row index a taken out from the matrix $H_{BG1}$; similarly, $H'_{BG}(:, \beta)$ represents a new matrix constituted by all the columns with the column index β taken out from the matrix $H'_{BG}$. That is, the base graph of the parity check matrix set P2 is a sub-matrix consisting of corresponding rows selected successively according to elements in the row index sequence and corresponding columns selected successively according to elements in the column index sequence in the base graph of the parity check matrix set P1.

The parity check matrix Hb of the parity check matrix set P2 is determined according to the base graph of the parity check matrix set P2, as shown in the following 3 processes:

1) replacing all “0” elements in the base graph $H_{BG}$ with “−1” or “NULL”;

2) replacing all “1” elements in the base graph $H_{BG}$ with $V_{i,j}$, where i and j are the row index and column index of the base graph $H_{BG}$, respectively; for the parity check matrix set P2, $V_{i,j}$ is determined by the parity check matrix index $i_{LS}$ for the parity check matrix set P1, $V_{i,j}$, for example, is determined by the parity check matrix index $i_{LS}$ shown in Table 10 in Example 20;

3) obtaining the $i_{LS}$-th parity check matrix Hb upon replacing all the elements in the base graph $H_{BG}$.

The obtainment of the matrix H includes the following 3 processes:

1) replacing all "−1" or "NULL" elements in the parity check matrix Hb with an all-zero square matrix, a size of the all-zero square matrix being $Z_c$ by $Z_c$;

2) replacing all non-"−1" elements in the parity check matrix Hb with a matrix) which has been cyclically shifted an identity matrix, a size of the identity matrix being $Z_c$ by $Z_c$, where i and j are a row index and a column index of the parity check matrix Hb, respectively; $I(P_{i,j})$ represents a matrix obtained by cyclically right shifting an identity matrix with a size $Z_c$ by $Z_c$ by $P_{i,j}$ bits; $P_{i,j}$=mod($V_{i,j}$,$Z_c$), where $V_{i,j}$ is an element in the i-th row and j-th column of the parity check matrix Hb;

3) obtaining the parity check matrix H upon replacing all the elements in the parity check matrix Hb. Then, LDPC encoding may be performed.

Example 19

In this example, a parity check matrix is determined from the parity check matrix set P1 or the parity check matrix set P2, and then LDPC encoding is performed. The process is as follows:

In step 1, an index $i_{LS}$ of the lifting size sub-set is determined.

In step 2: the $(2 \cdot Z_c)$th to (K−1)th bits of an input information bit sequence $c_0, c_1, c_2, c_3, \ldots, c_{K-1}$ are stored into an encoded bit sequence $d_0, d_1, d_2, \ldots, d_{N-1}$.

In step 3, a parity check matrix from the parity check matrix set P1 or the parity check matrix set P2 is determined; LDPC encoding is performed according to the parity check matrix and the lifting size to obtain an encoded bit sequence. $(N+2Z_c-K)$ parity bits are generated, which are $w=[w_0, w_1, w_2, \ldots, w_{N+2Z_c-K-1}]^T$ and $$H \times \begin{bmatrix} c \\ w \end{bmatrix} = 0$$

is satisfied, where $c=[c_0, c_1, c_2, c_3, \ldots, c_{K-1}]^T$. 0 in this relationship refers to an all-zero vector, and all LDPC encoding operations are performed in binary Galois fields (GF(2)). The process of determining the matrix H is described as follows.

For the parity check matrix set P1, base graph $H_{BG}$ thereof includes mb1 rows corresponding to row indexes i=0, 1, 2, . . . , (mb1−1), and nb1 columns corresponding to column indexes j=0, 1, 2, . . . , (nb1−1) For the parity check matrix set P2, base graph $H_{BG}$ thereof includes mb2 rows corresponding to row indexes i=0, 1, 2, . . . , (mb2−1), and nb2 columns corresponding to column indexes j=0, 1, 2, . . . , (nb2−1). The base graph $H_{BG}$ includes at least two elements, "0" and "1".

The check matrix H may be obtained by replacing all the elements in the base graph $H_{BG}$ with either the all-zero matrix or the cyclically shifted identity matrix, where the dimensions of the all-zero square matrix or the identity matrix are both $Z_c$ by $Z_c$.

The process of obtaining the check matrix H includes:

1) All "0" elements in the target base graph $H_{BG}$ are replaced with an all-zero square matrix, where a size of the all-zero square matrix is $Z_c$ by $Z_c$.

2) All "1" elements in the target base graph $H_{BG}$ are replaced with the matrix) which has been cyclically shifted an identity matrix, where a size of the identity matrix is $Z_c$ by $Z_c$, where i and j are a row index and a column index of the base graph $H_{BG}$, respectively. $I(P_{i,j})$ represents a matrix obtained by cyclically right shifting an identity matrix with a size $Z_c$ by $Z_c$ by bits, and $P_{i,j}$=mod ($V_{i,j}$, $Z_c$), where $V_{i,j}$ is an element in the i-th row and j-th column of the $i_{LS}$-th parity check matrix in the parity check matrix set P1 or an element in the i-th row and j-th column of the $i_{LS}$-th parity check matrix in the parity check matrix set P2.

The base graph of the parity check matrix set P2 is a sub-matrix (or an extracted matrix) of the base graph of the parity check matrix set P1, that is, the base graph of the parity check matrix set P2 is a sub-matrix (or an extracted matrix) extracted in the base graph of the parity check matrix set P1 according to the row index sequence α and column index sequence b. A length of a is less than a number of rows of the base graph of the parity check matrix set P1, and a length of b is less than a number of columns of the base graph of the parity check matrix set P1.

The dimensions of the base graph of the parity check matrix set P1 are 46 rows and 68 columns. The 8 first parity check matrixes in the parity check matrix set P1 are shown as in Table 10 in Example 20, and the indexes $i_{LS}$ of the first parity check matrixes are 0 to 7. The parity check matrix set P2 includes 8 second parity check matrixes, and the indexes $i_{LS}$ of the second parity check matrixes are 0 to 7.

In an example, a and b are one of the row index sequences α and one of the row index sequences β in Example 1 to Example 6, respectively.

In an example, a is {0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33}, b is {0, 1, 2, 3, 4, 5, 6, 7, 8, 9, 10, 11, 12, 13, 14, 15, 22, 23, 24, 25, 26, 27, 28, 29, 30, 32, 33, 34, 35, 41, 42, 46, 47, 48, 49, 51, 52, 53, 54, 55, 56, 57, 58, 59, 60, 61, 63, 64, 66, 67}, and the dimensions of the base graph of the parity check matrix set P1 are 34 rows and 50 columns.

Example 20

In this example, the parity check matrix set P1 includes 8 parity check matrixes corresponding to indexes $i_{LS}$ equal to 0 to 7.

Table 10 shows positions and element values of elements equal to 1 in the base graph of the parity check matrix set P1, where a position of an element equal to 1 is represented by row index (i) and column index (j), and a position of an element equal to 1 corresponds to a position of an element indicating a cyclical shift of an identity matrix, and defines an element value ($V_{i,j}$) at the position in the corresponding parity check matrix, i.e., a number of bits of the cyclical shift. In the base graph $H_{BG1}$ of the parity check matrix set P1, element values corresponding to positions of other row indexes or column indexes (i.e., positions not defined in Table 10) are "0", that is, corresponds to positions indicating the all-zero square matrix. In Table 10, each lifting size sub-set index $i_{LS}$ corresponds to a first parity check matrix.

TABLE 10 positions and element values of elements equal to 1 in the base graph of the parity check matrix set P1 (i represents a row index, and j represents a column index)

| $HB_{G1}$ | | $V_{i,j}$ Lifting size sub-set index $i_{LS}$ | | | | | | | |
|---|---|---|---|---|---|---|---|---|---|
| i | j | 0 | 1 | 2 | 3 | 4 | 5 | 6 | 7 |
| 0 | 0 | 250 | 307 | 73 | 223 | 211 | 294 | 0 | 135 |
| | 1 | 69 | 19 | 15 | 16 | 198 | 118 | 0 | 227 |
| | 2 | 226 | 50 | 103 | 94 | 188 | 167 | 0 | 126 |
| | 3 | 159 | 369 | 49 | 91 | 186 | 330 | 0 | 134 |
| | 5 | 100 | 181 | 240 | 74 | 219 | 207 | 0 | 84 |
| | 6 | 10 | 216 | 39 | 10 | 4 | 165 | 0 | 83 |
| | 9 | 59 | 317 | 15 | 0 | 29 | 243 | 0 | 53 |
| | 10 | 229 | 288 | 162 | 205 | 144 | 250 | 0 | 225 |
| | 11 | 110 | 109 | 215 | 216 | 116 | 1 | 0 | 205 |
| | 12 | 191 | 17 | 164 | 21 | 216 | 339 | 0 | 128 |
| | 13 | 9 | 357 | 133 | 215 | 115 | 201 | 0 | 75 |
| | 15 | 195 | 215 | 298 | 14 | 233 | 53 | 0 | 135 |
| | 16 | 23 | 106 | 110 | 70 | 144 | 347 | 0 | 217 |
| | 18 | 190 | 242 | 113 | 141 | 95 | 304 | 0 | 220 |
| | 19 | 35 | 180 | 16 | 198 | 216 | 167 | 0 | 90 |
| | 20 | 239 | 330 | 189 | 104 | 73 | 47 | 0 | 105 |
| | 21 | 31 | 346 | 32 | 81 | 261 | 188 | 0 | 137 |
| | 22 | 1 | 1 | 1 | 1 | 1 | 1 | 0 | 1 |
| | 23 | 0 | 0 | 0 | 0 | 0 | 0 | 0 | 0 |
| 1 | 0 | 2 | 76 | 303 | 141 | 179 | 77 | 22 | 96 |
| | 2 | 239 | 76 | 294 | 45 | 162 | 225 | 11 | 236 |
| | 3 | 117 | 73 | 27 | 151 | 223 | 96 | 124 | 136 |
| | 4 | 124 | 288 | 261 | 46 | 256 | 338 | 0 | 221 |
| | 5 | 71 | 144 | 161 | 119 | 160 | 268 | 10 | 128 |
| | 7 | 222 | 331 | 133 | 157 | 76 | 112 | 0 | 92 |
| | 8 | 104 | 331 | 4 | 133 | 202 | 302 | 0 | 172 |
| | 9 | 173 | 178 | 80 | 87 | 117 | 50 | 2 | 56 |
| | 11 | 220 | 295 | 129 | 206 | 109 | 167 | 16 | 11 |
| | 12 | 102 | 342 | 300 | 93 | 15 | 253 | 60 | 189 |
| | 14 | 109 | 217 | 76 | 79 | 72 | 334 | 0 | 95 |
| | 15 | 132 | 99 | 266 | 9 | 152 | 242 | 6 | 85 |
| | 16 | 142 | 354 | 72 | 118 | 158 | 257 | 30 | 153 |
| | 17 | 155 | 114 | 83 | 194 | 147 | 133 | 0 | 87 |
| | 19 | 255 | 331 | 260 | 31 | 156 | 9 | 168 | 163 |
| | 21 | 28 | 112 | 301 | 187 | 119 | 302 | 31 | 216 |
| | 22 | 0 | 0 | 0 | 0 | 0 | 0 | 105 | 0 |
| | 23 | 0 | 0 | 0 | 0 | 0 | 0 | 0 | 0 |
| | 24 | 0 | 0 | 0 | 0 | 0 | 0 | 0 | 0 |
| 2 | 0 | 106 | 205 | 68 | 207 | 258 | 226 | 132 | 189 |
| | 1 | 111 | 250 | 7 | 203 | 167 | 35 | 37 | 4 |
| | 2 | 185 | 328 | 80 | 31 | 220 | 213 | 21 | 225 |
| | 4 | 63 | 332 | 280 | 176 | 133 | 302 | 180 | 151 |
| | 5 | 117 | 256 | 38 | 180 | 243 | 111 | 4 | 236 |
| | 6 | 93 | 161 | 227 | 186 | 202 | 265 | 149 | 117 |
| | 7 | 229 | 267 | 202 | 95 | 218 | 128 | 48 | 179 |
| | 8 | 177 | 160 | 200 | 153 | 63 | 237 | 38 | 92 |
| | 9 | 95 | 63 | 71 | 177 | 0 | 294 | 122 | 24 |
| | 10 | 39 | 129 | 106 | 70 | 3 | 127 | 195 | 68 |
| | 13 | 142 | 200 | 295 | 77 | 74 | 110 | 155 | 6 |
| | 14 | 225 | 88 | 283 | 214 | 229 | 286 | 28 | 101 |
| | 15 | 225 | 53 | 301 | 77 | 0 | 125 | 85 | 33 |
| | 17 | 245 | 131 | 184 | 198 | 216 | 131 | 47 | 96 |
| | 18 | 205 | 240 | 246 | 117 | 269 | 163 | 179 | 125 |
| | 19 | 251 | 205 | 230 | 223 | 200 | 2100 | 42 | 67 |
| | 20 | 117 | 13 | 276 | 90 | 234 | 7 | 66 | 230 |
| | 24 | 0 | 0 | 0 | 0 | 0 | 0 | 0 | 0 |
| | 25 | 0 | 0 | 0 | 0 | 0 | 0 | 0 | 0 |
| 3 | 0 | 121 | 276 | 220 | 201 | 187 | 97 | 4 | 128 |
| | 1 | 89 | 87 | 208 | 18 | 145 | 94 | 6 | 23 |
| | 3 | 84 | 0 | 30 | 165 | 166 | 49 | 33 | 162 |
| | 4 | 20 | 275 | 197 | 5 | 108 | 279 | 113 | 220 |
| | 6 | 150 | 199 | 61 | 45 | 82 | 139 | 49 | 43 |
| | 7 | 131 | 153 | 175 | 142 | 132 | 166 | 21 | 186 |
| | 8 | 243 | 56 | 79 | 16 | 197 | 91 | 6 | 96 |
| | 10 | 136 | 132 | 281 | 34 | 41 | 106 | 151 | 1 |
| | 11 | 86 | 305 | 303 | 155 | 162 | 246 | 83 | 216 |
| | 12 | 246 | 231 | 253 | 213 | 57 | 345 | 154 | 22 |
| | 13 | 219 | 341 | 164 | 147 | 36 | 269 | 87 | 24 |
| | 14 | 211 | 212 | 53 | 69 | 115 | 185 | 5 | 167 |
| | 16 | 240 | 304 | 44 | 96 | 242 | 249 | 92 | 200 |
| | 17 | 76 | 300 | 28 | 74 | 165 | 215 | 173 | 32 |
| | 18 | 244 | 271 | 77 | 99 | 0 | 143 | 120 | 235 |
| | 20 | 144 | 39 | 319 | 30 | 113 | 121 | 2 | 172 |
| | 21 | 12 | 357 | 68 | 158 | 108 | 121 | 142 | 219 |
| | 22 | 1 | 1 | 1 | 1 | 1 | 1 | 0 | 1 |
| | 25 | 0 | 0 | 0 | 0 | 0 | 0 | 0 | 0 |
| 4 | 0 | 157 | 332 | 233 | 170 | 246 | 42 | 24 | 64 |
| | 1 | 102 | 181 | 205 | 10 | 235 | 256 | 204 | 211 |
| | 26 | 0 | 0 | 0 | 0 | 0 | 0 | 0 | 0 |
| 5 | 0 | 205 | 195 | 83 | 164 | 261 | 219 | 185 | 2 |
| | 1 | 236 | 14 | 292 | 59 | 181 | 130 | 100 | 171 |
| | 3 | 194 | 115 | 50 | 86 | 72 | 251 | 24 | 47 |
| | 12 | 231 | 166 | 318 | 80 | 283 | 322 | 65 | 143 |
| | 16 | 28 | 241 | 201 | 182 | 254 | 295 | 207 | 210 |
| | 21 | 123 | 51 | 267 | 130 | 79 | 258 | 161 | 180 |
| | 22 | 115 | 157 | 279 | 153 | 144 | 283 | 72 | 180 |
| | 27 | 0 | 0 | 0 | 0 | 0 | 0 | 0 | 0 |
| 6 | 0 | 183 | 278 | 289 | 158 | 80 | 294 | 6 | 199 |
| | 6 | 22 | 257 | 21 | 119 | 144 | 73 | 27 | 22 |
| | 10 | 28 | 1 | 293 | 113 | 169 | 330 | 163 | 23 |
| | 11 | 67 | 351 | 13 | 21 | 90 | 99 | 50 | 100 |
| | 13 | 244 | 92 | 232 | 63 | 59 | 172 | 48 | 92 |
| | 17 | 11 | 253 | 302 | 51 | 177 | 150 | 24 | 207 |
| | 18 | 157 | 18 | 138 | 136 | 151 | 284 | 38 | 52 |
| | 20 | 211 | 225 | 235 | 116 | 108 | 305 | 91 | 13 |
| | 28 | 0 | 0 | 0 | 0 | 0 | 0 | 0 | 0 |
| 7 | 0 | 220 | 9 | 12 | 17 | 169 | 3 | 145 | 77 |
| | 1 | 44 | 62 | 88 | 76 | 189 | 103 | 88 | 146 |
| | 4 | 159 | 316 | 207 | 104 | 154 | 224 | 112 | 209 |
| | 7 | 31 | 333 | 50 | 100 | 184 | 297 | 153 | 32 |
| | 8 | 167 | 290 | 25 | 150 | 104 | 215 | 159 | 166 |
| | 14 | 104 | 114 | 76 | 158 | 164 | 39 | 76 | 18 |
| | 29 | 0 | 0 | 0 | 0 | 0 | 0 | 0 | 0 |
| 8 | 0 | 112 | 307 | 295 | 33 | 54 | 348 | 172 | 181 |
| | 1 | 4 | 179 | 133 | 95 | 0 | 75 | 2 | 105 |
| | 3 | 7 | 165 | 130 | 4 | 252 | 22 | 131 | 141 |
| | 12 | 211 | 18 | 231 | 217 | 41 | 312 | 141 | 223 |
| | 16 | 102 | 39 | 296 | 204 | 98 | 224 | 96 | 177 |
| | 19 | 164 | 224 | 110 | 39 | 46 | 17 | 99 | 145 |
| | 21 | 109 | 368 | 269 | 58 | 15 | 59 | 101 | 199 |
| | 22 | 241 | 67 | 245 | 44 | 230 | 314 | 35 | 153 |
| | 24 | 90 | 170 | 154 | 201 | 54 | 244 | 116 | 38 |
| | 30 | 0 | 0 | 0 | 0 | 0 | 0 | 0 | 0 |
| 9 | 0 | 103 | 366 | 189 | 9 | 162 | 156 | 6 | 169 |
| | 1 | 182 | 232 | 244 | 37 | 159 | 88 | 10 | 12 |
| | 10 | 109 | 321 | 36 | 213 | 93 | 293 | 145 | 206 |
| | 11 | 21 | 133 | 286 | 105 | 134 | 111 | 53 | 221 |
| | 13 | 142 | 57 | 151 | 89 | 45 | 92 | 201 | 17 |
| | 17 | 14 | 303 | 267 | 185 | 132 | 152 | 4 | 212 |
| | 18 | 61 | 63 | 135 | 109 | 76 | 23 | 164 | 92 |
| | 20 | 216 | 82 | 209 | 218 | 209 | 337 | 173 | 205 |
| | 31 | 0 | 0 | 0 | 0 | 0 | 0 | 0 | 0 |
| 10 | 1 | 98 | 101 | 14 | 82 | 178 | 175 | 126 | 116 |
| | 2 | 149 | 339 | 80 | 165 | 1 | 253 | 77 | 151 |
| | 4 | 167 | 274 | 211 | 174 | 28 | 27 | 156 | 70 |
| | 7 | 160 | 111 | 75 | 19 | 267 | 231 | 16 | 230 |
| | 8 | 49 | 383 | 161 | 194 | 234 | 49 | 12 | 115 |
| | 14 | 58 | 354 | 311 | 103 | 201 | 267 | 70 | 84 |
| | 32 | 0 | 0 | 0 | 0 | 0 | 0 | 0 | 0 |
| 11 | 0 | 77 | 48 | 16 | 52 | 55 | 25 | 184 | 45 |
| | 1 | 41 | 102 | 147 | 11 | 23 | 322 | 194 | 115 |
| | 12 | 83 | 8 | 290 | 2 | 274 | 200 | 123 | 134 |
| | 16 | 182 | 47 | 289 | 35 | 181 | 351 | 16 | 1 |
| | 21 | 78 | 188 | 177 | 32 | 273 | 166 | 104 | 152 |
| | 22 | 252 | 334 | 43 | 84 | 39 | 338 | 109 | 165 |
| | 23 | 22 | 115 | 280 | 201 | 26 | 192 | 124 | 107 |
| | 33 | 0 | 0 | 0 | 0 | 0 | 0 | 0 | 0 |
| 12 | 0 | 160 | 77 | 229 | 142 | 225 | 123 | 6 | 186 |
| | 1 | 42 | 186 | 235 | 175 | 162 | 217 | 20 | 215 |
| | 10 | 21 | 174 | 169 | 136 | 244 | 142 | 203 | 124 |
| | 11 | 32 | 232 | 48 | 3 | 151 | 110 | 153 | 180 |
| | 13 | 234 | 50 | 105 | 28 | 238 | 176 | 104 | 98 |

TABLE 10-continued positions and element values of elements equal to 1 in the base graph of the parity check matrix set P1 (i represents a row index, and j represents a column index)

| $HB_{G1}$ | | $V_{i,j}$ Lifting size sub-set index $i_{LS}$ | | | | | | | |
|---|---|---|---|---|---|---|---|---|---|
| i | j | 0 | 1 | 2 | 3 | 4 | 5 | 6 | 7 |
| | 18 | 7 | 74 | 52 | 182 | 243 | 76 | 207 | 80 |
| | 34 | 0 | 0 | 0 | 0 | 0 | 0 | 0 | 0 |
| 13 | 0 | 177 | 313 | 39 | 81 | 231 | 311 | 52 | 220 |
| | 3 | 248 | 177 | 302 | 56 | 0 | 251 | 147 | 185 |
| | 7 | 151 | 266 | 303 | 72 | 216 | 265 | 1 | 154 |
| | 20 | 185 | 115 | 160 | 217 | 47 | 94 | 16 | 178 |
| | 23 | 62 | 370 | 37 | 78 | 36 | 81 | 46 | 150 |
| | 35 | 0 | 0 | 0 | 0 | 0 | 0 | 0 | 0 |
| 14 | 0 | 206 | 142 | 78 | 14 | 0 | 22 | 1 | 124 |
| | 12 | 55 | 248 | 299 | 175 | 186 | 322 | 202 | 144 |
| | 15 | 206 | 137 | 54 | 211 | 253 | 277 | 118 | 182 |
| | 16 | 127 | 89 | 61 | 191 | 16 | 156 | 130 | 95 |
| | 17 | 16 | 347 | 179 | 51 | 0 | 66 | 1 | 72 |
| | 21 | 229 | 12 | 258 | 43 | 79 | 78 | 2 | 76 |
| | 36 | 0 | 0 | 0 | 0 | 0 | 0 | 0 | 0 |
| 15 | 0 | 40 | 241 | 229 | 90 | 170 | 176 | 173 | 39 |
| | 1 | 96 | 2 | 290 | 120 | 0 | 348 | 6 | 138 |
| | 10 | 65 | 210 | 60 | 131 | 183 | 15 | 81 | 220 |
| | 13 | 63 | 318 | 1310 | 209 | 108 | 81 | 182 | 173 |
| | 18 | 75 | 55 | 184 | 209 | 68 | 176 | 53 | 142 |
| | 25 | 179 | 269 | 51 | 51 | 64 | 113 | 46 | 49 |
| | 37 | 0 | 0 | 0 | 0 | 0 | 0 | 0 | 0 |
| 16 | 1 | 64 | 13 | 69 | 154 | 270 | 190 | 88 | 78 |
| | 3 | 49 | 338 | 140 | 164 | 13 | 293 | 198 | 152 |
| | 11 | 49 | 57 | 45 | 43 | 99 | 332 | 160 | 84 |
| | 20 | 51 | 289 | 115 | 189 | 54 | 331 | 122 | 5 |
| | 22 | 154 | 57 | 300 | 101 | 0 | 114 | 182 | 205 |
| | 38 | 0 | 0 | 0 | 0 | 0 | 0 | 0 | 0 |
| 17 | 0 | 7 | 260 | 257 | 56 | 153 | 110 | 91 | 183 |
| | 14 | 164 | 303 | 147 | 110 | 137 | 228 | 184 | 112 |
| | 16 | 59 | 81 | 128 | 200 | 0 | 247 | 30 | 106 |
| | 17 | 1 | 358 | 51 | 63 | 0 | 116 | 3 | 219 |
| | 21 | 144 | 375 | 228 | 4 | 162 | 190 | 155 | 129 |
| | 39 | 0 | 0 | 0 | 0 | 0 | 0 | 0 | 0 |
| 18 | 1 | 42 | 130 | 260 | 199 | 161 | 47 | 1 | 183 |
| | 12 | 233 | 163 | 294 | 110 | 151 | 286 | 41 | 215 |
| | 13 | 8 | 280 | 291 | 200 | 0 | 246 | 167 | 180 |
| | 18 | 155 | 132 | 141 | 143 | 241 | 181 | 68 | 143 |
| | 19 | 147 | 4 | 295 | 186 | 144 | 73 | 148 | 14 |
| | 40 | 0 | 0 | 0 | 0 | 0 | 0 | 0 | 0 |
| 19 | 0 | 60 | 145 | 64 | 8 | 0 | 87 | 12 | 179 |
| | 1 | 73 | 213 | 181 | 6 | 0 | 110 | 6 | 108 |
| | 7 | 72 | 344 | 101 | 103 | 118 | 147 | 166 | 159 |
| | 8 | 127 | 242 | 270 | 198 | 144 | 258 | 184 | 138 |
| | 10 | 224 | 197 | 41 | 8 | 0 | 204 | 191 | 196 |
| | 41 | 0 | 0 | 0 | 0 | 0 | 0 | 0 | 0 |
| 20 | 0 | 151 | 187 | 301 | 105 | 265 | 89 | 6 | 77 |
| | 3 | 186 | 206 | 162 | 210 | 81 | 65 | 12 | 187 |
| | 9 | 217 | 264 | 40 | 121 | 90 | 155 | 15 | 203 |
| | 11 | 47 | 341 | 130 | 214 | 144 | 244 | 5 | 167 |
| | 22 | 160 | 59 | 10 | 183 | 228 | 30 | 30 | 130 |
| | 42 | 0 | 0 | 0 | 0 | 0 | 0 | 0 | 0 |
| 21 | 1 | 249 | 205 | 79 | 192 | 64 | 162 | 6 | 197 |
| | 5 | 121 | 102 | 175 | 131 | 46 | 264 | 86 | 122 |
| | 16 | 109 | 328 | 132 | 220 | 266 | 346 | 96 | 215 |
| | 20 | 131 | 213 | 283 | 50 | 9 | 143 | 42 | 65 |
| | 21 | 171 | 97 | 103 | 106 | 18 | 109 | 199 | 216 |
| | 43 | 0 | 0 | 0 | 0 | 0 | 0 | 0 | 0 |
| 22 | 0 | 64 | 30 | 177 | 53 | 72 | 280 | 44 | 25 |
| | 12 | 142 | 11 | 20 | 0 | 189 | 157 | 58 | 47 |
| | 13 | 188 | 233 | 55 | 3 | 72 | 236 | 130 | 126 |
| | 17 | 158 | 22 | 316 | 148 | 257 | 113 | 131 | 178 |
| | 44 | 0 | 0 | 0 | 0 | 0 | 0 | 0 | 0 |
| 23 | 1 | 56 | 24 | 249 | 88 | 180 | 18 | 45 | 185 |
| | 2 | 147 | 89 | 50 | 203 | 0 | 6 | 18 | 127 |
| | 10 | 170 | 61 | 133 | 168 | 0 | 181 | 132 | 117 |
| | 18 | 152 | 27 | 105 | 122 | 165 | 304 | 100 | 199 |
| | 45 | 0 | 0 | 0 | 0 | 0 | 0 | 0 | 0 |
| 24 | 0 | 112 | 298 | 289 | 49 | 236 | 38 | 9 | 32 |
| | 3 | 86 | 158 | 280 | 157 | 199 | 170 | 125 | 178 |
| | 4 | 236 | 235 | 110 | 64 | 0 | 249 | 191 | 2 |
| | 11 | 116 | 339 | 187 | 193 | 266 | 288 | 28 | 156 |
| | 22 | 222 | 234 | 281 | 124 | 0 | 194 | 6 | 58 |
| | 46 | 0 | 0 | 0 | 0 | 0 | 0 | 0 | 0 |
| 25 | 1 | 23 | 72 | 172 | 1 | 205 | 279 | 4 | 27 |
| | 6 | 136 | 17 | 295 | 166 | 0 | 255 | 74 | 141 |
| | 7 | 116 | 383 | 96 | 65 | 0 | 111 | 16 | 11 |
| | 14 | 182 | 312 | 46 | 81 | 183 | 54 | 28 | 181 |
| | 47 | 0 | 0 | 0 | 0 | 0 | 0 | 0 | 0 |
| 26 | 0 | 195 | 71 | 270 | 107 | 0 | 325 | 21 | 163 |
| | 2 | 243 | 81 | 110 | 176 | 0 | 326 | 142 | 131 |
| | 4 | 215 | 76 | 318 | 212 | 0 | 226 | 192 | 169 |
| | 15 | 61 | 136 | 67 | 127 | 277 | 99 | 197 | 98 |
| | 48 | 0 | 0 | 0 | 0 | 0 | 0 | 0 | 0 |
| 27 | 1 | 25 | 194 | 210 | 208 | 45 | 91 | 98 | 165 |
| | 6 | 104 | 194 | 29 | 141 | 36 | 326 | 140 | 232 |
| | 8 | 194 | 101 | 304 | 174 | 72 | 268 | 22 | 9 |
| | 49 | 0 | 0 | 0 | 0 | 0 | 0 | 0 | 0 |
| 28 | 0 | 128 | 222 | 11 | 146 | 275 | 102 | 4 | 32 |
| | 4 | 165 | 19 | 293 | 153 | 0 | 1 | 1 | 43 |
| | 19 | 181 | 244 | 50 | 217 | 155 | 40 | 40 | 200 |
| | 21 | 63 | 274 | 234 | 114 | 62 | 167 | 93 | 205 |
| | 50 | 0 | 0 | 0 | 0 | 0 | 0 | 0 | 0 |
| 29 | 1 | 86 | 252 | 27 | 150 | 0 | 273 | 92 | 232 |
| | 14 | 236 | 5 | 308 | 11 | 180 | 104 | 136 | 32 |
| | 18 | 84 | 147 | 117 | 53 | 0 | 243 | 106 | 118 |
| | 25 | 6 | 78 | 29 | 68 | 42 | 107 | 6 | 103 |
| | 51 | 0 | 0 | 0 | 0 | 0 | 0 | 0 | 0 |
| 30 | 0 | 216 | 159 | 91 | 34 | 0 | 171 | 2 | 170 |
| | 10 | 73 | 229 | 23 | 130 | 90 | 16 | 88 | 199 |
| | 13 | 120 | 260 | 105 | 210 | 252 | 95 | 112 | 26 |
| | 24 | 9 | 90 | 135 | 123 | 173 | 212 | 20 | 105 |
| | 52 | 0 | 0 | 0 | 0 | 0 | 0 | 0 | 0 |
| 31 | 1 | 95 | 100 | 222 | 175 | 144 | 101 | 4 | 73 |
| | 7 | 177 | 215 | 308 | 49 | 144 | 297 | 49 | 149 |
| | 22 | 172 | 258 | 66 | 177 | 166 | 279 | 125 | 175 |
| | 25 | 61 | 256 | 162 | 128 | 19 | 222 | 194 | 108 |
| | 53 | 0 | 0 | 0 | 0 | 0 | 0 | 0 | 0 |
| 32 | 0 | 221 | 105 | 210 | 192 | 0 | 351 | 6 | 103 |
| | 12 | 112 | 201 | 22 | 209 | 211 | 265 | 126 | 110 |
| | 14 | 199 | 175 | 271 | 58 | 36 | 338 | 63 | 151 |
| | 24 | 121 | 287 | 217 | 30 | 162 | 83 | 20 | 211 |
| | 54 | 0 | 0 | 0 | 0 | 0 | 0 | 0 | 0 |
| 33 | 1 | 2 | 323 | 170 | 114 | 0 | 56 | 10 | 199 |
| | 2 | 187 | 8 | 20 | 49 | 0 | 304 | 30 | 132 |
| | 11 | 41 | 361 | 140 | 161 | 76 | 141 | 6 | 172 |
| | 21 | 211 | 105 | 33 | 137 | 18 | 101 | 92 | 65 |
| | 55 | 0 | 0 | 0 | 0 | 0 | 0 | 0 | 0 |
| 34 | 0 | 127 | 230 | 187 | 82 | 197 | 60 | 4 | 161 |
| | 7 | 167 | 148 | 296 | 186 | 0 | 320 | 153 | 237 |
| | 15 | 164 | 202 | 5 | 68 | 108 | 112 | 197 | 142 |
| | 17 | 159 | 312 | 44 | 150 | 0 | 54 | 155 | 180 |
| | 56 | 0 | 0 | 0 | 0 | 0 | 0 | 0 | 0 |
| 35 | 1 | 161 | 320 | 207 | 192 | 199 | 100 | 4 | 231 |
| | 6 | 197 | 335 | 158 | 173 | 278 | 210 | 45 | 174 |
| | 12 | 207 | 2 | 55 | 26 | 0 | 195 | 168 | 145 |
| | 22 | 103 | 266 | 285 | 187 | 205 | 268 | 185 | 100 |
| | 57 | 0 | 0 | 0 | 0 | 0 | 0 | 0 | 0 |
| 36 | 0 | 37 | 210 | 259 | 222 | 216 | 135 | 6 | 11 |
| | 14 | 105 | 313 | 179 | 157 | 16 | 15 | 200 | 207 |
| | 15 | 51 | 297 | 178 | 0 | 0 | 35 | 177 | 42 |
| | 18 | 120 | 21 | 160 | 6 | 0 | 188 | 43 | 100 |
| | 58 | 0 | 0 | 0 | 0 | 0 | 0 | 0 | 0 |
| 37 | 1 | 198 | 269 | 298 | 81 | 72 | 319 | 82 | 59 |
| | 13 | 220 | 82 | 15 | 195 | 144 | 236 | 2 | 204 |
| | 23 | 122 | 115 | 115 | 138 | 0 | 85 | 135 | 161 |
| | 59 | 0 | 0 | 0 | 0 | 0 | 0 | 0 | 0 |
| 38 | 0 | 167 | 185 | 151 | 123 | 190 | 164 | 91 | 121 |
| | 9 | 151 | 177 | 179 | 90 | 0 | 196 | 64 | 90 |
| | 10 | 157 | 289 | 64 | 73 | 0 | 209 | 198 | 26 |
| | 12 | 163 | 214 | 181 | 10 | 0 | 246 | 100 | 140 |
| | 60 | 0 | 0 | 0 | 0 | 0 | 0 | 0 | 0 |

TABLE 10-continued positions and element values of elements equal to 1 in the base graph of the parity check matrix set P1 (i represents a row index, and j represents a column index)

| $HB_{G1}$ | | $V_{i,j}$ Lifting size sub-set index $i_{LS}$ | | | | | | | |
|---|---|---|---|---|---|---|---|---|---|
| i | j | 0 | 1 | 2 | 3 | 4 | 5 | 6 | 7 |
| 39 | 1 | 173 | 258 | 102 | 12 | 153 | 236 | 4 | 115 |
| | 3 | 139 | 93 | 77 | 77 | 0 | 264 | 28 | 188 |
| | 7 | 149 | 346 | 192 | 49 | 165 | 37 | 109 | 168 |
| | 19 | 0 | 297 | 208 | 114 | 117 | 272 | 188 | 52 |
| | 61 | 0 | 0 | 0 | 0 | 0 | 0 | 0 | 0 |
| 40 | 0 | 157 | 175 | 32 | 67 | 216 | 304 | 10 | 4 |
| | 8 | 137 | 37 | 80 | 45 | 144 | 237 | 84 | 103 |
| | 17 | 149 | 312 | 197 | 96 | 2 | 135 | 12 | 30 |
| | 62 | 0 | 0 | 0 | 0 | 0 | 0 | 0 | 0 |
| 41 | 1 | 167 | 52 | 154 | 23 | 0 | 123 | 2 | 53 |
| | 3 | 173 | 314 | 47 | 215 | 0 | 77 | 75 | 189 |
| | 9 | 139 | 139 | 124 | 60 | 0 | 25 | 142 | 215 |
| | 18 | 151 | 288 | 207 | 167 | 183 | 272 | 128 | 24 |
| | 63 | 0 | 0 | 0 | 0 | 0 | 0 | 0 | 0 |
| 42 | 0 | 149 | 113 | 226 | 114 | 27 | 288 | 163 | 222 |
| | 4 | 157 | 14 | 65 | 91 | 0 | 83 | 10 | 170 |
| | 24 | 137 | 218 | 126 | 78 | 35 | 17 | 162 | 71 |
| | 64 | 0 | 0 | 0 | 0 | 0 | 0 | 0 | 0 |
| 43 | 1 | 151 | 113 | 228 | 206 | 52 | 210 | 1 | 22 |
| | 16 | 163 | 132 | 69 | 22 | 243 | 3 | 163 | 127 |
| | 18 | 173 | 114 | 176 | 134 | 0 | 53 | 99 | 49 |
| | 25 | 139 | 168 | 102 | 161 | 270 | 167 | 98 | 125 |
| | 65 | 0 | 0 | 0 | 0 | 0 | 0 | 0 | 0 |
| 44 | 0 | 139 | 80 | 234 | 84 | 18 | 79 | 4 | 191 |
| | 7 | 157 | 78 | 227 | 4 | 0 | 244 | 6 | 211 |
| | 9 | 163 | 163 | 259 | 9 | 0 | 293 | 142 | 187 |
| | 22 | 173 | 274 | 260 | 12 | 57 | 272 | 3 | 148 |
| | 66 | 0 | 0 | 0 | 0 | 0 | 0 | 0 | 0 |
| 45 | 1 | 149 | 135 | 101 | 184 | 168 | 82 | 181 | 177 |
| | 6 | 151 | 149 | 228 | 121 | 0 | 67 | 45 | 114 |
| | 10 | 167 | 15 | 126 | 29 | 144 | 135 | 153 | 93 |
| | 67 | 0 | 0 | 0 | 0 | 0 | 0 | 0 | 0 |

Example 21

In this example, the parity check matrix set P2 includes at least one parity check matrix of the parity check matrixes shown in Table 11; or the parity check matrix set P2 includes at least a sub-matrix of one parity check matrix of the parity check matrixes shown in Table 11, such as, a sub-matrix consisting of the first mb rows and the first (mb+16) columns of the one parity check matrix shown in Table 11, where mb is an integer greater than 3. mb is equal to 4, 6, 8, 10, or 18. LDPC encoding is performed according to the parity check matrix set P2.

Table 11 shows positions and element values of the elements equal to 1 in the base graph of the parity check matrix set P2 in another example, where a position of an element equal to 1 is represented by row index (i) and column index (j), and a position of an element equal to 1 corresponds to a position of an element indicating a cyclical shift of an identity matrix, and defines an element value (y,) at the position in the corresponding parity check matrix, i.e., a number of bits of the cyclical shift. Element values corresponding to positions of the row indexes or column indexes that are not defined in Table 11 are "0", that is, correspond to positions indicating the all-zero square matrix. In Table 11, each $i_{LS}$ corresponds to a parity check matrix, and $i_{LS}$ is equal to 0, 1, 2, . . . , 7.

The base graph (a base graph in standard version Release 15 or 16 of the 5th Generation Mobile Communication Technology (5G)) shown in Table 11 is a sub-matrix (or an extracted matrix) of the base graph shown in Table 10 in Example 20, where the corresponding row index sequence is {0, 1, 2, 3, 4, 8, 9, 10, 12, 15, 16, 43, 18, 19, 20, 30, 24, 29, 7, 22, 31, 32, 33, 34, 28, 23, 38, 39, 40, 42, 5, 44, 45, 25}, and the column index sequence is {0, 1, 3, 4, 6, 7, 8, 10, 11, 12, 13, 14, 16, 17, 18, 21, 22, 23, 24, 25, 26, 30, 31, 32, 34, 37, 38, 65, 40, 41, 42, 52, 46, 51, 29, 44, 53, 54, 55, 56, 50, 45, 60, 61, 62, 64, 27, 66, 67, 47}. The maximum lifting size is 1024. The simulation performance of the LDPC encoding performed according to the target parity check matrix determined from Table 11 is shown in FIG. 3. The corresponding information length is 16384, and the code rate includes {8/9, 5/6, 3/4, 2/3, 1/2, 2/5, 1/3}. It can be seen that under different code rates, determining the target parity check matrix from the second parity check matrix set for LDPC encoding has good performance, and there is no error floor; and the maximum lifting size supported by the second parity check matrix set may reach 1024, and the LDPC decoding has high parallelism and thus the throughput is high.

TABLE 11 positions and element values of elements equal to 1 in the base graph of the parity check matrix set P2 (i represents a row index, and j represents a column index)

| $HB_G$ | | $V_{i,j}$ Lifting size sub-set index $i_{LS}$ | | | | | | | |
|---|---|---|---|---|---|---|---|---|---|
| i | j | 0 | 1 | 2 | 3 | 4 | 5 | 6 | 7 |
| 0 | 0 | 1018 | 691 | 393 | 223 | 211 | 646 | 624 | 855 |
| | 1 | 325 | 19 | 15 | 464 | 198 | 118 | 208 | 947 |
| | 2 | 927 | 369 | 369 | 763 | 186 | 682 | 624 | 614 |
| | 4 | 778 | 600 | 359 | 234 | 292 | 517 | 208 | 83 |
| | 7 | 997 | 288 | 162 | 429 | 144 | 602 | 416 | 945 |
| | 8 | 622 | 493 | 215 | 440 | 404 | 353 | 624 | 925 |
| | 9 | 191 | 17 | 164 | 21 | 504 | 339 | 0 | 608 |
| | 10 | 777 | 357 | 133 | 887 | 115 | 553 | 0 | 75 |
| | 12 | 23 | 490 | 430 | 742 | 432 | 699 | 624 | 457 |
| | 14 | 446 | 626 | 433 | 141 | 383 | 304 | 0 | 460 |
| | 15 | 799 | 346 | 32 | 753 | 261 | 188 | 624 | 857 |
| | 16 | 1 | 1 | 1 | 1 | 1 | 1 | 0 | 1 |
| | 17 | 0 | 0 | 0 | 0 | 0 | 0 | 0 | 0 |
| 1 | 0 | 258 | 460 | 303 | 813 | 179 | 429 | 230 | 576 |
| | 2 | 629 | 457 | 347 | 599 | 511 | 96 | 124 | 616 |
| | 3 | 124 | 288 | 261 | 270 | 256 | 338 | 624 | 941 |
| | 5 | 222 | 715 | 133 | 157 | 76 | 112 | 0 | 812 |
| | 6 | 872 | 715 | 324 | 581 | 202 | 654 | 416 | 892 |
| | 8 | 988 | 679 | 449 | 654 | 397 | 167 | 640 | 251 |
| | 9 | 614 | 342 | 300 | 765 | 303 | 253 | 268 | 669 |
| | 11 | 621 | 217 | 76 | 303 | 72 | 686 | 416 | 95 |
| | 12 | 398 | 738 | 392 | 790 | 446 | 609 | 238 | 153 |
| | 13 | 667 | 114 | 83 | 642 | 435 | 485 | 208 | 327 |
| | 15 | 284 | 112 | 301 | 635 | 119 | 302 | 31 | 696 |
| | 16 | 0 | 0 | 0 | 0 | 0 | 0 | 105 | 0 |
| | 17 | 0 | 0 | 0 | 0 | 0 | 0 | 0 | 0 |
| | 18 | 0 | 0 | 0 | 0 | 0 | 0 | 0 | 0 |
| 2 | 0 | 874 | 205 | 388 | 431 | 258 | 226 | 132 | 669 |
| | 1 | 111 | 634 | 327 | 427 | 455 | 387 | 453 | 244 |
| | 3 | 63 | 332 | 600 | 400 | 133 | 302 | 596 | 871 |
| | 4 | 93 | 161 | 227 | 410 | 490 | 617 | 357 | 837 |
| | 5 | 229 | 651 | 522 | 767 | 506 | 480 | 48 | 419 |
| | 6 | 433 | 544 | 200 | 377 | 351 | 589 | 454 | 812 |
| | 7 | 39 | 129 | 106 | 518 | 3 | 479 | 195 | 68 |
| | 10 | 654 | 200 | 295 | 525 | 362 | 110 | 571 | 6 |
| | 11 | 481 | 88 | 603 | 886 | 229 | 638 | 652 | 821 |
| | 13 | 757 | 131 | 184 | 198 | 216 | 483 | 47 | 336 |
| | 14 | 973 | 624 | 246 | 117 | 269 | 163 | 803 | 845 |
| | 18 | 0 | 0 | 0 | 0 | 0 | 0 | 0 | 0 |
| | 19 | 0 | 0 | 0 | 0 | 0 | 0 | 0 | 0 |
| 3 | 0 | 121 | 276 | 220 | 425 | 187 | 97 | 212 | 128 |
| | 1 | 89 | 471 | 208 | 690 | 433 | 446 | 6 | 503 |
| | 2 | 340 | 0 | 350 | 613 | 454 | 401 | 33 | 402 |
| | 3 | 20 | 659 | 197 | 5 | 396 | 279 | 737 | 220 |
| | 4 | 406 | 199 | 381 | 493 | 370 | 491 | 673 | 283 |
| | 5 | 643 | 153 | 175 | 590 | 420 | 166 | 645 | 426 |
| | 6 | 755 | 440 | 399 | 688 | 485 | 443 | 6 | 336 |

TABLE 11-continued positions and element values of elements equal to 1 in the base graph of the parity check matrix set P2 (i represents a row index, and j represents a column index)

| $HB_G$ | | $V_{i,j}$ Lifting size sub-set index $i_{LS}$ | | | | | | | |
|---|---|---|---|---|---|---|---|---|---|
| i | j | 0 | 1 | 2 | 3 | 4 | 5 | 6 | 7 |
| | 7 | 904 | 516 | 601 | 706 | 329 | 458 | 775 | 1 |
| | 8 | 86 | 305 | 303 | 827 | 450 | 598 | 707 | 216 |
| | 9 | 502 | 231 | 573 | 437 | 345 | 345 | 778 | 742 |
| | 10 | 987 | 725 | 164 | 371 | 324 | 269 | 711 | 504 |
| | 11 | 723 | 596 | 373 | 69 | 403 | 185 | 421 | 407 |
| | 12 | 752 | 304 | 44 | 320 | 530 | 249 | 716 | 680 |
| | 13 | 844 | 300 | 348 | 746 | 165 | 567 | 173 | 752 |
| | 14 | 500 | 271 | 77 | 99 | 0 | 495 | 744 | 955 |
| | 15 | 780 | 741 | 388 | 830 | 396 | 473 | 142 | 939 |
| | 16 | 1 | 1 | 1 | 1 | 1 | 1 | 0 | 1 |
| | 19 | 0 | 0 | 0 | 0 | 0 | 0 | 0 | 0 |
| 4 | 0 | 413 | 332 | 233 | 394 | 246 | 394 | 232 | 304 |
| | 1 | 870 | 181 | 525 | 234 | 523 | 608 | 204 | 211 |
| | 20 | 0 | 0 | 0 | 0 | 0 | 0 | 0 | 0 |
| 5 | 0 | 880 | 691 | 615 | 33 | 54 | 348 | 380 | 421 |
| | 1 | 516 | 563 | 453 | 767 | 0 | 427 | 2 | 825 |
| | 2 | 775 | 165 | 130 | 676 | 252 | 374 | 547 | 621 |
| | 9 | 211 | 18 | 551 | 441 | 41 | 664 | 557 | 703 |
| | 12 | 102 | 39 | 296 | 428 | 386 | 576 | 720 | 657 |
| | 15 | 365 | 752 | 269 | 282 | 303 | 411 | 309 | 919 |
| | 16 | 241 | 67 | 565 | 716 | 518 | 666 | 659 | 633 |
| | 18 | 602 | 554 | 474 | 201 | 342 | 244 | 532 | 38 |
| | 21 | 0 | 0 | 0 | 0 | 0 | 0 | 0 | 0 |
| 6 | 0 | 359 | 366 | 509 | 681 | 450 | 508 | 422 | 409 |
| | 1 | 182 | 616 | 244 | 37 | 159 | 440 | 218 | 492 |
| | 7 | 365 | 705 | 356 | 213 | 93 | 645 | 353 | 686 |
| | 8 | 277 | 133 | 286 | 553 | 422 | 111 | 261 | 941 |
| | 10 | 910 | 57 | 151 | 313 | 45 | 444 | 409 | 737 |
| | 13 | 526 | 687 | 267 | 409 | 420 | 152 | 4 | 212 |
| | 14 | 61 | 447 | 455 | 781 | 76 | 23 | 580 | 332 |
| | 22 | 0 | 0 | 0 | 0 | 0 | 0 | 0 | 0 |
| 7 | 1 | 866 | 101 | 14 | 306 | 178 | 527 | 750 | 596 |
| | 3 | 935 | 658 | 531 | 846 | 28 | 27 | 156 | 790 |
| | 5 | 928 | 495 | 75 | 691 | 555 | 231 | 224 | 230 |
| | 6 | 561 | 383 | 161 | 866 | 234 | 401 | 12 | 595 |
| | 11 | 826 | 354 | 631 | 551 | 201 | 267 | 694 | 564 |
| | 23 | 0 | 0 | 0 | 0 | 0 | 0 | 0 | 0 |
| 8 | 0 | 160 | 77 | 549 | 366 | 225 | 475 | 630 | 426 |
| | 1 | 42 | 570 | 555 | 847 | 162 | 569 | 20 | 695 |
| | 7 | 789 | 174 | 169 | 808 | 532 | 494 | 619 | 124 |
| | 8 | 32 | 232 | 368 | 675 | 151 | 110 | 777 | 420 |
| | 10 | 234 | 434 | 105 | 28 | 526 | 528 | 728 | 98 |
| | 14 | 263 | 74 | 52 | 854 | 243 | 76 | 831 | 320 |
| | 24 | 0 | 0 | 0 | 0 | 0 | 0 | 0 | 0 |
| 9 | 0 | 552 | 241 | 229 | 314 | 170 | 176 | 589 | 759 |
| | 1 | 96 | 92 | 610 | 568 | 0 | 348 | 422 | 858 |
| | 7 | 321 | 594 | 60 | 355 | 471 | 15 | 289 | 700 |
| | 10 | 575 | 702 | 130 | 209 | 108 | 433 | 806 | 413 |
| | 14 | 587 | 55 | 184 | 433 | 356 | 176 | 261 | 622 |
| | 19 | 691 | 269 | 371 | 81 | 352 | 465 | 670 | 289 |
| | 25 | 0 | 0 | 0 | 0 | 0 | 0 | 0 | 0 |
| 10 | 1 | 320 | 397 | 389 | 378 | 270 | 190 | 296 | 78 |
| | 2 | 49 | 338 | 460 | 612 | 13 | 293 | 198 | 392 |
| | 8 | 561 | 441 | 45 | 43 | 387 | 684 | 160 | 804 |
| | 16 | 410 | 441 | 300 | 773 | 288 | 466 | 182 | 445 |
| | 26 | 0 | 0 | 0 | 0 | 0 | 0 | 0 | 0 |
| 11 | 1 | 151 | 113 | 548 | 430 | 52 | 562 | 1 | 742 |
| | 12 | 419 | 516 | 69 | 694 | 243 | 3 | 579 | 127 |
| | 14 | 173 | 114 | 496 | 582 | 288 | 405 | 99 | 529 |
| | 19 | 651 | 552 | 102 | 385 | 558 | 519 | 722 | 605 |
| | 27 | 0 | 0 | 0 | 0 | 0 | 0 | 0 | 0 |
| 12 | 1 | 42 | 130 | 580 | 199 | 161 | 399 | 625 | 183 |
| | 9 | 233 | 547 | 294 | 334 | 151 | 638 | 665 | 455 |
| | 10 | 776 | 280 | 291 | 648 | 0 | 246 | 791 | 900 |
| | 14 | 923 | 516 | 141 | 367 | 241 | 181 | 276 | 623 |
| | 28 | 0 | 0 | 0 | 0 | 0 | 0 | 0 | 0 |
| 13 | 0 | 828 | 145 | 64 | 8 | 0 | 439 | 12 | 419 |
| | 1 | 585 | 597 | 501 | 6 | 288 | 110 | 214 | 108 |
| | 5 | 584 | 344 | 421 | 327 | 406 | 499 | 374 | 879 |
| | 6 | 127 | 242 | 270 | 198 | 432 | 258 | 600 | 138 |

TABLE 11-continued positions and element values of elements equal to 1 in the base graph of the parity check matrix set P2 (i represents a row index, and j represents a column index)

| $HB_G$ | | $V_{i,j}$ Lifting size sub-set index $i_{LS}$ | | | | | | | |
|---|---|---|---|---|---|---|---|---|---|
| i | j | 0 | 1 | 2 | 3 | 4 | 5 | 6 | 7 |
| | 7 | 736 | 581 | 41 | 456 | 0 | 204 | 815 | 196 |
| | 29 | 0 | 0 | 0 | 0 | 0 | 0 | 0 | 0 |
| 14 | 0 | 407 | 571 | 301 | 777 | 265 | 89 | 214 | 557 |
| | 2 | 698 | 206 | 162 | 882 | 369 | 417 | 220 | 667 |
| | 8 | 559 | 341 | 450 | 438 | 432 | 244 | 213 | 647 |
| | 16 | 160 | 443 | 330 | 183 | 516 | 30 | 30 | 130 |
| | 30 | 0 | 0 | 0 | 0 | 0 | 0 | 0 | 0 |
| 15 | 0 | 984 | 159 | 91 | 482 | 288 | 523 | 418 | 170 |
| | 7 | 841 | 229 | 343 | 802 | 90 | 16 | 712 | 919 |
| | 10 | 888 | 260 | 425 | 434 | 540 | 447 | 736 | 506 |
| | 18 | 521 | 474 | 455 | 347 | 461 | 212 | 20 | 105 |
| | 31 | 0 | 0 | 0 | 0 | 0 | 0 | 0 | 0 |
| 16 | 0 | 624 | 682 | 609 | 497 | 524 | 38 | 633 | 272 |
| | 2 | 854 | 542 | 280 | 381 | 199 | 170 | 125 | 898 |
| | 3 | 492 | 235 | 430 | 521 | 288 | 249 | 607 | 722 |
| | 8 | 116 | 723 | 187 | 865 | 266 | 640 | 236 | 156 |
| | 16 | 222 | 618 | 281 | 796 | 288 | 194 | 630 | 778 |
| | 32 | 0 | 0 | 0 | 0 | 0 | 0 | 0 | 0 |
| 17 | 1 | 854 | 636 | 347 | 150 | 0 | 625 | 508 | 472 |
| | 11 | 748 | 5 | 308 | 459 | 180 | 104 | 136 | 272 |
| | 14 | 84 | 147 | 117 | 53 | 288 | 595 | 314 | 598 |
| | 19 | 518 | 78 | 349 | 68 | 42 | 459 | 214 | 583 |
| | 33 | 0 | 0 | 0 | 0 | 0 | 0 | 0 | 0 |
| 18 | 0 | 476 | 9 | 12 | 689 | 169 | 3 | 769 | 77 |
| | 1 | 812 | 446 | 408 | 748 | 189 | 455 | 296 | 626 |
| | 3 | 671 | 316 | 527 | 104 | 154 | 224 | 736 | 929 |
| | 5 | 31 | 333 | 50 | 548 | 472 | 649 | 569 | 752 |
| | 6 | 423 | 674 | 25 | 822 | 392 | 567 | 783 | 406 |
| | 11 | 616 | 498 | 76 | 382 | 452 | 39 | 284 | 738 |
| | 34 | 0 | 0 | 0 | 0 | 0 | 0 | 0 | 0 |
| 19 | 0 | 64 | 30 | 497 | 501 | 72 | 280 | 44 | 745 |
| | 9 | 142 | 395 | 20 | 0 | 477 | 509 | 474 | 527 |
| | 10 | 956 | 233 | 375 | 3 | 72 | 588 | 338 | 846 |
| | 13 | 158 | 406 | 636 | 148 | 257 | 465 | 547 | 178 |
| | 35 | 0 | 0 | 0 | 0 | 0 | 0 | 0 | 0 |
| 20 | 1 | 95 | 484 | 222 | 6223 | 144 | 101 | 212 | 793 |
| | 5 | 433 | 215 | 308 | 497 | 432 | 649 | 465 | 869 |
| | 16 | 940 | 258 | 386 | 401 | 166 | 279 | 541 | 175 |
| | 19 | 317 | 256 | 162 | 800 | 19 | 222 | 818 | 828 |
| | 36 | 0 | 0 | 0 | 0 | 0 | 0 | 0 | 0 |
| 21 | 0 | 733 | 102 | 210 | 192 | 288 | 351 | 214 | 823 |
| | 9 | 624 | 585 | 342 | 657 | 499 | 617 | 750 | 830 |
| | 11 | 199 | 559 | 591 | 282 | 36 | 690 | 63 | 631 |
| | 18 | 633 | 287 | 217 | 30 | 450 | 435 | 436 | 931 |
| | 37 | 0 | 0 | 0 | 0 | 0 | 0 | 0 | 0 |
| 22 | 1 | 258 | 323 | 170 | 562 | 0 | 56 | 218 | 199 |
| | 8 | 297 | 361 | 460 | 161 | 76 | 141 | 6 | 892 |
| | 15 | 467 | 105 | 33 | 809 | 306 | 101 | 92 | 545 |
| | 38 | 0 | 0 | 0 | 0 | 0 | 0 | 0 | 0 |
| 23 | 0 | 383 | 614 | 507 | 530 | 485 | 60 | 212 | 881 |
| | 5 | 935 | 148 | 616 | 634 | 288 | 672 | 153 | 717 |
| | 13 | 671 | 696 | 44 | 822 | 288 | 406 | 571 | 900 |
| | 39 | 0 | 0 | 0 | 0 | 0 | 0 | 0 | 0 |
| 24 | 0 | 384 | 606 | 11 | 370 | 275 | 102 | 212 | 32 |
| | 3 | 677 | 19 | 293 | 153 | 288 | 1 | 625 | 523 |
| | 15 | 575 | 274 | 234 | 562 | 62 | 519 | 717 | 685 |
| | 40 | 0 | 0 | 0 | 0 | 0 | 0 | 0 | 0 |
| 25 | 1 | 668 | 408 | 249 | 312 | 180 | 370 | 45 | 185 |
| | 7 | 170 | 445 | 133 | 392 | 0 | 181 | 132 | 357 |
| | 14 | 920 | 411 | 425 | 346 | 165 | 304 | 100 | 439 |
| | 41 | 0 | 0 | 0 | 0 | 0 | 0 | 0 | 0 |
| 26 | 0 | 423 | 185 | 151 | 795 | 478 | 164 | 715 | 601 |
| | 7 | 925 | 673 | 64 | 745 | 288 | 561 | 198 | 26 |
| | 9 | 931 | 214 | 501 | 10 | 0 | 246 | 516 | 620 |
| | 42 | 0 | 0 | 0 | 0 | 0 | 0 | 0 | 0 |
| 27 | 1 | 173 | 642 | 102 | 460 | 153 | 236 | 420 | 835 |
| | 2 | 139 | 93 | 397 | 749 | 288 | 616 | 444 | 908 |
| | 5 | 917 | 346 | 512 | 273 | 165 | 37 | 317 | 168 |
| | 43 | 0 | 0 | 0 | 0 | 0 | 0 | 0 | 0 |

TABLE 11-continued positions and element values of elements equal to 1 in the base graph of the parity check matrix set P2 (i represents a row index, and j represents a column index)

| $HB_G$ | | $V_{i,j}$ Lifting size sub-set index $i_{LS}$ | | | | | | | |
|---|---|---|---|---|---|---|---|---|---|
| i | j | 0 | 1 | 2 | 3 | 4 | 5 | 6 | 7 |
| 28 | 0 | 413 | 175 | 32 | 515 | 216 | 304 | 218 | 484 |
| | 6 | 905 | 37 | 400 | 269 | 144 | 237 | 84 | 343 |
| | 13 | 149 | 696 | 517 | 544 | 290 | 135 | 428 | 510 |
| | 44 | 0 | 0 | 0 | 0 | 0 | 0 | 0 | 0 |
| 29 | 0 | 661 | 497 | 226 | 562 | 315 | 640 | 371 | 222 |
| | 3 | 669 | 398 | 65 | 315 | 0 | 83 | 426 | 890 |
| | 18 | 393 | 602 | 126 | 750 | 35 | 17 | 162 | 311 |
| | 45 | 0 | 0 | 0 | 0 | 0 | 0 | 0 | 0 |
| 30 | 0 | 461 | 195 | 83 | 612 | 261 | 219 | 185 | 482 |
| | 1 | 748 | 398 | 292 | 731 | 469 | 130 | 724 | 891 |
| | 2 | 450 | 115 | 50 | 758 | 72 | 603 | 24 | 47 |
| | 9 | 743 | 550 | 318 | 752 | 283 | 674 | 689 | 863 |
| | 12 | 284 | 241 | 521 | 182 | 542 | 647 | 831 | 210 |
| | 15 | 891 | 435 | 267 | 578 | 367 | 258 | 161 | 900 |
| | 16 | 883 | 541 | 279 | 153 | 144 | 283 | 280 | 180 |
| | 46 | 0 | 0 | 0 | 0 | 0 | 0 | 0 | 0 |
| 31 | 0 | 139 | 464 | 554 | 532 | 306 | 431 | 628 | 671 |
| | 5 | 669 | 78 | 547 | 228 | 288 | 596 | 422 | 211 |
| | 16 | 685 | 658 | 260 | 12 | 57 | 272 | 627 | 868 |
| | 47 | 0 | 0 | 0 | 0 | 0 | 0 | 0 | 0 |
| 32 | 1 | 149 | 519 | 421 | 408 | 456 | 82 | 805 | 177 |
| | 4 | 663 | 149 | 228 | 793 | 288 | 419 | 45 | 834 |
| | 7 | 423 | 15 | 446 | 253 | 432 | 235 | 777 | 333 |
| | 48 | 0 | 0 | 0 | 0 | 0 | 0 | 0 | 0 |
| 33 | 1 | 533 | 72 | 175 | 449 | 493 | 631 | 628 | 507 |
| | 4 | 136 | 401 | 615 | 614 | 288 | 255 | 698 | 621 |
| | 5 | 884 | 767 | 96 | 65 | 288 | 111 | 224 | 11 |
| | 11 | 182 | 696 | 366 | 753 | 471 | 54 | 652 | 661 |
| | 49 | 0 | 0 | 0 | 0 | 0 | 0 | 0 | 0 |

Example 22

In this example, similar to the parity check matrix set P1 and the parity check matrix set P2, the parity check matrix set P2' may also be taken as the target parity check matrix set. The parity check matrix set P2' includes 8 parity check matrixes, a maximum information length supported by the parity check matrix set P2' is 3840, and the dimensions of the base graph are 42 rows and 52 columns. Before LDPC encoding is performed, the target parity check matrix set for LDPC encoding is determined (or an index of the target parity check matrix set is determined) from at least the three types of parity check matrix sets {the parity check matrix set P1, the parity check matrix set P2, the parity check matrix set P2'} according to at least one of the following setting information: a transport block size (TBS), a code rate, a high-layer signaling, a modulation order, modulation and coding scheme index, and an MCS table.

In an example, a process of determining a target parity check matrix set according to a transport block size and a code rate is as follows.

Condition 1: TBS is less than or equal to 292, or TBS is less than or equal to 3824; and the code rate is less than or equal to 0.67, or the code rate is less than or equal to 0.25.

Condition 2: TBS is greater than or equal to T0, and T0 is a positive integer greater than Kmax1.

Condition 3: the code rate is greater than or equal to R0, and R0 is a real number greater than 0 and less than 1.

For example, if the condition 1 is met, the parity check matrix set P2' is taken as the target parity check matrix set for LDPC encoding; if the condition 2 and is met, the parity check matrix set P2 is taken as the target parity check matrix set for LDPC encoding; in other cases, the parity check matrix set P1 is taken as the target parity check matrix set for LDPC encoding.

For another example, if the condition 1 is met, the parity check matrix set P2' is taken as the target parity check matrix set for LDPC encoding; if the condition 3 is met, the parity check matrix set P2 is taken as the target parity check matrix set for LDPC encoding; in other cases, the parity check matrix set P1 is taken as the target parity check matrix set for LDPC encoding.

For another example, if the condition 1 is met, the parity check matrix set P2' is taken as the target parity check matrix set for LDPC encoding; if the condition 2 and the condition 3 are met, the parity check matrix set P2 is taken as the target parity check matrix set for LDPC encoding; in other cases, the parity check matrix set P1 is taken as the target parity check matrix set for LDPC encoding.

In an example, T0 is equal to X times of Kmax2, where X is an integer greater than or equal to 1. R0 is equal to 1/2, 2/3, 3/4, 5/6, 6/7, 7/8 or 8/9, and the value of R0 may be obtained by rounding to 2 decimal places or 3 decimal places. X is equal to 1, 2, 3, 4, 5, 6, 7, 8 or 10. Kmax1 is a maximum information length of the parity check matrix set P1, and Kmax2 is a maximum information length of the parity check matrix set P2.

In an example, an example of determining a target parity check matrix set (or determining an index of the target parity check matrix set) according to a high-layer signaling, a transport block size and a code rate is as follows: if the high-layer signaling is used for enabling, the parity check matrix set P2 is taken as the target parity check matrix set for LDPC encoding; if the above condition 1 is met, the parity check matrix set P2' is taken as the target parity check matrix set for LDPC encoding, otherwise the parity check matrix set P1 is taken as the target parity check matrix set for LDPC encoding.

In an example, an example of determining a parity check matrix set (or determining an index of the target parity check matrix set) according to a modulation order, a transport block size, and a code rate is as follows: if the modulation order is greater than or equal to parameter Y, the parity check matrix set P2 is taken as the target parity check matrix set for LDPC encoding; if the above condition 1 is met, the parity check matrix set P2' is taken as the target parity check matrix set for LDPC encoding, otherwise the parity check matrix set P1 is taken as the target parity check matrix set for LDPC encoding, where the parameter Y is equal to one of 4, 6, 8, 10, 12, 14.

In an example, an example of determining a parity check matrix set (or determining an index of the target parity check matrix set) according to a modulation and coding scheme index, a transport block size, and a code rate is as follows: if the modulation and coding scheme index is greater than or equal to parameter I, the parity check matrix set P2 is taken as the target parity check matrix set for LDPC encoding; if the above condition 1 is met, the parity check matrix set P2' is taken as the target parity check matrix set for LDPC encoding, otherwise the parity check matrix set P1 is taken as the target parity check matrix set for LDPC encoding, where the parameter I is equal to 15, 18, 20, 21, 22, 23, 24, 25, 26, 27, 28 or 29; or the parameter I is equal to one of MCS indexes in the used MCS table under the maximum modulation order.

In an example, an example of determining a parity check matrix set (or determining an index of the target parity check matrix set) according to an MCS table is as follows: if the MCS table is a preset high data rate MCS table, the parity check matrix set P2 is taken as the target parity check matrix set for LDPC encoding; if the above condition 1 is met, the parity check matrix set P2' is taken as the target parity check matrix set for LDPC encoding, otherwise the parity check matrix set P1 is taken as the target parity check matrix set for LDPC encoding.

In an example, an example of determining a parity check matrix set (or determining an index of the target parity check matrix set) according to an MCS table and a modulation and coding scheme index is as follows: if the MCS table is a preset high data rate MCS table and the modulation and coding scheme index is greater than or equal to parameter I, the parity check matrix set P2 is taken as the target parity check matrix set for LDPC encoding; if the above condition 1 is met, the parity check matrix set P2' is taken as the target parity check matrix set for LDPC encoding, otherwise the parity check matrix set P1 is taken as the target parity check matrix set for LDPC encoding; where the parameter I is equal to 10, 15, 18, 20, 21, 22, 23, 24, 25, 26, 27, 28 or 29; or the parameter I is equal to one of the modulation scheme indexes in the used MCS table under the maximum modulation order.

In an example, an example of determining a parity check matrix set (or determining an index of the target parity check matrix set) according to an MCS table and a modulation order is as follows: if the MCS table is a preset high data rate MCS table and the modulation order is greater than or equal to parameter Y, the parity check matrix set P2 is taken as the target parity check matrix set for LDPC encoding; if the above condition 1 is met, the parity check matrix set P2' is taken as the target parity check matrix set for LDPC encoding, otherwise the parity check matrix set P1 is taken as the target parity check matrix set for LDPC encoding, where the parameter Y is equal to one of 6, 8, 10, 12, 14.

In an example, an example of determining a parity check matrix set (or determining an index of the target parity check matrix set) according to a TBS is as follows. It is determined according to at least one of the following conditions: condition 1: TBS is less than or equal to Ti; condition 2: TBS is greater than T1 and less than or equal to T2; condition 3: TBS is greater than T2; where T1 is an integer greater than 0, and T2 is an integer greater than Ti.

For example, if the condition 1 is met, the parity check matrix set P2' is taken as the target parity check matrix set for LDPC encoding; if the condition 2 is met, the parity check matrix set P1 is taken as the target parity check matrix set for LDPC encoding; in other cases (if the condition 3 is met), the parity check matrix set P2 is taken as the target parity check matrix set for LDPC encoding; where T1=3824, T2=8424; or, T1=1024, T2=8424; or, T1=512, T2=4096.

The MCS table includes at least the following fields: a modulation and coding scheme index, a modulation order and a target code rate. The modulation and coding scheme index is an integer greater than or equal to 0 and less than 2 n, where n is equal to 4, 5 or 6. The modulation order is an integer greater than 0. The target code rate is a real number greater than 0 and less than 1, and the target code rate may be represented in a representation format of x/1024.

In the embodiments of the present disclosure, a low density parity check decoding method is further provided. The method adopts the target parity check matrix for decoding, and thus not only the throughput of data transmission and the decoding parallelism of LDPC codes are improved, but also flexible code length and code rate are supported, thereby improving the flexibility of encoding. For technical details not described in detail in this embodiment, reference may be made to any of the above embodiments.

Figures 4, 5, 6, 7:
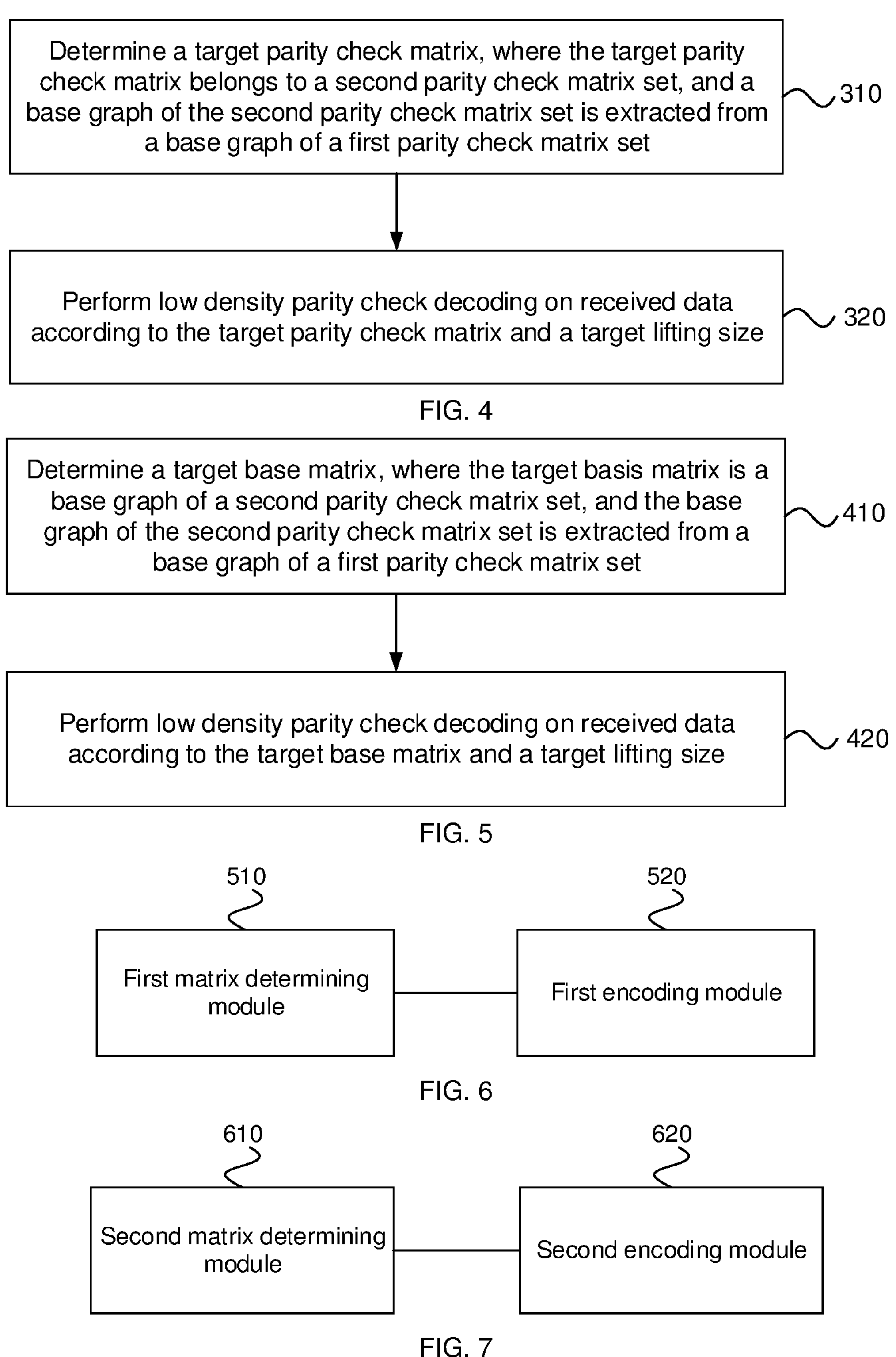
FIG. 4 is a flowchart of a low density parity check decoding method provided by an embodiment.
FIG. 5 is a flowchart of a low density parity check decoding method provided by another embodiment.
FIG. 6 is a schematic structural diagram of a low density parity check encoding apparatus provided by an embodiment.
FIG. 7 is a schematic structural diagram of a low density parity check encoding apparatus provided by another embodiment.

FIG. 4 is a flowchart of a low density parity check decoding method provided in an embodiment. As shown in FIG. 4, the method provided in this embodiment includes step 310 and step 320.

In step 310, a target parity check matrix is determined. The target parity check matrix belongs to a second parity check matrix set, and a base graph of the second parity check matrix set is extracted from a base graph of a first parity check matrix set.

In step 320, low density parity check decoding is performed on received data according to the target parity check matrix and a target lifting size.

In an embodiment, the determining the target parity check matrix includes:

determining the target parity check matrix of the second parity check matrix according to the first parity check matrix set.

In an embodiment, the determining the target parity check matrix includes:

determining a base graph of the second parity check matrix set according to a base graph of the first parity check matrix set; and determining the target parity check matrix of the second parity check matrix set according to the base graph of the second parity check matrix set.

In an embodiment, a base graph of the second parity check matrix set is extracted from a base graph of the first parity check matrix set according to at least one of a row index sequence and a column index sequence.

In an embodiment, the row index sequence meets one of the following:

elements in the row index sequence are contiguous ascending integers; elements in the row index sequence include non-contiguous ascending integers; elements in the row index sequence are non-ascending integers except that first M elements in the row index sequence are contiguous ascending integers, where M is an integer greater than 1; the row index sequence includes at least {0, 1, 2, 3}.

In an embodiment, the column index sequence meets one of the following:

first kb2 elements of the column index sequence are contiguous ascending integers, where kb2 is an integer greater than 1; first kb2 elements of the column index sequence include non-contiguous ascending integers, where kb2 is an integer greater than 1; the column index sequence includes at least {0, 1}; the column index sequence includes at least {22, 23, 24, 25}.

In an embodiment, kb2 is equal to a number of systematic columns of a base graph of the second parity check matrix set, or equal to a difference between a number of columns and a number of rows of a base graph of the second parity check matrix set, or less than or equal to a number of systematic columns of a parity check matrix in the first parity check matrix set.

In an embodiment, the first parity check matrix set includes a1 first parity check matrixes, and base graphs of the a1 first parity check matrixes are the same. The second parity check matrix set includes a2 second parity check matrixes, and base graphs of the a2 second parity check matrixes are the same. A maximum lifting size Zmax2 of the second parity check matrix set is D times of a maximum lifting size Zi supported by an i-th first parity check matrix in the first parity check matrix set, where D is a positive integer power of 2, and i is a non-negative integer less than a1.

In an embodiment, a maximum lifting size Zmax2 of the second parity check matrix set is greater than a maximum lifting size Zmax1 of the first parity check matrix set.

In an embodiment, the maximum lifting size Zmax2 of the second parity check matrix set is a by $2^b$, where a is an odd number greater than 15 and b is a positive integer.

In an embodiment, the target lifting size belongs to one of G lifting size sub-sets, where G is an integer greater than 1, and there is no intersection between any two of the G lifting size sub-sets.

In an embodiment, lifting sizes supported by the first parity check matrix set constitute a first lifting size set Zset1, and lifting sizes supported by the second parity check matrix set constitute a second lifting size set Zset2; and the first lifting size set Zset1 and the second lifting size set Zset2 meet one of the follows:

there is no intersection between the first lifting size set Zset1 and the second lifting size set Zset2; the first lifting size set Zset1 is a sub-set of the second lifting size set Zset2; a number of elements in an intersection Zset of the first lifting size set Zset1 and the second lifting size set Zset2 is less than a number of elements in the first lifting size set Zset1 and less than a number of elements in the second lifting size set Zset2.

In an embodiment, a minimum lifting size supported by the second parity check matrix set is greater than a maximum lifting size supported by the first parity check matrix set.

The lifting size supported by the second parity check matrix set includes at least one of 416, 448, 480, 512, 576, 640, 704, 768, 832, 896, 960, 1024, 1152, 1280, 1408, 1536, 1664, 1792, 1920, 2048.

In an embodiment, a maximum information length Kmax1 supported by the first parity check matrix set is smaller than a maximum information length Kmax2 supported by the second parity check matrix set.

In an embodiment, the second parity check matrix set includes at least one parity check matrix, and the parity check matrix includes k0 up-and-down adjacent pairs. The k0 up-and-down adjacent pairs includes k1 first type of up-and-down adjacent pairs and k2 second type of up-and-down adjacent pairs, where k1 is greater than 3 by k2, and k1 and k2 are integers both greater than 0. The up-and-down adjacent pair refers to any two adjacent elements located in the same column and indicating a cyclical shift of an identity matrix in the parity check matrix. A difference between the two elements of the first type of up-and-down adjacent pair mod 2 is equal to 0. A difference between the two elements of the second type of up-and-down adjacent pairs mod 2 is greater than 0.

In an embodiment, the second parity check matrix set includes at least one parity check matrix, and the parity check matrix includes k3 first type of elements indicating cyclical shifts of identity matrixes and k4 second type of elements indicating cyclical shifts of identity matrixes, where k3 is greater than 3 by k4, and k3 and k4 are integers both greater than 0. The first type of element mod 2 is equal to 0; and the second type of element mod 2 is greater than 0.

In an embodiment, the method further includes:

step 300, determining a parity check matrix set as the target parity check matrix set from at least two parity check matrix sets according to setting information. The setting information includes at least one of a transport block size, a code rate, a high-layer signaling, a modulation order, an MCS index, an MCS table index.

In an embodiment, the determining the parity check matrix set as the target parity check matrix set from the at least two parity check matrix sets according to the setting information includes:

taking the second parity check matrix set as the target parity check matrix set when at least one of the following conditions is met:

a transport block size is greater than or equal to T0, where T0 is an integer greater than or equal to a maximum information length Kmax1 supported by the first parity check matrix set; a code rate is greater than or equal to R0, where R0 is a real number greater than 0 and less than 1.

In the embodiments of the present disclosure, a low density parity check decoding method is further provided. The method adopts the target base graph for encoding, and thus not only the throughput of data transmission and the decoding parallelism of LDPC codes are improved, but also flexible code length and code rate are supported, thereby improving the flexibility of encoding. For technical details not described in detail in this embodiment, reference may be made to any of the above embodiments.

FIG. 5 is a flowchart of a low density parity check decoding method provided in another embodiment. As shown in FIG. 5, the method provided in this embodiment includes step 410 and step 420.

In step 410, a target base graph is determined. The target base graph is a base graph of a second parity check matrix set, and the base graph of the second parity check matrix set is extracted from a base graph of a first parity check matrix set.

In step 420, low density parity check decoding is performed on received data according to the target base graph and a target lifting size.

In an embodiment, the determining the target parity check matrix includes:

determining the target parity check matrix of the second parity check matrix according to the first parity check matrix set.

In an embodiment, the determining the target parity check matrix includes:

determining the base graph of the second parity check matrix set according to the base graph of the first parity check matrix set; and determining the target parity check matrix of the second parity check matrix set according to the base graph of the second parity check matrix set.

In an embodiment, the base graph of the second parity check matrix set is extracted from the base graph of the first parity check matrix set according to at least one of a row index sequence and a column index sequence.

In an embodiment, the row index sequence meets one of:

elements in the row index sequence are contiguous ascending integers; elements in the row index sequence include non-contiguous ascending integers; elements in the row index sequence are non-ascending integers except that first M elements in the row index sequence are contiguous ascending integers, where M is an integer greater than 1; and the row index sequence includes at least {0, 1, 2, 3}.

In an embodiment, the column index sequence meets one of:

first kb2 elements of the column index sequence are contiguous ascending integers, where kb2 is an integer greater than 1; first kb2 elements of the column index sequence include non-contiguous ascending integers, where kb2 is an integer greater than 1; the column index sequence includes at least {0, 1}; the column index sequence includes at least {22, 23, 24, 25}.

In an embodiment, kb2 is equal to a number of systematic columns of the base graph of the second parity check matrix set, or equal to a difference between a number of columns and a number of rows of the base graph of the second parity check matrix set, or less than or equal to a number of systematic columns of the parity check matrix in the first parity check matrix set.

In an embodiment, the first parity check matrix set includes a1 first parity check matrixes, and the base graphs of the a1 first parity check matrixes are the same; the second parity check matrix set includes a2 second parity check matrixes, and the base graphs of the a2 second parity check matrixes are the same. A maximum lifting size Zmax2 of the second parity check matrix set is D times of a maximum lifting size Zi supported by the i-th first parity check matrix in the first parity check matrix set, where D is a positive integer power of 2, and i is a non-negative integer less than a1.

In an embodiment, a maximum lifting size Zmax2 supported by the second parity check matrix set is greater than a maximum lifting size Zmax1 supported by the first parity check matrix set.

In an embodiment, a maximum lifting size Zmax2 of the second parity check matrix set is a by $2^b$, where a is an odd number greater than 15 and b is a positive integer.

In an embodiment, the target lifting size belongs to one of G lifting size sub-sets, where G is an integer greater than 1, and there is no intersection between any two of the G lifting size sub-sets.

In an embodiment, lifting sizes supported by the first parity check matrix set constitute a first lifting size set Zset1, and lifting sizes supported by the second parity check matrix set constitute a second lifting size set Zset2. The first lifting size set Zset1 and the second lifting size set Zset2 meet one of the follows:

there is no intersection between the first lifting size set Zset1 and the second lifting size set Zset2; the first lifting size set Zset1 is a sub-set of the second lifting size set Zset2; a number of elements in an intersection Zset of the first lifting size set Zset1 and the second lifting size set Zset2 is less than a number of elements in the first lifting size set Zset1 and less than a number of elements in the second lifting size set Zset2.

In an embodiment, a minimum lifting size supported by the second parity check matrix set is greater than a maximum lifting size supported by the first parity check matrix set. Lifting sizes supported by the second parity check matrix set include at least one of 416, 448, 480, 512, 576, 640, 704, 768, 832, 896, 960, 1024, 1152, 1280, 1408, 1536, 1664, 1792, 1920, 2048.

In an embodiment, a maximum information length Kmax1 supported by the first parity check matrix set is smaller than a maximum information length Kmax2 supported by the second parity check matrix set.

In an embodiment, the second parity check matrix set includes at least one parity check matrix, and the parity check matrix includes k0 up-and-down adjacent pairs. The k0 up-and-down adjacent pairs include k1 first type of up-and-down adjacent pairs and k2 second type of up-and-down adjacent pairs, where k1 is greater than 3 by k2, and k1 and k2 are integers both greater than 0. The up-and-down adjacent pair refers to any two adjacent elements located in the same column and indicating a cyclical shift of an identity matrix in the parity check matrix. A difference between the two elements of the first type of up-and-down adjacent pair mod 2 is equal to 0, and a difference between the two elements of the first type of up-and-down adjacent pair mod 2 is greater than 0.

In an embodiment, the second parity check matrix set includes at least one parity check matrix, and the parity check matrix includes k3 first type of elements indicating cyclical shifts of identity matrixes and k4 second type of elements indicating cyclical shifts of identity matrixes, where k3 is greater than 3 by k4, and k3 and k4 are integers both greater than 0. The first type of element mod 2 is equal to 0, and the second type of element mod 2 is greater than 0.

In an embodiment, the method further includes:

step 400, determining a parity check matrix set as the target parity check matrix from at least two parity check matrix sets according to setting information. The setting information includes at least one of a transport block size, a code rate, a high-layer signaling, a modulation order, a modulation and coding scheme index, a modulation and coding scheme MCS table index.

In an embodiment, the determining the parity check matrix set as the target parity check matrix set from the at least two parity check matrix sets according to the setting information includes:

taking the second parity check matrix set as the target parity check matrix set when at least one of the following conditions is met:

a transport block size is greater than or equal to T0, where T0 is an integer greater than or equal to a maximum information length Kmax1 supported by the first parity check matrix set P1; a code rate is greater than or equal to R0, where R0 is a real number greater than 0 and less than 1.

The embodiments of the present disclosure further provide a low density parity check encoding apparatus. FIG. 6 is a schematic structural diagram of a low density parity check encoding apparatus provided in an embodiment. As shown in FIG. 6, the low density parity check encoding apparatus includes a first matrix determining module 510 and a first encoding module 520.

The first matrix determining module 510 is configured to determine a target parity check matrix. The target parity check matrix belongs to a second parity check matrix set, and a base graph of the second parity check matrix set is extracted from a base graph of a first parity check matrix set. The first encoding module 520 is configured to perform low density parity check encoding on data to be transmitted according to the target parity check matrix and a target lifting size.

The low density parity check encoding apparatus of this embodiment adopts the target parity check matrix for encoding, and thus not only the throughput of data transmission and the decoding parallelism of LDPC codes are improved, but also flexible code length and code rate are supported, thereby improving the flexibility of encoding.

In an embodiment, the first matrix determining module 510 is configured to:

determine the target parity check matrix of the second parity check matrix according to the first parity check matrix set.

In an embodiment, the first matrix determining module 510 is configured to:

determine the base graph of the second parity check matrix set according to the matrix of the first parity check matrix set; and determine the target parity check matrix of the second parity check matrix set according to the base graph of the second parity check matrix set.

In an embodiment, the base graph of the second parity check matrix set is extracted from the base graph of the first parity check matrix set according to at least one of a row index sequence and a column index sequence.

In an embodiment, the row index sequence meets one of:

elements in the row index sequence are contiguous ascending integers; elements in the row index sequence include non-contiguous ascending integers; elements in the row index sequence are non-ascending integers except that first M elements in the row index sequence are contiguous ascending integers, where M is greater than 1; the row index sequence includes at least {0, 1, 2, 3}.

In an embodiment, the column index sequence meets one of:

first kb2 elements of the column index sequence are contiguous ascending integers, where kb2 is greater than 1; first kb2 elements of the column index sequence include non-contiguous ascending integers, where kb2 is greater than 1; the column index sequence includes at least {0, 1}; the column index sequence includes at least {22, 23, 24, 25}.

In an embodiment, kb2 is equal to a number of systematic columns of the base graph of the second parity check matrix set, or equal to a difference between a number of columns and a number of rows of the base graph of the second parity check matrix set, or less than or equal to a number of systematic columns of the parity check matrix in the first parity check matrix set.

In an embodiment, the first parity check matrix set includes a1 first parity check matrixes, and the base graphs of the a1 first parity check matrixes are the same; the second parity check matrix set includes a2 second parity check matrixes, and the base graphs of the a2 second parity check matrixes are the same. A maximum lifting size Zmax2 of the second parity check matrix set is D times of a maximum lifting size Zi supported by the i-th first parity check matrix in the first parity check matrix set, where D is a positive integer power of 2, and i is a non-negative integer less than a1.

In an embodiment, a maximum lifting size Zmax2 supported by the second parity check matrix set is greater than a maximum lifting size Zmax1 supported by the first parity check matrix set.

In an embodiment, the maximum lifting size Zmax2 of the second parity check matrix set is a by 2b, where a is an odd number greater than 15 and b is a positive integer.

In an embodiment, the target lifting size belongs to one of G lifting size sub-sets, where G is greater than 1, and there is no intersection between any two of the G lifting size sub-sets.

In an embodiment, lifting sizes supported by the first parity check matrix set constitute a first lifting size set Zset1, and lifting sizes supported by the second parity check matrix set constitute a second lifting size set Zset2. The first lifting size set Zset1 and the second lifting size set Zset2 meet one of:

there is no intersection between the first lifting size set Zset1 and the second lifting size set Zset2; the first lifting size set Zset1 is a sub-set of the second lifting size set Zset2; a number of elements in an intersection Zset of the first lifting size set Zset1 and the second lifting size set Zset2 is less than a number of elements in the first lifting size set Zset1 and less than a number of elements in the second lifting size set Zset2.

In an embodiment, a minimum lifting size supported by the second parity check matrix set is greater than a maximum lifting size supported by the first parity check matrix set. Lifting sizes supported by the second parity check matrix set include at least one of 416, 448, 480, 512, 576, 640, 704, 768, 832, 896, 960, 1024, 1152, 1280, 1408, 1536, 1664, 1792, 1920, 2048.

In an embodiment, a maximum information length Kmax1 supported by the first parity check matrix set is smaller than a maximum information length Kmax2 supported by the second parity check matrix set.

In an embodiment, the second parity check matrix set includes at least one parity check matrix, and the parity check matrix includes k0 up-and-down adjacent pairs. The k0 up-and-down adjacent pairs include k1 first type of up-and-down adjacent pairs and k2 second type of up-and-down adjacent pairs, where k1 is greater than 3 by k2, and k1 and k2 are integers both greater than 0. An up-and-down adjacent pair refers to any two adjacent elements located in the same column and indicating a cyclical shift of an identity matrix in the parity check matrix. A difference between the two elements of the first type of up-and-down adjacent pair mod 2 is equal to 0. A difference between the two elements of the second type of up-and-down adjacent pairs mod 2 is greater than 0.

In an embodiment, the second parity check matrix set includes at least one parity check matrix, and the parity check matrix includes k3 first type of elements indicating cyclical shifts of identity matrixes and k4 second type of elements indicating cyclical shifts of identity matrixes, where k3 is greater than 3 by k4, and k3 and k4 are integers both greater than 0. The first type of element mod 2 is equal to 0. The second type of element mod 2 is greater than 0.

In an embodiment, the apparatus further includes:

a first set determining module configured to determine a parity check matrix set as the target parity check matrix set from at least two parity check matrix sets according to setting information. The setting information includes at least one of a transport block size, a code rate, a high-level signaling, a modulation order, an MCS index, an MCS table index.

In an embodiment, the first set determining module is configured to:

take the second parity check matrix set as the target parity check matrix set upon at least one of the following conditions being met:

a transport block size is greater than or equal to T0, where T0 is an integer greater than or equal to a maximum information length Kmax1 supported by the first parity check matrix set; a code rate is greater than or equal to R0, where R0 is a real number greater than 0 and less than 1.

The low density parity check encoding apparatus provided in this embodiment and the low density parity check encoding method provided in the above-mentioned embodiments belong to the same concept. For the technical details not described in detail in this embodiment, reference may be made to any of the above-mentioned embodiments. This embodiment has the same effect as that for performing the low parity check encoding method.

The embodiments of the present disclosure further provide a low density parity check encoding apparatus. FIG. 7 is a schematic structural diagram of a low density parity check encoding apparatus provided in another embodiment. As shown in FIG. 7, the low density parity check encoding apparatus includes a second matrix determining module 610 and a second encoding module 620.

The second matrix determining module 610 is configured to determine a target base graph. The target base graph is a base graph of a second parity check matrix set, and a base graph of the second parity check matrix set is extracted from a base graph of a first parity check matrix set. The second encoding module 620 is configured to perform low density parity check encoding on data to be transmitted according to the target base graph and a target lifting size.

The low density parity check encoding apparatus in the embodiment adopts the target base graph for encoding, and thus not only the throughput of data transmission and the decoding parallelism of LDPC codes are improved, but also flexible code length and code rate are supported, thereby improving the flexibility of encoding. For the technical details not described in detail in the embodiment, reference may be made to any of the above embodiments.

In an embodiment, the second encoding module 620 is configured to determine a check matrix H according to the target base graph and the target lifting size; and perform low density parity check encoding on the data to be transmitted according to the check matrix H.

In an embodiment, the second encoding module 620 is configured to determine the target parity check matrix according to the target base graph; and perform low density parity check encoding on the data to be transmitted according to the target parity check matrix and the target lifting size.

In an embodiment, the apparatus further includes:

a second set determining module configured to determine a parity check matrix set as the target parity check matrix set from at least two parity check matrix sets according to setting information. The setting information includes at least one of a transport block size, a code rate, a high-layer signaling, a modulation order, an MCS index, an MCS table index.

The low density parity check encoding apparatus provided in this embodiment and the low density parity check encoding method provided in the above-mentioned embodiments refer to the same concept. For the technical details not described in detail in this embodiment, reference may be made to any of the above-mentioned embodiments. This embodiment has the same effect as that for performing the low parity check encoding method.

The embodiments of the present disclosure further provide a low density parity check decoding apparatus. FIG. 8 is a schematic structural diagram of a low density parity check decoding apparatus provided in an embodiment. As shown in FIG. 8, the low density parity check decoding apparatus includes a third matrix determining module 710 and a first decoding module 720.

The third matrix determining module 710 is configured to determine a target parity check matrix. The target parity check matrix belongs to a second parity check matrix set, and a base graph of the second parity check matrix set is extracted from a base graph of a first parity check matrix set. The first decoding module 720 is configured to perform low density parity check decoding on received data according to the target parity check matrix and a target lifting size.

The low density parity check decoding apparatus of this embodiment adopts the target parity check matrix for decoding, and thus not only the throughput of data transmission and the decoding parallelism of LDPC codes are improved, but also flexible code length and code rate are supported, thereby improving the flexibility of decoding.

In an embodiment, the apparatus further includes:

a third set determining module configured to determine a parity check matrix set as the target parity check matrix set from at least two parity check matrix sets according to setting information. The setting information includes at least one of a transport block size, a code rate, a high-layer signaling, a modulation order, a modulation and coding scheme index, an MCS table index.

In an embodiment, the third set determining module is configured to:

take the second parity check matrix set as the target parity check matrix set upon at least one of the following conditions being met:

a transport block size is greater than or equal to T0, where T0 is an integer greater than or equal to a maximum information length Kmax1 supported by the first parity check matrix set; a code rate is greater than or equal to R0, where R0 is a real number greater than 0 and less than 1.

The low density parity check decoding apparatus provided in this embodiment and the low density parity check decoding method provided in the above-mentioned embodiments belong to the same concept. For the technical details not described in detail in this embodiment, reference may be made to any of the above-mentioned embodiments. This embodiment has the same effect as that for performing the low parity check decoding method.

The embodiments of the present disclosure further provide a low density parity check decoding apparatus. FIG. 9 is a schematic structural diagram of a low density parity check decoding apparatus provided in another embodiment. As shown in FIG. 9, the low density parity check decoding apparatus includes a fourth matrix determining module 810 and a second decoding module 820.

The fourth matrix determining module 810 is configured to determine a target base graph. The target base graph is a base graph of a second parity check matrix set, and a base graph of the second parity check matrix set is extracted from a base graph of a first parity check matrix set. The second decoding module 820 is configured to perform low density parity check decoding on received data according to the target base graph and a target lifting size.

The low density parity check decoding apparatus of this embodiment adopts the target base graph for encoding, and thus not only the throughput of data transmission and the decoding parallelism of LDPC codes are improved, but also flexible code length and code rate are supported, thereby improving the flexibility of encoding. For the technical details not described in detail in this embodiment, reference may be made to any of the above embodiments.

In an embodiment, the apparatus further includes:

a fourth set determining module configured to determine a parity check matrix set as the target parity check matrix set from at least two parity check matrix sets set according to setting information. The setting information includes at least one of a transport block size, a code rate, a high-layer signaling, a modulation order, an MCS index, an MCS table index.

The low density parity check decoding apparatus provided in this embodiment and the low density parity check decoding method provided in the above-mentioned embodiments belong to the same concept. For the technical details not described in detail in this embodiment, reference may be made to any of the above-mentioned embodiments. This embodiment has the same effect as that for performing the low parity check decoding method.

Figure 10:
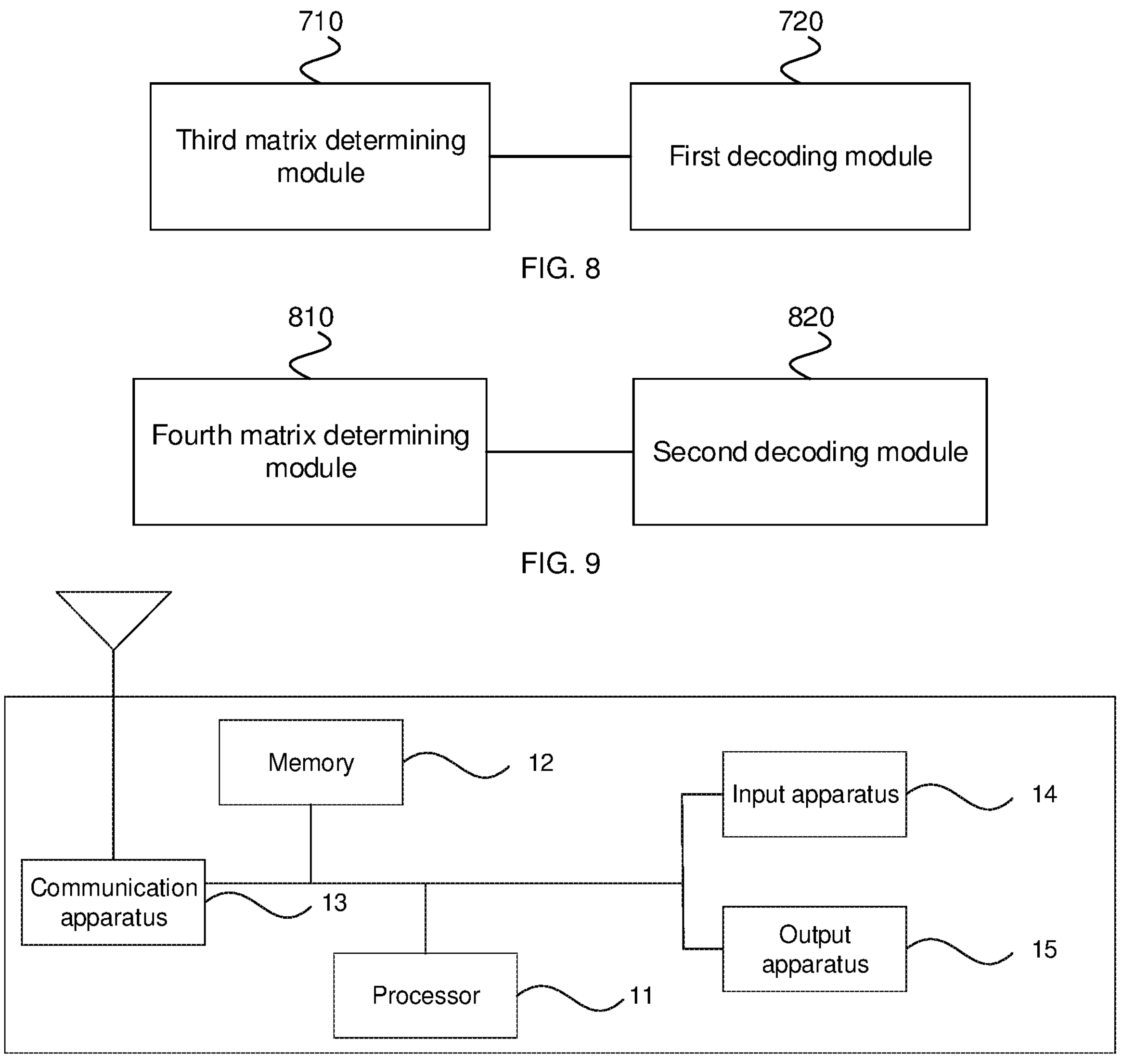
FIG. 10 is a schematic diagram of a hardware structure of an encoding device provided by an embodiment.

The embodiments of the present disclosure further provide an encoding device. FIG. 10 is a schematic diagram of a hardware structure of an encoding device provided in an embodiment. As shown in FIG. 10, the encoding device provided by the present disclosure includes a memory 12, a processor 11, and a computer program stored in the memory 12 and runnable on the processor 11. The processor 11 implements the above-mentioned low density parity check encoding method upon executing the program.

The encoding device may include the memory 12 and there may be one or more processors 11 in the encoding device. FIG. 10 shows one processor 11 as an example. The memory 12 is used to store one or more programs. When the one or more programs are executed by the one or more processors 11, the one or more processors 11 implement the low density parity check encoding method provided in the embodiments of the present disclosure.

The encoding device further includes a communication apparatus 13, an input apparatus 14 and an output apparatus 15.

The processor 11, the memory 12, the communication apparatus 13, the input apparatus 14 and the output apparatus 15 in the encoding device may be connected via a bus or in other ways. FIG. 10 shows a connection via a bus as an example.

The input apparatus 14 may be used to receive input numeric or character information, and generate a key signal input related to a user setting and a functional control of the encoding device. The output apparatus 15 may include a display device such as a display screen.

The communication apparatus 13 may include a receiver and a transmitter. The communication apparatus 13 is configured to receive and transmit information according to the control of the processor 11.

The memory 12, as a computer readable storage medium, may be configured to store software programs, computer executable programs and modules, such as the program instructions/modules corresponding to the low density parity check encoding method described in the embodiments of the present disclosure (for example, the first matrix determining module 110 and the first encoding module 120 in the low density parity check encoding device). The memory 12 may include a program store and a data store. The program store may store an operating system, an application program required by at least one function, the data store may store a data created according to the usage of the encoding device, and the like. In addition, the memory 12 may include a high speed random access memory, and may further include a nonvolatile memory, for example, at least a disk memory means, a flash means, or other nonvolatile solid memory means. In some examples, the memory 12 may include memory that is remotely disposed relative to the processor 11, and the remote memory may be connected to the encoding device via a network. Examples of the above-mentioned network include but are not limited to an Internet, an intranet, a local area network, a mobile communication network and a combination thereof.

Figure 11:
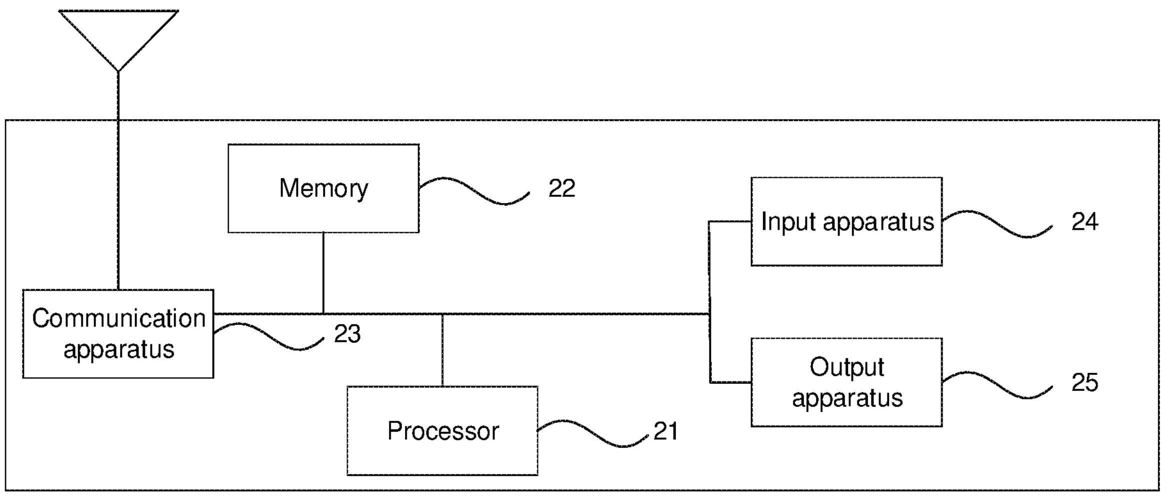
FIG. 11 is a schematic diagram of a hardware structure of a decoding device provided by an embodiment.

The embodiments of the present disclosure further provide a decoding device. FIG. 11 is a schematic diagram of a hardware structure of a decoding device provided in an embodiment. As shown in FIG. 11, the decoding device provided by the present disclosure includes a memory 22, a processor 21, and a computer program stored in the memory 22 and runnable on the processor 21. The processor 21 implements the above-mentioned low density parity check decoding method upon executing the program.

The decoding device may include a memory 22 and there may be one or more processors 21 in the decoding device. FIG. 11 shows one processor 21 as an example. The memory 22 is used to store one or more programs. When the one or more programs are executed by the one or more processors 21, the one or more processors 21 implement the low density parity check decoding method provided in the embodiment of the present disclosure.

The decoding device further includes a communication apparatus 23, an input apparatus 24 and an output apparatus 25.

The processor 21, the memory 22, the communication apparatus 23, the input apparatus 24 and the output apparatus 25 in the decoding device may be connected via a bus or in other ways. FIG. 11 shows a connection via a bus as an example.

The input apparatus 24 may be used to receive input numeric or character information, and generate key signal input related to a user setting and a functional control of the decoding device. The output apparatus 25 may include a display device such as a display screen.

The communication apparatus 23 may include a receiver and a transmitter. The communication apparatus 23 is configured to receive and transmit information according to the control of the processor 21.

The memory 22, as a computer readable storage medium, may be configured to store software programs, computer executable programs and modules, such as the program instructions/modules corresponding to the low density parity check decoding method described in the embodiment of the present disclosure (for example, the third matrix determining module 710 and the first decoding module 720 in the low density parity check decoding device). The memory 22 may include a program store and a data store, where the program store may store an operating system, an application program required by at least one function; the data store may store a data created according to the usage of the decoding device, and the like. In addition, the memory 22 may include a high speed random access memory, and may further include a nonvolatile memory such as at least one disk memory means, a flash means, or other nonvolatile solid memory means. In some examples, the memory 22 may include memory that is remotely disposed relative to the processor 21, and the remote memory may be connected to the decoding device via a network. Examples of the above-mentioned network include but are not limited to an Internet, an intranet, a local area network, a mobile communication network and a combination thereof.

The embodiments of the present disclosure further provide a storage medium, and the storage medium has stored a computer program thereon. The computer program, when executed by a processor, implements the low density parity check encoding method or the low density parity check decoding method provided in any one of embodiments of the present disclosure.

The encoding method includes:

determining a target parity check matrix, where the target parity check matrix belongs to a second parity check matrix set, and a base graph of the second parity check matrix set is extracted from a base graph of a first parity check matrix set; and performing low density parity check encoding on data to be transmitted according to the target parity check matrix and a target lifting size.

Alternatively, the encoding method includes:

determining a target base graph, where the target base graph is a base graph of a second parity check matrix set, and a base graph of the second parity check matrix set is extracted from a base graph of a first parity check matrix set; and performing low density parity check encoding on data to be transmitted according to the target base graph and a target lifting size.

Alternatively, the decoding method includes:

determining a target parity check matrix, where the target parity check matrix belongs to a second parity check matrix set, and a base graph of the second parity check matrix set is extracted from a base graph of a first parity check matrix set; and performing low density parity check decoding on received data according to the target parity check matrix and a target lifting size.

Alternatively, the decoding method includes:

determining a target base graph, where the target base graph is a base graph of a second parity check matrix set, and a base graph of the second parity check matrix set is extracted from a base graph of a first parity check matrix set; and performing low density parity check decoding on received data according to the target base graph and a target lifting size.

The computer storage medium in the embodiments of the present disclosure may adopt any combination of one or more computer readable media. The computer readable medium may be a computer readable signal medium or a computer readable storage medium. A computer readable storage medium may be, for example, but not limited to: an electrical, magnetic, optical, electromagnetic, infrared, or semiconductor system, apparatus, or means, or any combination thereof. Examples (non-exhaustive list) of the computer readable storage medium include: electrical connections with one or more conductors, portable computer disks, hard disks, random access memories (RAMs), read only memories (ROMs), erasable programmable read only memories (EPROMs), flash memories, optical fiber, portable CD-ROM, optical storage means, magnetic storage means or any suitable combination of the above. A computer readable storage medium may be any tangible medium that contains or stores a program that may be used by or in connection with an instruction execution system, apparatus, or means.

A computer readable signal medium may include a data signal propagating in baseband or as part of a carrier wave, where the data signal carries computer readable program code. The data signal may be transmitted in many forms, including, but not limited to: a radio signal, an optical signal, or any suitable combination thereof. A computer readable signal medium may also be any computer readable medium other than a computer readable storage medium, which can send, propagate, or transmit a program that may be used by or in connection with an instruction execution system, apparatus, or means.

A program code in the computer readable medium may be transmitted with any suitable medium, including but not limited to: radio, electric wire, optical cable, radio frequency (RF) or the like, or any suitable combination thereof.

A computer program codes for performing operations of the present disclosure may be written in one or more programming languages or combinations thereof. The programming languages include object-oriented programming languages such as Java, Smalltalk, C++, and conventional procedural programming languages, such as the "C" language or similar programming language. The program code may be executed entirely on the user's computer, partly on the user's computer, as a stand-alone software package, partly on the user's computer and partly on a remote computer or entirely on a remote computer or server. In a case involving a remote computer, the remote computer may be connected to the user's computer through any kind of network, including a local area network (LAN) or a wide area network (WAN), or may be connected to an external computer (for example, an Internet service provider is adopted to connect via the Internet).

The above descriptions are merely exemplary embodiments of the present disclosure.

Those skilled in the art will understand that the term "user terminal" covers any suitable type of wireless user devices, such as a mobile phone, a portable data processing apparatus, a portable web browser or a vehicle-mounted mobile station.

In general, various embodiments of the present disclosure can be implemented in hardware or special purpose circuits, software, logic or any combination thereof. For example, some aspects may be implemented in hardware, while other aspects may be implemented in firmware or software executable by a controller, a microprocessor or other computing apparatuses, although the present disclosure is not limited thereto.

The embodiments of the present disclosure may be implemented by executing computer program instructions through a data processor of a mobile apparatus, for example in a processor entity, or by hardware, or by a combination of software and hardware. Computer program instructions may be assembly instructions, instruction set architecture (ISA) instructions, machine instructions, machine-dependent instructions, microcode, firmware instructions, state setting data, or source codes or object codes written in any combination of one or more programming languages.

Any block diagram of a logic flow in the drawings of the present disclosure may represent program steps, or may represent interconnected logic circuits, modules and functions, or may represent a combination of program steps and logic circuits, modules and functions. The computer program may be stored in a memory. The memory may be of any type suitable for the local technical environment and may be implemented using any suitable data storage technology, such as but not limited to read-only memory (ROM), random access memory (RAM), optical storage apparatuses and systems (digital video disc (DVD) or compact disk (CD)), and the like. Computer readable medium may include non-transitory storage medium. Data processors can be of any type suitable for the local technical environment, such as but not limited to general purpose computers, special purpose computers, microprocessors, digital signal processors (DSP), application specific integrated circuits (ASIC), programmable logic means (Field-Programmable Gate Array, FPGA), and processors based on multi-core processor architectures.

What is claimed is:

1. A low density parity check encoding method, applied to an LDPC encoder, comprising:

determining a target parity check matrix, wherein the target parity check matrix belongs to a second parity check matrix set, and a base graph of the second parity check matrix set is extracted from a base graph of a first parity check matrix set according to at least one of a row index sequence and a column index sequence, wherein the row index sequence meets one of: elements in the row index sequence including non-contiguous ascending integers; or elements in the row index sequence being non-ascending integers except that first M elements in the row index sequence are contiguous ascending integers, wherein M is an integer greater than 1; and performing low density parity check encoding on data to be transmitted according to the target parity check matrix and a target lifting size.

2. The method according to claim 1, wherein determining the target parity check matrix comprises:

determining the target parity check matrix of the second parity check matrix set according to at least one of the row index sequence and the column index sequence from the first parity check matrix set; or determining the base graph of the second parity check matrix set according to at least one of the row index sequence and the column index sequence from the base graph of the first parity check matrix set; and determining the target parity check matrix of the second parity check matrix set according to the base graph of the second parity check matrix set.

3. The method according to claim 1, wherein the column index sequence meets one of:

first kb2 elements of the column index sequence being contiguous ascending integers, wherein kb2 is an integer greater than 1;

first kb2 elements of the column index sequence comprising non-contiguous ascending integers, wherein kb2 is an integer greater than 1;

the column index sequence comprising at least {0, 1};

the column index sequence comprising at least {22, 23, 24, 25}.

4. The method according to claim 3, wherein kb2 is equal to a number of systematic columns of the base graph of the second parity check matrix set, or equal to a difference between a number of columns and a number of rows of the base graph of the second parity check matrix set, or less than or equal to a number of systematic columns of a parity check matrix in the first parity check matrix set.

5. The method according to claim 1, wherein the first parity check matrix set comprises a1 first parity check matrixes, and base graphs of the a1 first parity check matrixes are the same, where a1 is a positive integer;

the second parity check matrix set comprises a2 second parity check matrixes, and base graphs of the a2 second parity check matrixes are the same, where a2 is a positive integer;

a maximum lifting size Zmax2 of the second parity check matrix set is D times of a maximum lifting size Zi supported by an i-th first parity check matrix in the first parity check matrix set, wherein D is a positive integer power of 2, and i is a non-negative integer less than a1.

6. The method according to claim 1, wherein a maximum lifting size Zmax2 supported by the second parity check matrix set is greater than a maximum lifting size Zmax1 of the first parity check matrix set; or the maximum lifting size Zmax2 of the second parity check matrix set is a multiplied by $2^b$, wherein a is an odd number greater than 15 and b is a positive integer.

7. The method according to claim 1, wherein the target lifting size belongs to one of G lifting size sub-sets, wherein G is an integer greater than 1, and there is no intersection between every two of the G lifting size sub-sets.

8. The method according to claim 1, wherein lifting sizes supported by the first parity check matrix set constitute a first lifting size set Zset1, and lifting sizes supported by the second parity check matrix set constitute a second lifting size set Zset2;

the first lifting size set Zset1 and the second lifting size set Zset2 meet one of:

there being no intersection between the first lifting size set Zset1 and the second lifting size set Zset2;

the first lifting size set Zset1 being a sub-set of the second lifting size set Zset2.

9. The method according to claim 1, wherein a minimum lifting size supported by the second parity check matrix set is greater than a maximum lifting size supported by the first parity check matrix set; lifting sizes supported by the second parity check matrix set comprise at least one of 416, 448, 480, 512, 576, 640, 704, 768, 832, 896, 960, 1024, 1152, 1280, 1408, 1536, 1664, 1792, 1920, 2048.

10. The method according to claim 1, wherein the second parity check matrix set comprises at least one parity check matrix, the parity check matrix comprises k3 first type of elements indicating cyclical shifts of identity matrixes and k4 second type of elements indicating a cyclical shift of identity matrix, and k3 is greater than 3 multiplied by k4, and k3 and k4 are both integers greater than 0;

wherein the first type of element mod 2 is equal to 0;

the second type of element mod 2 is greater than 0.

11. The method according to claim 1, further comprising:

determining a parity check matrix set as the target parity check matrix set from at least two parity check matrix sets according to setting information;

wherein the setting information comprises at least one of a transport block size, a code rate, a high-layer signaling, a modulation order, a modulation and coding scheme (MCS) index, an MCS table index;

wherein determining the parity check matrix set as the target parity check matrix set from the at least two parity check matrix sets according to the setting information comprises:

taking the second parity check matrix set as the target parity check matrix set in a case where at least one of following conditions is satisfied:

a transport block size is greater than or equal to T0, wherein T0 is an integer greater than or equal to a maximum information length Kmax1 supported by the first parity check matrix set;

a code rate is greater than or equal to R0, wherein R0 is a real number greater than 0 and less than 1;

wherein the second parity check matrix set and the first parity check matrix set belong to the at least two parity check matrix sets, and the target parity check matrix is obtained from the target parity check matrix set.

12. The method according to claim 1, wherein a number of systematic columns of the base graph of the second parity check matrix set is less than a number of systematic columns of the base graph of the first parity check matrix set.

13. The method according to claim 1, wherein lifting sizes supported by the first parity check matrix set constitute a first lifting size set Zset1, and lifting sizes supported by the second parity check matrix set constitute a second lifting size set Zset2;

the first lifting size set Zset1 and the second lifting size set Zset2 meet:

a number of elements in an intersection Zset of the first lifting size set Zset1 and the second lifting size set Zset2 being less than a number of elements in the first lifting size set Zset1 and less than a number of elements in the second lifting size set Zset2.

14. The method according to claim 1, wherein a maximum information length Kmax1 supported by the first parity check matrix set is less than a maximum information length Kmax2 supported by the second parity check matrix set.

15. A low density parity check encoding method, applied to an LDPC decoder, comprising:

determining a target base graph, wherein the target base graph is a base graph of a second parity check matrix set, and the base graph of the second parity check matrix set is extracted from a base graph of a first parity check matrix set according to at least one of a row index sequence and a column index sequence, wherein the row index sequence meets one of: elements in the row index sequence including non-contiguous ascending integers; or elements in the row index sequence being non-ascending integers except that first M elements in the row index sequence are contiguous ascending integers, wherein M is an integer greater than 1; and performing low density parity check encoding on data to be transmitted according to the target base graph and a target lifting size.

16. The method according to claim 15, wherein the performing low density parity check encoding on the data to be transmitted according to the target base graph and the target lifting size comprises:

determining a check matrix H according to the target base graph and the target lifting size; and performing low density parity check encoding on the data to be transmitted according to the check matrix H; or determining a target parity check matrix according to the target base graph; and performing low density parity check encoding on the data to be transmitted according to the target parity check matrix and the target lifting size.

17. The method according to claim 15, wherein a number of systematic columns of the base graph of the second parity check matrix set is less than a number of systematic columns of the base graph of the first parity check matrix set.

18. A low density parity check decoding method, applied to an LDPC decoder, comprising:

determining a target parity check matrix, wherein the target parity check matrix belongs to a second parity check matrix set, and a base graph of the second parity check matrix set is extracted from a base graph of a first parity check matrix set according to at least one of a row index sequence and a column index sequence, wherein the row index sequence meets one of: elements in the row index sequence including non-contiguous ascending integers; or elements in the row index sequence being non-ascending integers except that first M elements in the row index sequence are contiguous ascending integers, wherein M is an integer greater than 1; and performing low density parity check decoding on received data according to the target parity check matrix and a target lifting size.

19. The method according to claim 18, wherein a number of systematic columns of the base graph of the second parity check matrix set is less than a number of systematic columns of the base graph of the first parity check matrix set.

20. A non-transitory computer readable storage medium having stored a computer program thereon, wherein the program, when executed by a processor, implements the low density parity check encoding method according to claim 1.

* * * * *